(12) United States Patent
Masuoka et al.

(10) Patent No.: US 8,610,202 B2
(45) Date of Patent: Dec. 17, 2013

(54) SEMICONDUCTOR DEVICE HAVING A SURROUNDING GATE

(75) Inventors: Fujio Masuoka, Tokyo (JP); Hiroki Nakamura, Tokyo (JP)

(73) Assignee: Unisantis Electronics Singapore Pte Ltd., Peninsula Plaza (SG)

( * ) Notice: Subject to any disclaimer, the term of this patent is extended or adjusted under 35 U.S.C. 154(b) by 112 days.

(21) Appl. No.: 12/894,923

(22) Filed: Sep. 30, 2010

(65) Prior Publication Data

US 2011/0079841 A1 Apr. 7, 2011

Related U.S. Application Data

(60) Provisional application No. 61/278,204, filed on Oct. 2, 2009.

(30) Foreign Application Priority Data

Oct. 1, 2009 (JP) .................................. 2009-229591

(51) Int. Cl.
| | | |
|---|---|---|
| H01L 29/76 | (2006.01) | |
| H01L 29/94 | (2006.01) | |
| H01L 31/062 | (2006.01) | |
| H01L 31/113 | (2006.01) | |

(52) U.S. Cl.
USPC ........... 257/329; 257/328; 257/369; 257/401; 257/E27.067

(58) Field of Classification Search
USPC ........... 257/329, 328, 338, 369, 401, E27.067
See application file for complete search history.

(56) References Cited

U.S. PATENT DOCUMENTS

| 5,017,977 | A | 5/1991 | Richardson |
| 5,258,635 | A | 11/1993 | Nitayama et al. |
| 5,308,782 | A | 5/1994 | Mazure et al. |
| 5,312,767 | A | 5/1994 | Shimizu et al. |
| 5,382,816 | A | 1/1995 | Mitsui |

(Continued)

FOREIGN PATENT DOCUMENTS

| CN | 1507035 | 6/2004 |
| CN | 1610126 A | 4/2005 |

(Continued)

OTHER PUBLICATIONS

Watanabe, Shigeyoshi et al., "A Novel Circuit Technology with Surrounding Gate Transistors (SGT's) for Ultra High Density DRAM's," IEEE Journal of Solid-State Circuits, vol. 30, No. 9, Sep. 1995, pp. 960-971.

(Continued)

*Primary Examiner* — Shouxiang Hu
(74) *Attorney, Agent, or Firm* — Brinks Gilson & Lione

(57) ABSTRACT

There is provided a semiconductor device which has a CMOS inverter circuit and which can accomplish high-integration by configuring an inverter circuit with a columnar structural body. A semiconductor device includes a columnar structural body which is arranged on a substrate and which comprises a p-type silicon, an n-type silicon, and an oxide arranged between the p-type silicon and the n-type silicon and running in the vertical direction to the substrate, n-type high-concentration silicon layers arranged on and below the p-type silicon, p-type high-concentration silicon layers arrange on and below the n-type silicon, an insulator which surrounds the p-type silicon, the n-type silicon, and the oxide, and which serves as a gate insulator, and a conductive body which surrounds the insulator and which serves as a gate electrode.

9 Claims, 64 Drawing Sheets

(56) References Cited

U.S. PATENT DOCUMENTS

| | | |
|---|---|---|
| 5,416,350 A | 5/1995 | Watanabe |
| 5,480,838 A | 1/1996 | Mitsui |
| 5,627,390 A | 5/1997 | Maeda et al. |
| 5,656,842 A | 8/1997 | Iwamatsu et al. |
| 5,703,386 A | 12/1997 | Yasuda et al. |
| 5,707,885 A | 1/1998 | Lim |
| 5,710,447 A | 1/1998 | Tohyama |
| 5,767,549 A | 6/1998 | Chen et al. |
| 5,780,888 A | 7/1998 | Maeda et al. |
| 5,811,336 A | 9/1998 | Kasai |
| 5,872,037 A | 2/1999 | Iwamatsu et al. |
| 5,905,283 A | 5/1999 | Kasai |
| 5,994,735 A | 11/1999 | Maeda et al. |
| 6,121,086 A | 9/2000 | Kuroda et al. |
| 6,127,209 A | 10/2000 | Maeda et al. |
| 6,175,138 B1 | 1/2001 | Noda |
| 6,294,418 B1 | 9/2001 | Noble |
| 6,373,099 B1 | 4/2002 | Kikuchi et al. |
| 6,392,271 B1 | 5/2002 | Alavi et al. |
| 6,406,962 B1 | 6/2002 | Agnello et al. |
| 6,420,751 B1 | 7/2002 | Maeda et al. |
| 6,461,900 B1 | 10/2002 | Sundaresan et al. |
| 6,483,171 B1 | 11/2002 | Forbes et al. |
| 6,624,459 B1 | 9/2003 | Dachtera et al. |
| 6,658,259 B2 | 12/2003 | McIntosh |
| 6,740,937 B1 | 5/2004 | Sushihara |
| 6,747,314 B2 | 6/2004 | Sundaresan et al. |
| 6,815,277 B2 | 11/2004 | Fried et al. |
| 6,849,903 B2 | 2/2005 | Sushihara |
| 6,861,684 B2 | 3/2005 | Skotnicki et al. |
| 6,878,991 B1 | 4/2005 | Forbes |
| 6,891,225 B2 | 5/2005 | Horiguchi et al. |
| 6,943,407 B2 | 9/2005 | Ouyang et al. |
| 7,052,941 B2 | 5/2006 | Lee |
| 7,193,278 B2 | 3/2007 | Song |
| 7,198,976 B2 | 4/2007 | Hirata |
| 7,233,033 B2 | 6/2007 | Koyama et al. |
| 7,241,655 B2 | 7/2007 | Tang et al. |
| 7,271,052 B1 | 9/2007 | Forbes |
| 7,368,334 B2 | 5/2008 | Yeo et al. |
| 7,374,990 B2 | 5/2008 | Tang et al. |
| 7,413,480 B2 | 8/2008 | Thomas |
| 7,579,214 B2 | 8/2009 | Yamazaki et al. |
| 7,619,675 B2 | 11/2009 | Horii |
| 7,829,952 B2 | 11/2010 | Moniwa et al. |
| 7,872,287 B2 | 1/2011 | Masuoka et al. |
| 7,977,736 B2 | 7/2011 | Kim et al. |
| 7,977,738 B2 | 7/2011 | Minami et al. |
| 7,981,738 B2 | 7/2011 | Moniwa et al. |
| 8,039,893 B2 | 10/2011 | Masuoka et al. |
| 8,058,683 B2 | 11/2011 | Yoon et al. |
| 8,067,800 B2 | 11/2011 | Hsieh |
| 8,110,869 B2 | 2/2012 | Bhalla |
| 8,154,076 B2 | 4/2012 | Takaishi |
| 8,188,537 B2 | 5/2012 | Masuoka et al. |
| 8,227,305 B2 | 7/2012 | Forbes |
| 8,378,400 B2 | 2/2013 | Masuoka et al. |
| 8,482,047 B2 | 7/2013 | Abbott et al. |
| 2001/0052614 A1 | 12/2001 | Ishibashi |
| 2002/0000624 A1 | 1/2002 | Takemura et al. |
| 2002/0034853 A1 | 3/2002 | Alavi et al. |
| 2002/0110039 A1 | 8/2002 | Forbes et al. |
| 2002/0195652 A1 | 12/2002 | Maeda et al. |
| 2003/0002093 A1 | 1/2003 | Hynecek |
| 2003/0075758 A1 | 4/2003 | Sundaresan et al. |
| 2004/0005755 A1 | 1/2004 | Moniwa et al. |
| 2004/0113207 A1 | 6/2004 | Hsu et al. |
| 2004/0135215 A1 | 7/2004 | Song |
| 2004/0169293 A1 | 9/2004 | Sushihara |
| 2004/0256639 A1 | 12/2004 | Ouyang et al. |
| 2004/0262681 A1 | 12/2004 | Masuoka et al. |
| 2005/0127404 A1 | 6/2005 | Sushihara |
| 2005/0145911 A1 | 7/2005 | Forbes et al. |
| 2005/0263821 A1 | 12/2005 | Cho et al. |
| 2005/0281119 A1 | 12/2005 | Shibata et al. |
| 2006/0006444 A1 | 1/2006 | Leslie |
| 2006/0007333 A1 | 1/2006 | Horii |
| 2006/0033524 A1 | 2/2006 | Sushihara |
| 2006/0043520 A1 | 3/2006 | Jerdev et al. |
| 2006/0046391 A1 | 3/2006 | Tang et al. |
| 2006/0261406 A1 | 11/2006 | Chen |
| 2007/0007601 A1 | 1/2007 | Hsu et al. |
| 2007/0075359 A1 | 4/2007 | Yoon et al. |
| 2007/0117324 A1 | 5/2007 | Previtali |
| 2007/0138557 A1 | 6/2007 | Ipposhi |
| 2007/0173006 A1 | 7/2007 | Moniwa et al. |
| 2008/0048245 A1 | 2/2008 | Kito et al. |
| 2008/0173936 A1 | 7/2008 | Yoon et al. |
| 2008/0210985 A1 | 9/2008 | Ogawa et al. |
| 2008/0227241 A1 | 9/2008 | Nakabayashi et al. |
| 2009/0032955 A1 | 2/2009 | Tanaka et al. |
| 2009/0057722 A1 | 3/2009 | Masuoka et al. |
| 2009/0065832 A1 | 3/2009 | Masuoka et al. |
| 2009/0085088 A1 | 4/2009 | Takaishi |
| 2009/0114989 A1 | 5/2009 | Hamamoto |
| 2009/0159964 A1 | 6/2009 | Lee |
| 2009/0174024 A1 | 7/2009 | Kim |
| 2009/0197379 A1 | 8/2009 | Leslie |
| 2009/0290082 A1 | 11/2009 | Yamazaki et al. |
| 2009/0291551 A1 | 11/2009 | Cho |
| 2010/0052029 A1 | 3/2010 | Huang |
| 2010/0200731 A1 | 8/2010 | Masuoka et al. |
| 2010/0200913 A1 | 8/2010 | Masuoka et al. |
| 2010/0207172 A1 | 8/2010 | Masuoka et al. |
| 2010/0207200 A1 | 8/2010 | Masuoka et al. |
| 2010/0207201 A1 | 8/2010 | Masuoka et al. |
| 2010/0213525 A1 | 8/2010 | Masuoka et al. |
| 2010/0213539 A1 | 8/2010 | Masuoka et al. |
| 2010/0219457 A1 | 9/2010 | Masuoka et al. |
| 2010/0219483 A1 | 9/2010 | Masuoka et al. |
| 2010/0270611 A1 | 10/2010 | Masuoka et al. |
| 2010/0276750 A1 | 11/2010 | Tu |
| 2010/0295123 A1 | 11/2010 | Lung et al. |
| 2011/0073925 A1 | 3/2011 | Park et al. |
| 2011/0215381 A1 | 9/2011 | Masuoka et al. |
| 2011/0254067 A1 | 10/2011 | Abbott et al. |
| 2011/0275207 A1 | 11/2011 | Moniwa et al. |
| 2011/0303973 A1 | 12/2011 | Masuoka et al. |
| 2011/0303985 A1 | 12/2011 | Masuoka et al. |
| 2012/0086051 A1 | 4/2012 | Wang et al. |
| 2012/0196415 A1 | 8/2012 | Masuoka et al. |

FOREIGN PATENT DOCUMENTS

| | | |
|---|---|---|
| CN | 1983601 A | 6/2007 |
| CN | 101542733 A | 9/2009 |
| DE | 4443968 | 11/1995 |
| EP | 1770769 A1 | 4/2007 |
| EP | 2197032 A1 | 6/2010 |
| EP | 2239770 A1 | 10/2010 |
| EP | 2239771 A1 | 10/2010 |
| EP | 2244305 A1 | 10/2010 |
| EP | 2246895 A1 | 11/2010 |
| JP | 60-070757 A | 4/1985 |
| JP | 61-013661 | 1/1986 |
| JP | 62-045058 A | 2/1987 |
| JP | 62-190751 | 8/1987 |
| JP | 63-037633 A | 2/1988 |
| JP | 63-158866 A | 7/1988 |
| JP | 64-089560 A | 4/1989 |
| JP | 01-175775 A | 7/1989 |
| JP | 02-066969 A | 3/1990 |
| JP | 02-071556 | 3/1990 |
| JP | 02-089368 A | 3/1990 |
| JP | 02-188966 A | 7/1990 |
| JP | 03-114233 | 5/1991 |
| JP | 03-145761 | 6/1991 |
| JP | 03-225873 A | 10/1991 |
| JP | 04-234166 A | 8/1992 |
| JP | 05-276442 A | 10/1993 |
| JP | 06-021467 A | 1/1994 |
| JP | 06-069441 | 3/1994 |
| JP | 06-237003 A | 8/1994 |
| JP | 07-099311 A | 4/1995 |

(56) References Cited

FOREIGN PATENT DOCUMENTS

| | | |
|---|---|---|
| JP | 07-321228 | 12/1995 |
| JP | 08-078533 A | 3/1996 |
| JP | 09-008295 | 1/1997 |
| JP | 10-079482 A | 3/1998 |
| JP | 10-223777 A | 8/1998 |
| JP | 11-087649 | 3/1999 |
| JP | 2000-012705 A | 1/2000 |
| JP | 2000-068516 | 3/2000 |
| JP | 2000-208434 | 7/2000 |
| JP | 2000-243085 | 9/2000 |
| JP | 2000-244818 A | 9/2000 |
| JP | 2000-357736 | 12/2000 |
| JP | 2001-028399 | 8/2001 |
| JP | 2001-237421 A | 8/2001 |
| JP | 2001-339057 A | 12/2001 |
| JP | 2001-352047 A | 12/2001 |
| JP | 2002-009257 | 1/2002 |
| JP | 2002-033399 A | 1/2002 |
| JP | 2002-231951 A | 8/2002 |
| JP | 2002-246580 A | 8/2002 |
| JP | 2002-246581 A | 8/2002 |
| JP | 2003-068883 A | 3/2003 |
| JP | 2003-142684 | 5/2003 |
| JP | 2003-179160 A | 6/2003 |
| JP | 2003-224211 A | 8/2003 |
| JP | 2004-079694 | 3/2004 |
| JP | 2004-096065 A | 3/2004 |
| JP | 2004-153246 | 5/2004 |
| JP | 2004-193588 A | 7/2004 |
| JP | 2004-259733 A | 9/2004 |
| JP | 2004-319808 A | 11/2004 |
| JP | 2005-012213 A | 1/2005 |
| JP | 2005-135451 A | 5/2005 |
| JP | 2006-024799 A | 1/2006 |
| JP | 2006-514392 | 4/2006 |
| JP | 2006-294995 A | 10/2006 |
| JP | 2007-250652 A | 9/2007 |
| JP | 2008-177565 | 7/2008 |
| JP | 2008-205168 A | 9/2008 |
| JP | 2008-300558 A | 12/2008 |
| JP | 2009-110049 A | 5/2009 |
| JP | 2009-182316 A | 8/2009 |
| JP | 2009-182317 A | 8/2009 |
| JP | 2010-171055 | 8/2010 |
| JP | 2010-0213539 A | 9/2010 |
| JP | 2010-258345 | 11/2010 |
| JP | 2011-066105 | 3/2011 |
| JP | 2011-071235 | 4/2011 |
| JP | 2011-077437 | 4/2011 |
| JP | 2011-211161 A | 10/2011 |
| KR | 10-0132560 | 12/1997 |
| KR | 10-0200222 | 6/1999 |
| KR | 10-0327875 B1 | 9/2002 |
| KR | 2004-0063348 A | 7/2004 |
| WO | WO 94/14198 A1 | 6/1994 |
| WO | WO 01/22494 A1 | 3/2001 |
| WO | WO 2005/036651 | 4/2005 |
| WO | WO 2006/127586 | 11/2006 |
| WO | WO 2009/034623 A1 | 3/2009 |
| WO | WO 2009/034731 A1 | 3/2009 |
| WO | WO 2009/057194 A1 | 5/2009 |
| WO | WO 2009/095997 A1 | 8/2009 |
| WO | WO 2009/096001 A1 | 8/2009 |
| WO | WO 2009/096464 A1 | 8/2009 |
| WO | WO 2009/096465 A1 | 8/2009 |
| WO | WO 2009/096466 A1 | 8/2009 |
| WO | WO 2009/096470 A1 | 8/2009 |
| WO | WO 2009/102059 A1 | 8/2009 |
| WO | WO 2009/133957 A1 | 11/2009 |
| WO | WO 2011/111662 A1 | 9/2011 |

OTHER PUBLICATIONS

European Search Report for counterpart European Application No. 09705485.2, dated Feb. 14, 2011, 5 pages.
Extended European Search Report for European Application No. 10009574.4, dated May 15, 2012, 6 pages.
International Search Report for International Application No. PCT/JP2007/071052, dated Jan. 29, 2008, 6 pages.
Written Opinion of the International Searching Authority for International Application No. PCT/JP2007/071052, dated Jan. 29, 2008, 9 pages.
International Search Report for International Application No. PCT/JP2008/051302, dated Apr. 8, 2008, 2 pages.
Written Opinion of the International Searching Authority for International Application No. PCT/JP2008/051302, dated Apr. 8, 2008, 5 pages.
International Search Report for International Application No. PCT/JP2009/051461, dated Apr. 21, 2009, 2 pages.
Written Opinion of the International Searching Authority for International Application No. PCT/JP2009/051461, dated Apr. 21, 2009, 6 pages.
Hieda, K. et al., "New Effects of Trench Isolated Transistor Using Side-Wall Gates," VLSI Research Center, Toshiba Corporation, 1987, 4 pages.
Iwai, Makoto et al., "High-Performance Buried Gate Surrounding Gate Transistor for Future Three-Dimensional Devices," Japanese Journal of Applied Physics, 2004, vol. 43, No. 10, pp. 6904-6906.
Nitayama, Akihiro et al., "Multi-Pillar Surrounding Gate Transistor (M-SGT) for Compact and High-Speed Circuits," IEEE Transactions on Electron Devices, vol. 3, No. 3, Mar. 1991, pp. 579-583.
Office Action for Chinese Patent Application Serial No. 200980103505.8, dated Nov. 1, 2012, 5 pages.
Office Action for Japanese Patent Application Serial No. 2009-538870, dated Nov. 8, 2012, 4 pages.
Restriction Requirement for U.S. Appl. No. 13/412,959, dated Nov. 8, 2012, 6 pages.
Agranov, G. et al., "Pixel Size Reduction of CMOS Image Sensors and Comparison of Characteristics", *The Institute of Image Formation and Television Engineers (ITE) Technical Report*, vol. 33, No. 38, pp. 9-12, Sep. 2009.
Chen, Yijian et al., "Vertical integrated-gate CMOS for ultra-dense IC", *Microelectronic Engineering*, vol. 83, 2006, pp. 1745-1748.
Choi, Yang-Kyu et al., "FinFET Process Refinements for Improved Mobility and Gate Work Function Engineering," IEEE, 2002, 4 pages.
Office Action for Chinese Patent Application Serial No. 200980103454.9, dated Oct. 31, 2012, 7 pages.
Office Action for Chinese Patent Application Serial No. 201010171435.4, dated Dec. 21, 2012, 7 pages.
Office Action for Chinese Patent Application Serial No. 2011100647037, dated Nov. 14, 2012, 6 pages.
Examination Report for European Application No. 08722595.9, dated Jul. 11, 2012, 4 pages.
Examination Report in corresponding European Application No. 07 807 139.6, dated Jun. 11, 2012, 4 pages.
Extended European Search Report for European Application No. 07807139.6, dated Jun. 24, 2011, 10 pages.
Extended European Search Report for European Application No. 10004492.4, dated Jun. 21, 2012, 10 pages.
Extended European Search Report for European Application No. 12001395.8, dated Apr. 26, 2012, 7 pages.
Extened European Search Report for European Application No. 10009579.3, dated Jun. 11, 2012, 11 pages.
Guidash, R.M. et al. "A 0.6 µm CMOS Pinned Photodiode Color Imager Technology", *IEDM Digest Papers*, pp. 927-929, 1997.
International Preliminary Report on Patentability for International Application No. PCT/JP2008/051300, dated Aug. 31, 2010, 9 pages.
International Preliminary Report on Patentability for International Application No. PCT/JP2009/051459, dated Aug. 31, 2010, 9 pages.
International Preliminary Report on Patentability for International Application No. PCT/JP2011/055264, dated Oct. 11, 2012, 7 pages.
International Search Report for International Application No. PCT/JP2007/067732, dated Dec. 11, 2007, 2 pages.
International Search Report for International Application No. PCT/JP2008/051300, dated May 13, 2008, 4 pages.
International Search Report for International Application No. PCT/JP2008/051301, dated Apr. 1, 2008, 2 pages.

(56) References Cited

OTHER PUBLICATIONS

International Search Report for International Application No. PCT/JP2008/051304, dated Apr. 15, 2008, 2 pages.
International Search Report for International Application No. PCT/JP2008/058412, dated Jun. 10, 2008, 2 pages.
International Search Report for International Application No. PCT/JP2009/051459, dated Apr. 14, 2009, 4 pages.
International Search Report for International Application No. PCT/JP2009/051460, dated Apr. 21, 2009, 2 pages.
International Search Report for International Application No. PCT/JP2009/051463, dated Feb. 24, 2009, 2 pages.
International Search Report for International Application No. PCT/JP2009/058629, dated Jun. 2, 2009, 2 pages.
International Search Report for International Application No. PCT/JP2011/070534, dated Dec. 6, 2011, 10 pages.
International Search Report for International Application No. PCT/JP2011/071162, dated Dec. 13, 2011, 18 pages.
Kasano, Masahiro, "A 2.0.mu.m Pixel Pitch MOS Image Sensor with an Amorphous Si Film Color Filter," IEEE International Solid-State Circuits Conference, Feb. 8, 2005, 3 pages.
Maeda, Shigenobu et al., "Impact of a Vertical .PHI.-Shape Transistor (V.PHI.T) Cell for 1 Gbit DRAM and Beyond," IEEE Transactions on Electron Devices, vol. 42, No. 12, Dec. 1995, pp. 2117-2124.
Mendis, Sunetra K. et al. "A 128×128 CMOS Active Pixel Image Sensor for Highly Integrated Imaging System", *IEDM93, Digest Papers*, 22.6.1, pp. 583-586, 1993.
Mistry et al., "A 45nm Logic Technology with High-k+Metal Gate Transistors, Strained Silicon, 9 Cu Interconnect Layers, 193nm Dry Patterning, and 100% Pb-free Packaging", IEEE, pp. 247-250, 2007.
Nakamura, Jun-ichi et al., "Nondestructive Readout Mode Static Induction Transistor (SIT) Photo Sensors," IEEE Transactions on Electron Devices, 1993, vol. 40, pp. 334-341.
Non-Certified Partial Translation of Office Action from counterpart Korean Application No. 10-2010-7018204, dated Mar. 29, 2012, 1 page.
Notice of Allowance for U.S. Appl. No. 12/704,955, dated Mar. 15, 2012, 8 pages.
Notice of Allowance for U.S. Appl. No. 13/447,721, dated Nov. 2, 2012, 9 pages.
Notice of Allowance for U.S. Appl. No. 12/700,294, dated Oct. 5, 2012, 7 pages.
Office Action from co-pending U.S. Appl. No. 12/704,935, dated Nov. 18, 2011, 9 pages.
Office Action from co-pending U.S. Appl. No. 13/043,081, dated Jul. 16, 2012, 6 pages.
Office Action from co-pending U.S. Appl. No. 13/046,113, dated Jan. 9, 2013, 6 pages.
Office Action from co-pending U.S. Appl. No. 13/113,482, dated Jan. 2, 2013, 9 pages.
Office Action from co-pending U.S. Appl. No. 13/412,959, dated Dec. 7, 2012, 9 pages.
Office Action from co-pending U.S. Appl. No. 12/704,955, dated Dec. 8, 2011, 12 pages.
Office Action from counterpart Korean Application No. 10-2010-7018204, dated Mar. 29, 2012, 7 pages.
Takahashi, Hidekazu, "A 3.9.mu.m Pixel Pitch VGA Format 10b Digital Image Sensor with 1.5-Transistor/Pixel," IEEE International Solid-State Circuits Conference, Feb. 16, 2004, 10 pages.
Takato, Hiroshi et al., "Impact of Surrounding Gate Transistor (SGT) for Ultra-High-Density LSI's," IEEE Transactions on Electron Devices, vol. 38, No. 3, Mar. 1991, pp. 573-578.
Written Opinion of the International Searching Authority for International Application No. PCT/JP2007/067732, dated Dec. 11, 2007, 4 pages.
Written Opinion of the International Searching Authority for International Application No. PCT/JP2008/051300, dated Aug. 30, 2010, 8 pages.
Written Opinion of the International Searching Authority for International Application No. PCT/JP2008/051301, dated Apr. 1, 2008, 5 pages.
Written Opinion of the International Searching Authority for International Application No. PCT/JP2008/058412, dated Jun. 10, 2008, 4 pages.
Written Opinion of the International Searching Authority for International Application No. PCT/JP2009/051459, dated Aug. 30, 2010, 8 pages.
Written Opinion of the International Searching Authority for International Application No. PCT/JP2009/051460, dated Apr. 21, 2009, 5 pages.
Written Opinion of the International Searching Authority for International Application No. PCT/JP2009/058629, dated Jun. 2, 2009, 4 pages.
Wu et al., "High Performance 22/20nm FinFET CMOS Devices with Advanced High-K/Metal Gate Scheme", IEEE, pp. 27.1.1-27.1.4, 2010.
Wuu, S.G. et al., "A Leading-Edge 0.9 μm Pixel CMOS Image Sensor Technology with Backside Illumination: Future Challenges for Pixel Scaling", *IEDM2010 Digest Papers*, 14.1.1, pp. 332-335, 2010.
Yonemoto, Kazuya, "A CMOS Image Sensor with a Simple FPN-Reduction Technology and a Hole Accumulated Diode," 2000 IEEE International Solid-State Circuites Conference, 9 pages.
Office Action for Korean Patent Application Serial No. 9-5-2013-010869116, dated Feb. 18, 2013, 4 pages.
Lee, et al., "An Active Pixel Sensor Fabricated Using CMOS/CCD Process Technology" in Program IEEE Workshop on Charge-Coupled Devices and Advanced Image Sensors, 1995, 5 pages.
Murakami et al., "Technologies to Improve Photo-Sensitivity and Reduce VOD Shutter Voltage for CCD Image Sensors", IEEE Transactions on Electron Devices, vol. 47, No. 8, 2000, pp. 1566-1572.
Takahashi et al., "A 3.9-μm Pixel Pitch VGA Format 10-b Digital Output CMOS Image Sensor With 1.5 Transistor/Pixel", IEEE Journal of Solid-State Circuit, Vo.39, No. 12, 2004, pp. 2417-2425.
Yasutomi et al, "A High-Speed CMOS Image Sensor with Global Electronic Shutter Pixel Using Pinned Diodes", IEEJ Trans. SM, vol. 129, No. 10, 2009, pp. 321-327.
Restriction Requirement for U.S. Appl. No. 13/116,506, dated Feb. 28, 2013, 6 pages.
Notice of Allowance for U.S. Appl. No. 13/043,081, dated Mar. 18, 2013, 6 pages.
Notice of Allowance for U.S. Appl. No. 13/113,482, dated Apr. 4, 2013, 10 pages.
Notice of Allowance for U.S. Appl. No. 12/768,290, dated Apr. 18, 2013, 9 pages.
Notice of Allowance for U.S. Appl. No. 12/704,935, dated May 16, 2013, 10 pages.
Notice of Allowance for U.S. Appl. No. 13/046,113, dated May 13, 2013, 10 pages.
Notice of Allowance for U.S. Appl. No. 13/412,959, dated May 8, 2013, 9 pages.
Office Action for U.S. Appl. No. 13/116,506, dated Jul. 18, 2013, 12 pages.
Notice of Allowance for U.S. Appl. No. 13/606,823, dated Jul. 8, 2013, 12 pages.
English translation of International Search Report for PCT/JP2011/070534, dated Dec. 6, 2011, 2 pages.
English translation of International Search Report for PCT/JP2011/071162, dated Dec. 13, 2011, 5 pages.
Office Action for U.S. Appl. No. 13/917,040 dated Aug. 6, 2013, 5 pages.

FIG.4
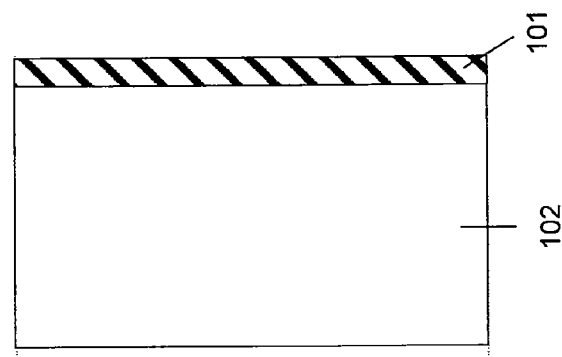
(c)
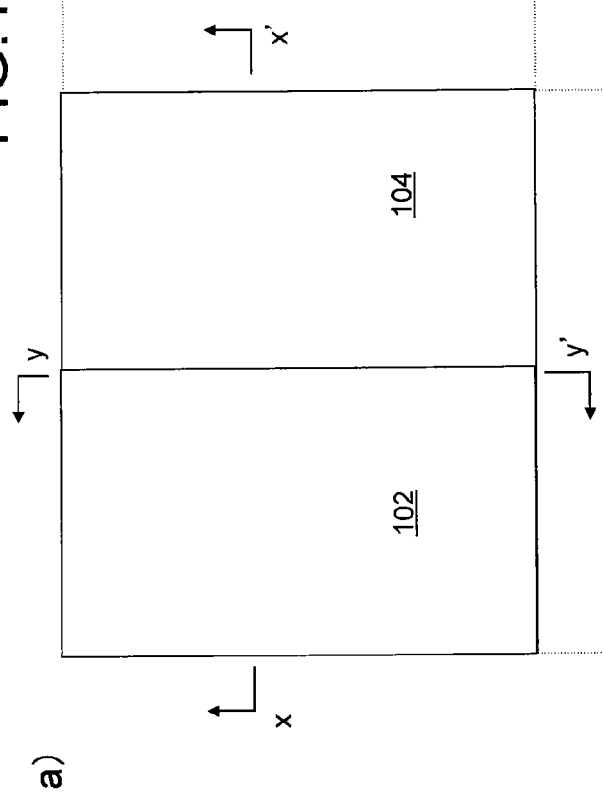
(a)
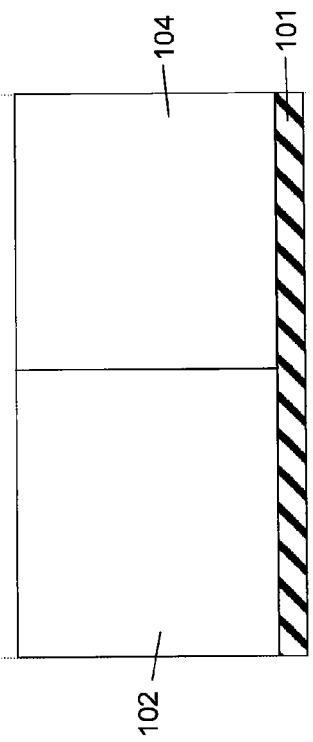
(b)

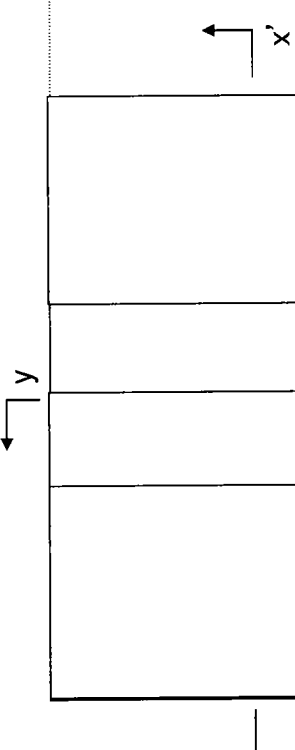
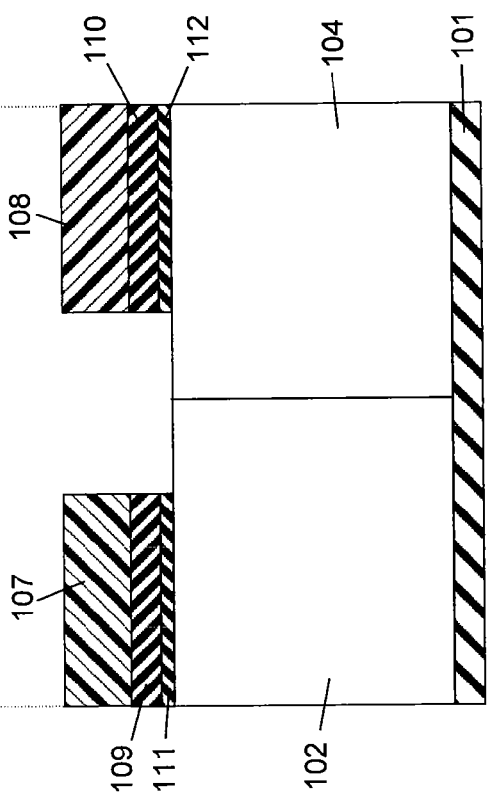
FIG. 7

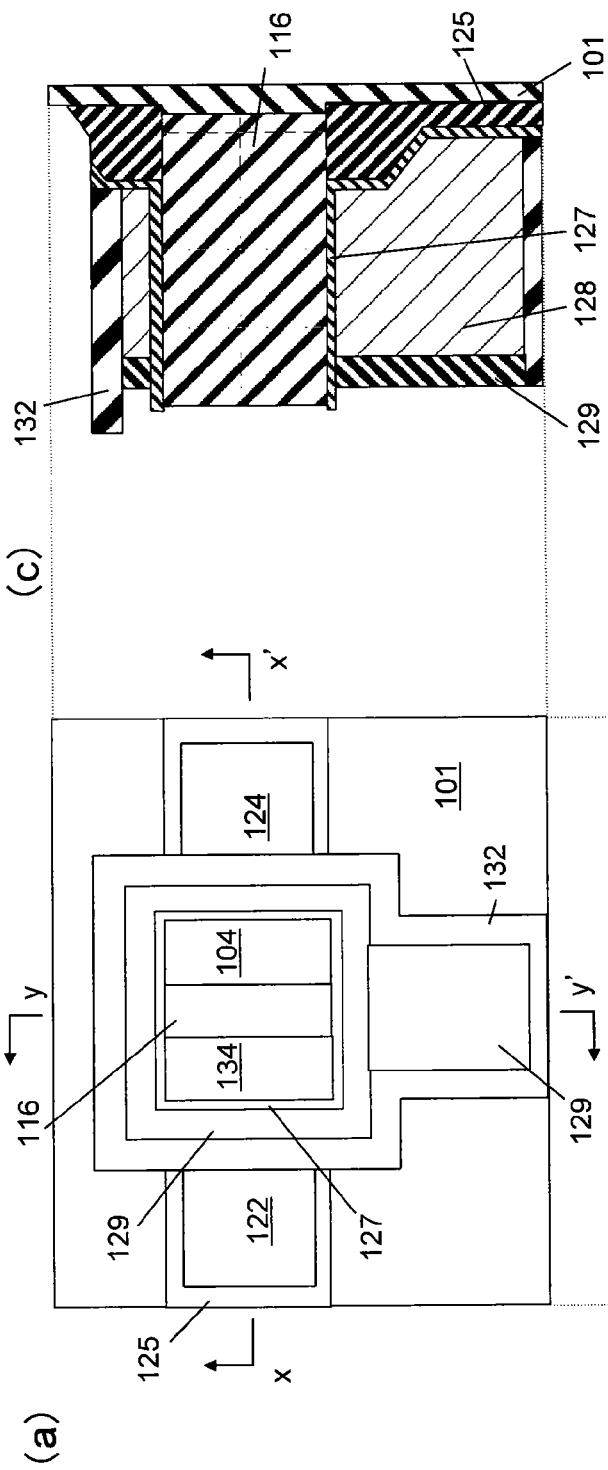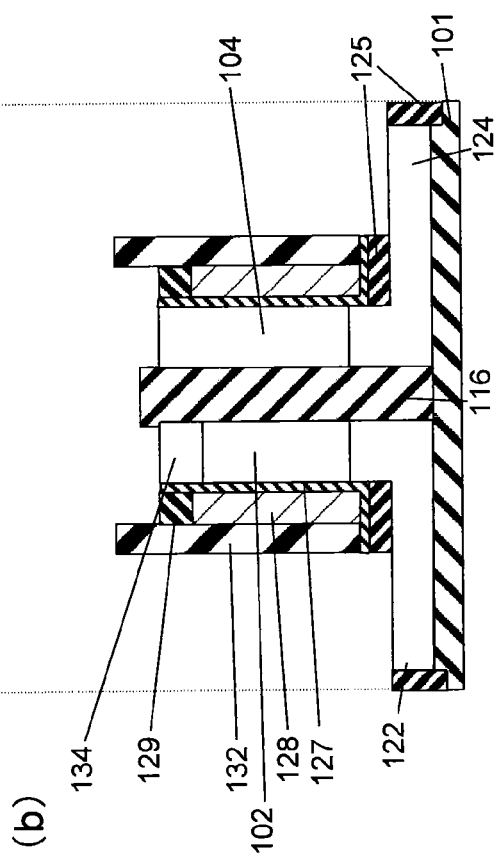
FIG.51

SEMICONDUCTOR DEVICE HAVING A SURROUNDING GATE

RELATED APPLICATIONS

Pursuant to 35 U.S.C. §119(e), this application claims the benefit of the filing date of Provisional U.S. Patent Application Ser. No. 61/278,204 filed on Oct. 2, 2009. This application also claims priority under 35 U.S.C. §119(a) to JP2009-229591 filed on Oct. 1, 2009. The entire contents of these applications are hereby incorporated by reference.

BACKGROUND OF THE INVENTION

1. Field of the Invention

This application relates generally to a semiconductor device.

2. Description of the Related Art

High-integration of integrated circuits using a semiconductor device, in particular, a MOS (Metal Oxide Semiconductor) transistor which is a field effect transistor having a gate electrode with a MOS structure is advancing. Together with advancement of high-integration, microfabrication of such MOS transistor used in the integrated circuit is progressed in the range of a nano order. When a MOS transistor configures an inverter circuit (NOT circuit) that is one of the basic circuits for digital circuits, if microfabrication of that MOS transistor advances, it becomes difficult to suppress any leak current, and the reliability is deteriorated because of a hot-carrier effect. Moreover, reduction of an occupy area of a circuit is not easily accomplished because of the necessity of ensuring a necessary current amount. In order to overcome such problems, there is proposed a Surrounding Gate Transistor (SGT) having an island semiconductor layer where a source, a gate, and a drain are arranged in the vertical direction relative to a substrate, and employing a structure that the island semiconductor layer is surrounded by a gate, and there are also proposed CMOS inverter circuits using such SGT (see, S. Watanabe, K. Tsuchida, D. Takashima, Y. Oowaki, A. Nitayama, K. Hieda, H. Takato, K. Sunouchi, F. Horiguchi, K. Ohuchi, F. Masuoka, H. Hara, "A Nobel Circuit Technology with Surrounding Gate Transistors (SGT's) for Ultra High Density DRAM's", IEEE JSSC, Vol. 30, No. 9, 1995). Size reduction can be accomplished by such CMOS inverter circuit using the SGT, but further size reduction of the CMOS inverter circuits using the SGT is desired.

The present invention has been made in view of the foregoing circumstances, and it is an object of the present invention to provide a semiconductor device which has a CMOS inverter circuit with an SGT and which accomplishes high-integration.

SUMMARY OF THE INVENTION

A semiconductor device according to a first aspect of the present invention comprises: a columnar structural body which is arranged on a substrate and which includes a first silicon, a second silicon having a different conductivity type from the first silicon, and a first insulator held between the first silicon and the second silicon, which runs in a vertical direction to the substrate; a pair of first upper and lower silicon layers arranged on and below the first silicon so as to sandwich the first silicon, and containing a first high-concentration dopant that has a different conductivity type from the first silicon; a pair of second upper and lower silicon layers arranged on and below the second silicon so as to sandwich the second silicon, and containing a second high-concentration dopant that has a different conductivity type from the second silicon; a second insulator which surrounds respective peripheries of the first silicon, the second silicon, the pair of first upper and lower silicon layers, and the pair of second upper and lower silicon layers, and the first insulator; and a conductive body surrounding a periphery of the second insulator, wherein the silicon layer in the pair of first upper and lower silicon layers arranged on the first silicon is electrically connected to the silicon layer in the pair of second upper and lower silicon layers arranged on the second silicon, and a first power is supplied to the lower silicon layer in the pair of first upper and lower silicon layers, and a second power is supplied to the lower silicon layer in the pair of second upper and lower silicon layers arranged.

In a preferable mode of the present invention, in the columnar structural body, the first silicon is a p-type or intrinsic silicon, the second silicon is an n-type or intrinsic silicon, and the first insulator is a first oxide film, the pair of first upper and lower silicon layers are each a silicon layer containing an n-type high-concentration dopant, the pair of second upper and lower silicon layers are each a silicon layer containing a p-type high-concentration dopant, and the second insulator and the conductive body serve as a gate insulating film and a gate electrode, respectively.

In a preferable mode of the present invention, the first silicon and the second silicon are each formed in a quadrangular column shape.

In a preferable mode of the present invention, a length $L_1$ of a side of a bottom quadrangle which is of the first silicon formed in a quadrangular column shape and which contacts the first oxide film satisfies a following relational expression 1.

$$L_1 < 2 \times \sqrt{\{(2 \times \phi_F) \times (2 \times \in silicon)/(q \times N_A)\}} \quad \text{[Relational Expression 1]}$$

where $\phi_F$ is a Fermi potential, $\in silicon$ is a dielectric constant of silicon, q is a charge amount of electron, and $N_A$ is a dopant concentration of the first silicon.

In a preferable mode of the present invention, a length $L_2$ of a side of a bottom quadrangle which is of the first silicon formed in a quadrangular column shape and which is orthogonal to a side contacting the first oxide film satisfies a following relational expression 2.

$$L_2 < \sqrt{\{(2 \times \phi_F) \times (2 \times \in silicon)/(q \times N_A)\}} \quad \text{[Relational Expression 2]}$$

where $\phi_F$ is a Fermi potential, $\in silicon$ is a dielectric constant of silicon, q is a charge amount of electron, and $N_A$ is a dopant concentration of the first silicon.

In a preferable mode of the present invention, a length $L_3$ of a side of a bottom quadrangle which is of the second silicon formed in a quadrangular column shape and which contacts the first oxide film satisfies a following relational expression 3.

$$L_3 < 2 \times \sqrt{\{(2 \times \phi_F) \times (2 \times \in silicon)/(q \times N_D)\}} \quad \text{[Relational Expression 3]}$$

where $\phi_F$ is a Fermi potential, $\in silicon$ is a dielectric constant of silicon, q is a charge amount of electron, and $N_D$ is a dopant concentration of the second silicon.

In a preferable mode of the present invention, a length $L_4$ of a side of a bottom quadrangle which is of the second silicon formed in a quadrangular column shape and which is orthogonal to a side contacting the first oxide film satisfies a following relational expression 4.

$$L_4 < \sqrt{\{(2 \times \phi_F) \times (2 \times \in silicon)/(q \times N_D)\}} \quad \text{[Relational Expression 4]}$$

where $\phi_F$ is a Fermi potential, $\in silicon$ is a dielectric constant of silicon, q is a charge amount of electron, and $N_D$ is a dopant concentration of the second silicon.

In a preferable mode of the present invention, the first silicon and the second silicon are each formed in a semicircular column shape.

In a preferable mode of the present invention, the second insulator serving as a gate insulating film, the conductive body surrounding the periphery of the second insulator and serving as a gate electrode, the first silicon, and the pair of first upper and lower silicon layers configure an enhancement type nMOS transistor, the second insulator serving as a gate insulating film, the conductive body surrounding the periphery of the second insulator and serving as a gate electrode, the second silicon, and the pair of second upper and lower silicon layers configure an enhancement type pMOS transistor, and the conductive body is formed of a material which causes the nMOS transistor and the pMOS transistor to be an enhancement type.

According to the first aspect of the present invention, it is possible to configure a CMOS inverter circuit by using a columnar structural body, which results in accomplishment of high-integration of the CMOS inverter circuit.

It is preferable that the first silicon and the second silicon should be each formed in a quadrangular column shape.

It is preferable that a length $L_1$ of a side of a bottom quadrangle which is of the first silicon formed in a quadrangular column shape and which contacts the first oxide film should satisfy a following relational expression 1.

$$L_1 < 2 \times \sqrt{\{(2 \times \phi_F) \times (2 \times \in silicon)/(q \times N_A)\}} \quad \text{[Relational Expression 1]}$$

where $\phi_F$ is a Fermi potential, $\in$silicon is a dielectric constant of silicon, q is a charge amount of electron, and $N_A$ is a dopant concentration of the first silicon.

Accordingly, the p-type or intrinsic silicon which is the first silicon can be depleted, thereby making it possible to provide the semiconductor device having a highly integrated and fast CMOS inverter circuit.

It is preferable that a length $L_2$ of a side of a bottom quadrangle which is of the first silicon formed in a quadrangular column shape and which is orthogonal to a side contacting the first oxide film should satisfy a following relational expression 2.

$$L_2 < \sqrt{\{(2 \times \phi_F) \times (2 \times \in silicon)/(q \times N_A)\}} \quad \text{[Relational Expression 2]}$$

where $\phi_F$ is a Fermi potential, $\in$silicon is a dielectric constant of silicon, q is a charge amount of electron, and $N_A$ is a dopant concentration of the first silicon.

Accordingly, the p-type or intrinsic silicon which is the first silicon can be depleted, thereby making it possible to provide the semiconductor device having a highly integrated and fast CMOS inverter circuit.

It is preferable that a length $L_3$ of a side of a bottom quadrangle which is of the second silicon formed in a quadrangular column shape and which contacts the first oxide film should satisfy a following relational expression 3.

$$L_3 < 2 \times \sqrt{\{(2 \times \phi_F) \times (2 \times \in silicon)/(q \times N_D)\}} \quad \text{[Relational Expression 3]}$$

where $\phi_F$ is a Fermi potential, $\in$silicon is a dielectric constant of silicon, q is a charge amount of electron, and $N_D$ is a dopant concentration of the second silicon.

Accordingly, the n-type or intrinsic silicon that is the second silicon can be depleted, thereby making it possible to provide the semiconductor device having a highly integrated and fast CMOS inverter circuit.

It is preferable that a length $L_4$ of a side of a bottom quadrangle which is of the second silicon formed in a quadrangular column shape and which is orthogonal to a side contacting the first oxide film satisfies a following relational expression 4.

$$L_4 < \sqrt{\{(2 \times \phi_F) \times (2 \times \in silicon)/(q \times N_D)\}} \quad \text{[Relational Expression 4]}$$

where $\phi_F$ is a Fermi potential, $\in$silicon is a dielectric constant of silicon, q is a charge amount of electron, and $N_D$ is a dopant concentration of the second silicon.

Accordingly, the n-type or intrinsic silicon that is the second silicon can be depleted, thereby making it possible to provide the semiconductor device having a highly integrated and fast CMOS inverter circuit.

Moreover, it is preferable that the first silicon and the second silicon should be each formed in a semicircular column shape.

Accordingly, a columnar structural body can be formed by using a circular resist, thereby making it possible to provide the semiconductor device having a highly integrated and fast CMOS inverter circuit.

It is preferable that the second insulator serving as a gate insulating film, the conductive body surrounding the periphery of the second insulator and serving as a gate electrode, the first silicon, and the pair of first upper and lower silicon layers should configure an enhancement type nMOS transistor, the second insulator serving as a gate insulating film, the conductive body surrounding the periphery of the second insulator and serving as a gate electrode, the second silicon, and the pair of second upper and lower silicon layers should configure an enhancement type pMOS transistor, and the conductive body should be formed of a material which causes the nMOS transistor and the pMOS transistor to be an enhancement type.

Accordingly, both pMOS transistor and nMOS transistor are allowed to be an enhancement type.

BRIEF DESCRIPTION OF THE DRAWINGS

A more complete understanding of this application can be obtained when the following detailed description is considered in conjunction with the following drawings, in which:

FIG. 4 shows a step in the example of the manufacturing process, wherein (a), (b) and (c) are a top plan view, a cross-sectional view taken along the line X-X' in (a), and a cross-sectional view taken along the line Y-Y' in (a), respectively.

FIG. 7 shows a step in the example of the manufacturing process, wherein (a), (b) and (c) are a top plan view, a cross-sectional view taken along the line X-X' in (a), and a cross-sectional view taken along the line Y-Y' in (a), respectively.

FIG. 51 shows a step in the example of the manufacturing process, wherein (a), (b) and (c) are a top plan view, a cross-sectional view taken along the line X-X' in (a), and a cross-sectional view taken along the line Y-Y' in (a), respectively.

DETAILED DESCRIPTION OF THE PREFERRED EMBODIMENTS

An explanation will be given of a semiconductor device and a manufacturing method of same according to an embodiment of the present invention with reference to the accompanying drawings.

Figure 1:
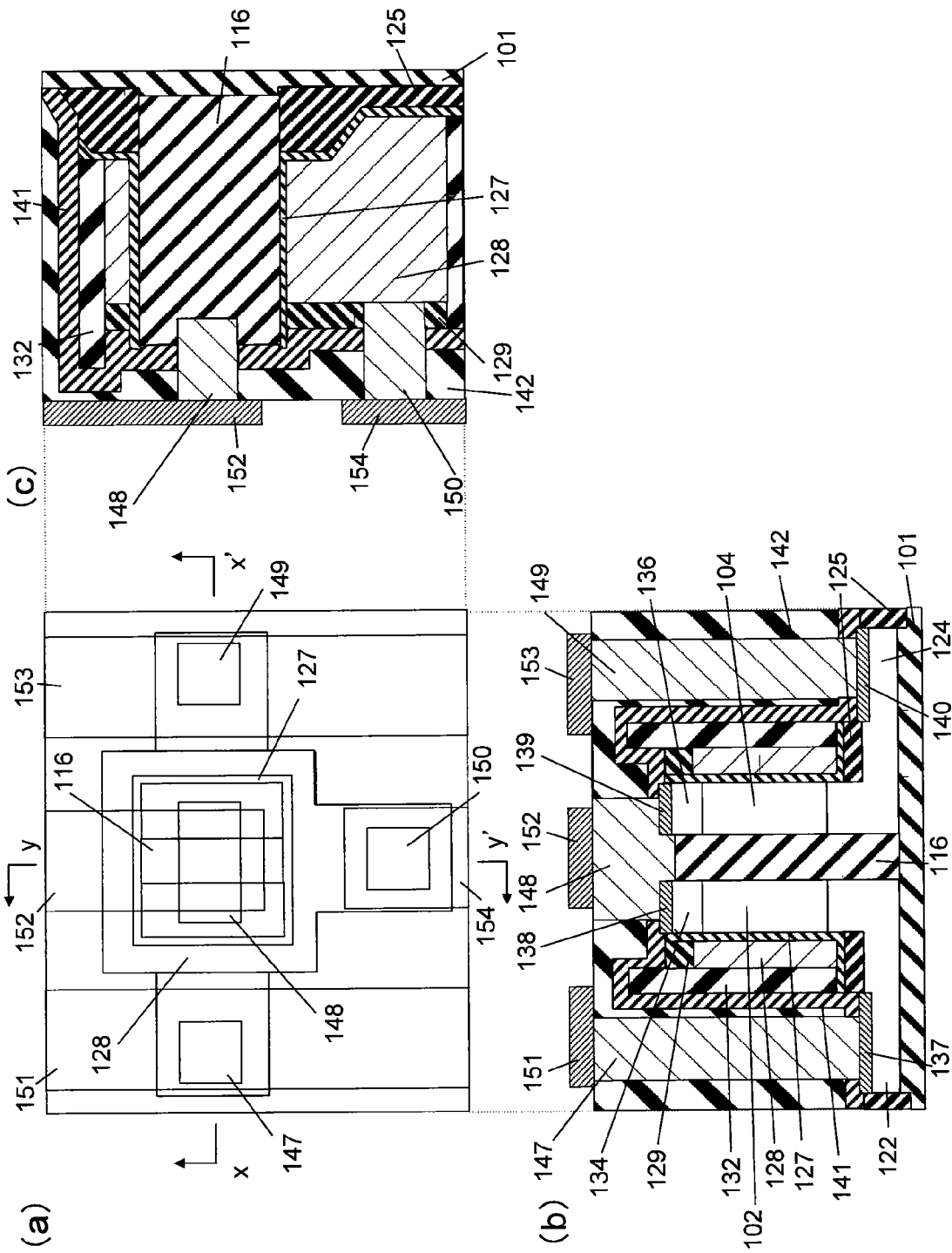
FIG. 1 shows a semiconductor device according to one embodiment of the present invention, wherein (a), (b) and (c) are a schematic diagram of the semiconductor device in a plane view, taken along the line X-X' in (a) and a cross-sectional view taken along the line Y-Y' in (a), respectively.

FIG. 1 shows a semiconductor device according to one embodiment of the present invention, wherein (a), (b) and (c) are a schematic diagram of the semiconductor device in a plane view, taken along the line X-X' in (a) and a cross-sectional view taken along the line Y-Y' in (a), respectively.

As shown in FIG. 1, a semiconductor device of the present embodiment has a CMOS inverter circuit (a MOS transistor), and has a columnar structural body configuring a MOS transistor which is arranged on a substrate (not shown) and which includes a p-type or intrinsic silicon 102, an n-type or intrinsic silicon 104, and a first oxide film 116 held between the silicon 102 and the silicon 104, which runs in the vertical direction to the substrate.

The semiconductor device of the present embodiment further includes a pair of upper and lower silicon layers 134, 122 which are arranged up and down so as to sandwich the p-type or intrinsic silicon 102 therebetween, and which contain n-type high-concentration dopants, a pair of upper and lower silicon layers 136, 124 which are arranged up and down so as to sandwich the n-type or intrinsic silicon 104 therebetween and which contain p-type high-concentration dopant, a gate insulating film 127 surrounding respective peripheries of the p-type or intrinsic silicon 102 and the n-type or intrinsic silicon 104, and a gate electrode 128 surrounding the periphery of the gate insulating film 127.

According to the semiconductor device of the present embodiment, the silicon layer 134 and the silicon layer 136 are electrically connected together. A first power is supplied to the silicon layer 122, while a second power is supplied to the silicon layer 124.

According to the semiconductor device of the present embodiment, a metal/silicon compound 138 is formed on the silicon layer 134 containing n-type high-concentration dopants, a metal/silicon compound 137 is formed on the silicon layer 122 containing n-type high-concentration dopants, a metal/silicon compound 139 is formed on the silicon layer 136 containing p-type high-concentration dopants, and a metal/silicon compound 140 is formed on the silicon layer 124 containing p-type high-concentration dopants.

As shown in FIG. 1, a contact 148 is formed on the metal/silicon compound 138 and on the metal/silicon compound 139, and electrically connects the compounds 138, 139 together.

Moreover, a contact 147 is formed on the metal/silicon compound 137, a contact 149 is formed on the metal/silicon compound 140, and a contact 150 is formed on the gate electrode 128.

A first metal 151 is formed on the contact 147, and the first power is supplied to the contact 147 through the first metal 151. A first metal 153 is formed on the contact 149, and the second power is supplied to the contact 149 through the first metal 153.

Moreover, a first metal 152 and a first metal 154 are formed on the contact 148 and the contact 150, respectively.

The p-type or intrinsic silicon 102 and the n-type or intrinsic silicon 104 are each formed in a quadrangular column shape. Accordingly, the columnar structural body of the semiconductor device of the present embodiment can be formed by using a resist in a quadrangular shape in a planar view.

It is preferable that a length $L_1$ of a side of a bottom quadrangle which is of the p-type or intrinsic silicon 102 formed in a quadrangular column shape and which contacts the first oxide film 116 should satisfy a following relational expression 1.

$$L_1 < 2 \times \sqrt{\{(2 \times \phi_F) \times (2 \times \in silicon)/(q \times N_A)\}}$$ [Relational Expression 1]

where $\phi_F$ is a Fermi potential, $\in silicon$ is a dielectric constant of silicon, q is a charge amount of electron, and $N_A$ is a dopant concentration of the silicon 102

Accordingly, the p-type or intrinsic silicon 102 can be depleted, which makes it possible to provide the semiconductor device having a highly integrated and fast CMOS inverter circuit.

It is preferable that a length $L_2$ of a side of a bottom quadrangle which is of the p-type or intrinsic silicon 102 formed in a quadrangular column shape and which is orthogonal to a side contacting the first oxide film 116 should satisfy a following relational expression 2.

$$L_2 < \sqrt{\{(2 \times \phi_F) \times (2 \times \in silicon)/(q \times N_A)\}}$$ [Relational Expression 2]

where $\phi_F$ is a Fermi potential, $\in silicon$ is a dielectric constant of silicon, q is a charge amount of electron, and $N_A$ is a dopant concentration of the silicon 102.

Accordingly, the p-type or intrinsic silicon 102 can be depleted, which makes it possible to provide the semiconductor device having a highly integrated and fast CMOS inverter circuit.

It is preferable that a length $L_3$ of a side of a bottom quadrangle which is of the n-type or intrinsic silicon 104 formed in a quadrangular column shape and which contacts the first oxide film 116 should satisfy a following relational expression 3.

$$L_3 < 2 \times \sqrt{\{(2 \times \phi_F) \times (2 \times \in silicon)/(q \times N_D)\}}$$ [Relational Expression 3]

where $\phi_F$ is a Fermi potential, $\in silicon$ is a dielectric constant of silicon, q is a charge amount of electron, and $N_D$ is a dopant concentration of the silicon 104.

Accordingly, the n-type or intrinsic silicon 104 can be depleted, which makes it possible to provide the semiconductor device having a highly integrated and fast CMOS inverter circuit.

Furthermore, it is preferable that a length $L_4$ of a side of a bottom quadrangle which is of the n-type or intrinsic silicon 104 formed in a quadrangular column shape and which is orthogonal to a side contacting the first oxide film 116 should satisfy a following relational expression 4.

$$L_4 < \sqrt{\{(2 \times \phi_F) \times (2 \times \in silicon)/(q \times N_D)\}}$$ [Relational Expression 4]

where $\phi_F$ is a Fermi potential, $\in silicon$ is a dielectric constant of silicon, q is a charge amount of electron, and $N_D$ is a dopant concentration of the silicon 104.

Accordingly, the n-type or intrinsic silicon 104 can be depleted, which makes it possible to provide the semiconductor device having a highly integrated and fast CMOS inverter circuit.

Figure 2:
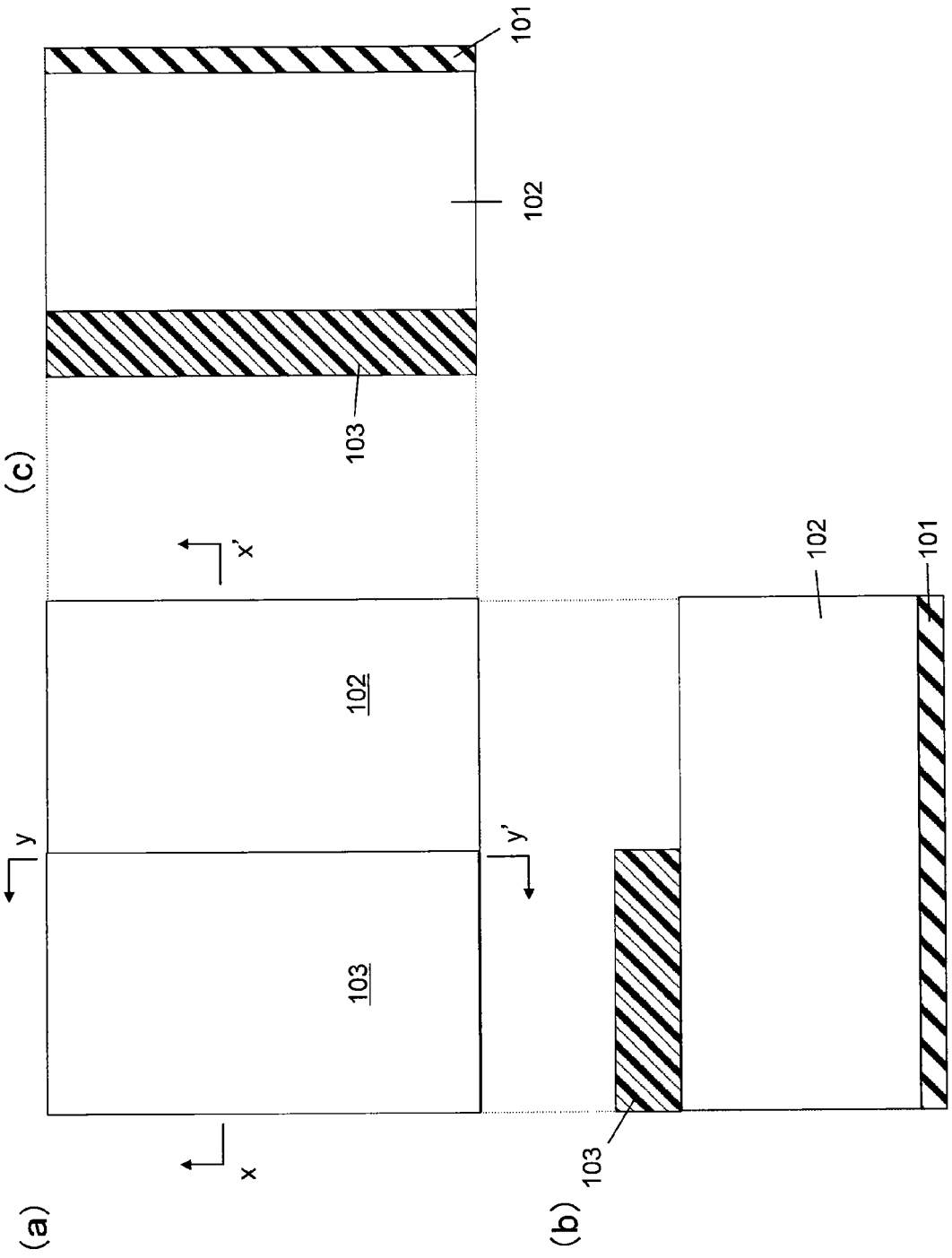
FIG. 2 shows a step in one example of a manufacturing process for the semiconductor device according to the embodiment, wherein (a), (b) and (c) are a top plan view, a cross-sectional view taken along the line X-X' in (a), and a cross-sectional view taken along the line Y-Y' in (a), respectively.
Figure 63:
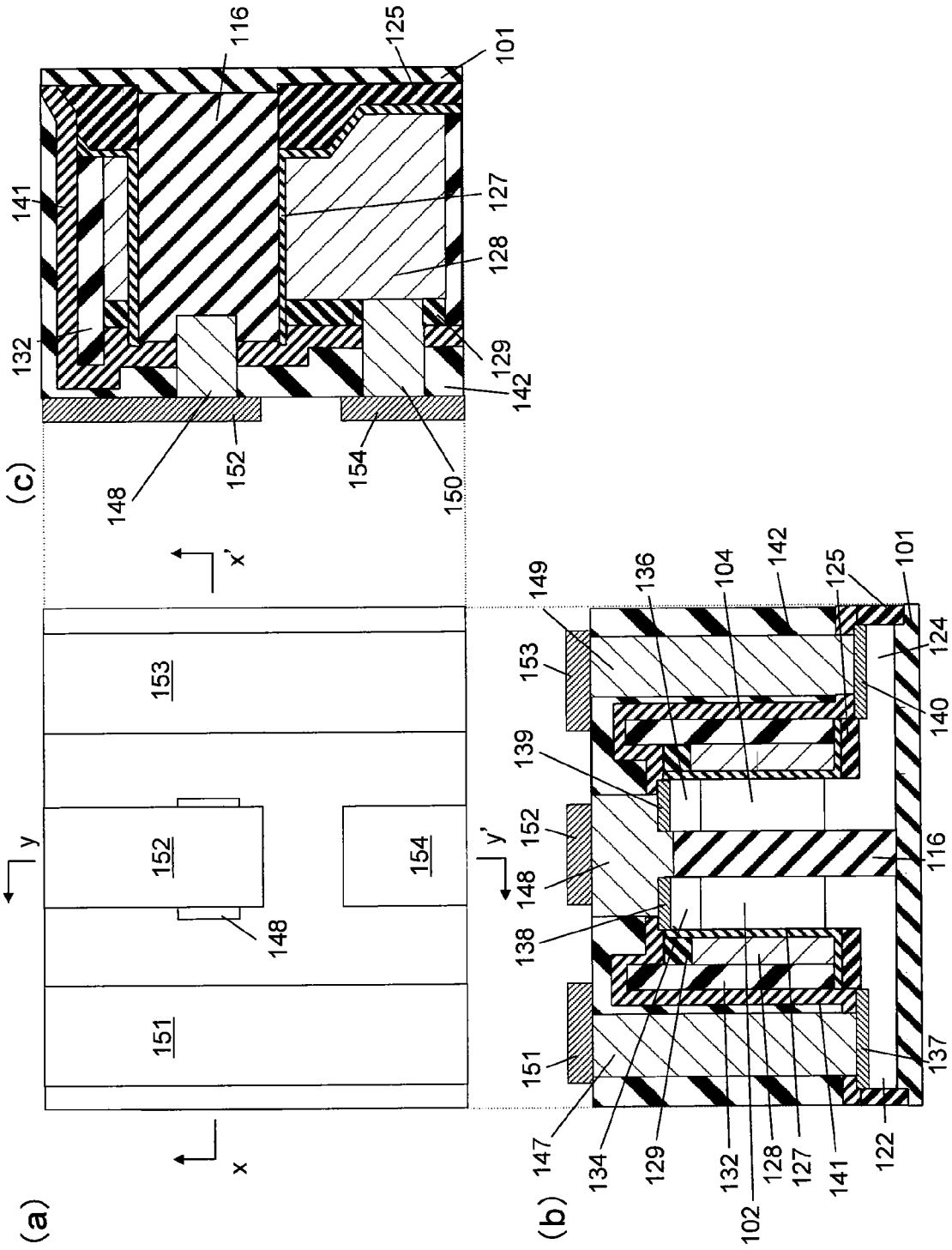
FIG. 63 shows a step in the example of the manufacturing process, wherein (a), (b) and (c) are a top plan view, a cross-sectional view taken along the line X-X' in (a), and a cross-sectional view taken along the line Y-Y' in (a), respectively.

An explanation will now be given of an example of the manufacturing process of the semiconductor device according to the present embodiment with reference to FIGS. 2 to 63. Note that the same structural element will be denoted by the same reference numeral in these figures. In FIGS. 2 to 63, all A-figures are plan views for explaining the manufacturing process of the semiconductor device of the present embodiment, all B-figures are cross-sectional views along a line X-X', and all C-figures are cross-sectional views along a line Y-Y'.

With reference to FIG. 2, a resist 103 for forming an n-type silicon is formed on a predetermined area of the p-type or intrinsic silicon 102 formed on an oxide film 101. If the silicon 102 is intrinsic, this step is unnecessary.

Figure 3:
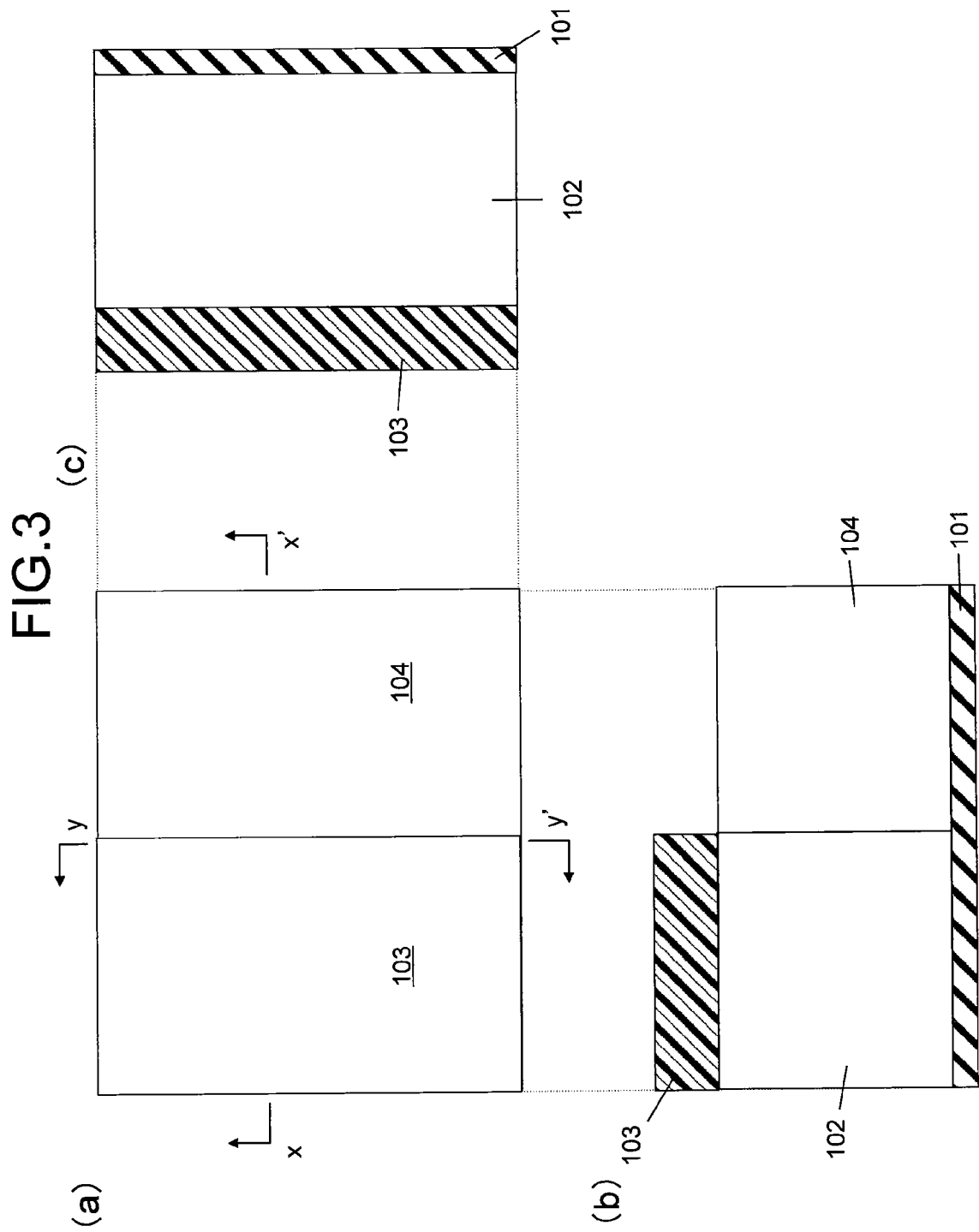
FIG. 3 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 3, the n-type or intrinsic silicon 104 is formed by introducing dopants like phosphorous into a predetermined area of the silicon 102 by using the resist 103 as a mask. If the silicon 104 is intrinsic, this step is unnecessary.

With reference to FIG. 4, the resist 103 is peeled.

Figure 5:
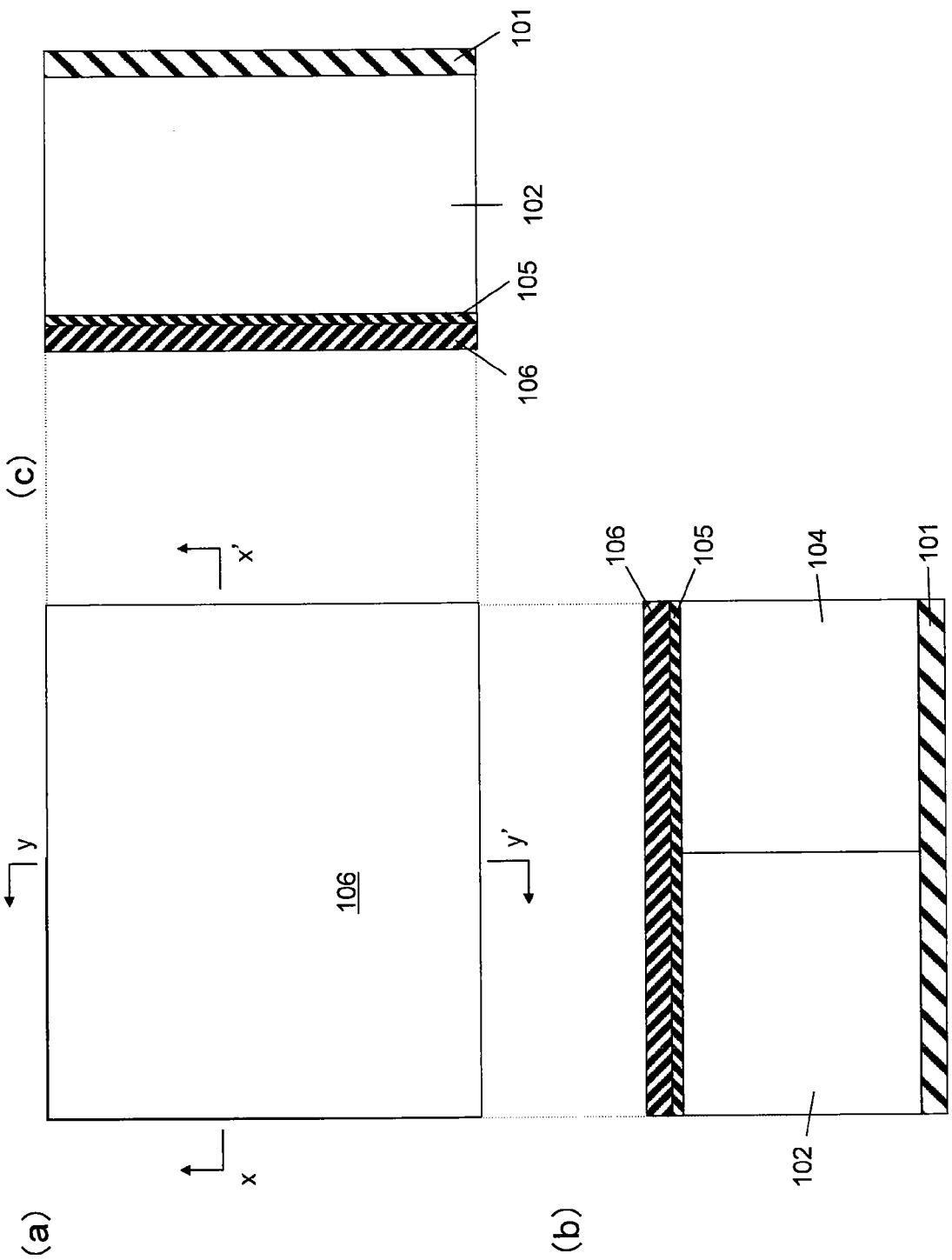
FIG. 5 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 5, an oxide film 105 and a nitride film 106 are deposited in this order on the silicon layers 102, 104.

Figure 6:
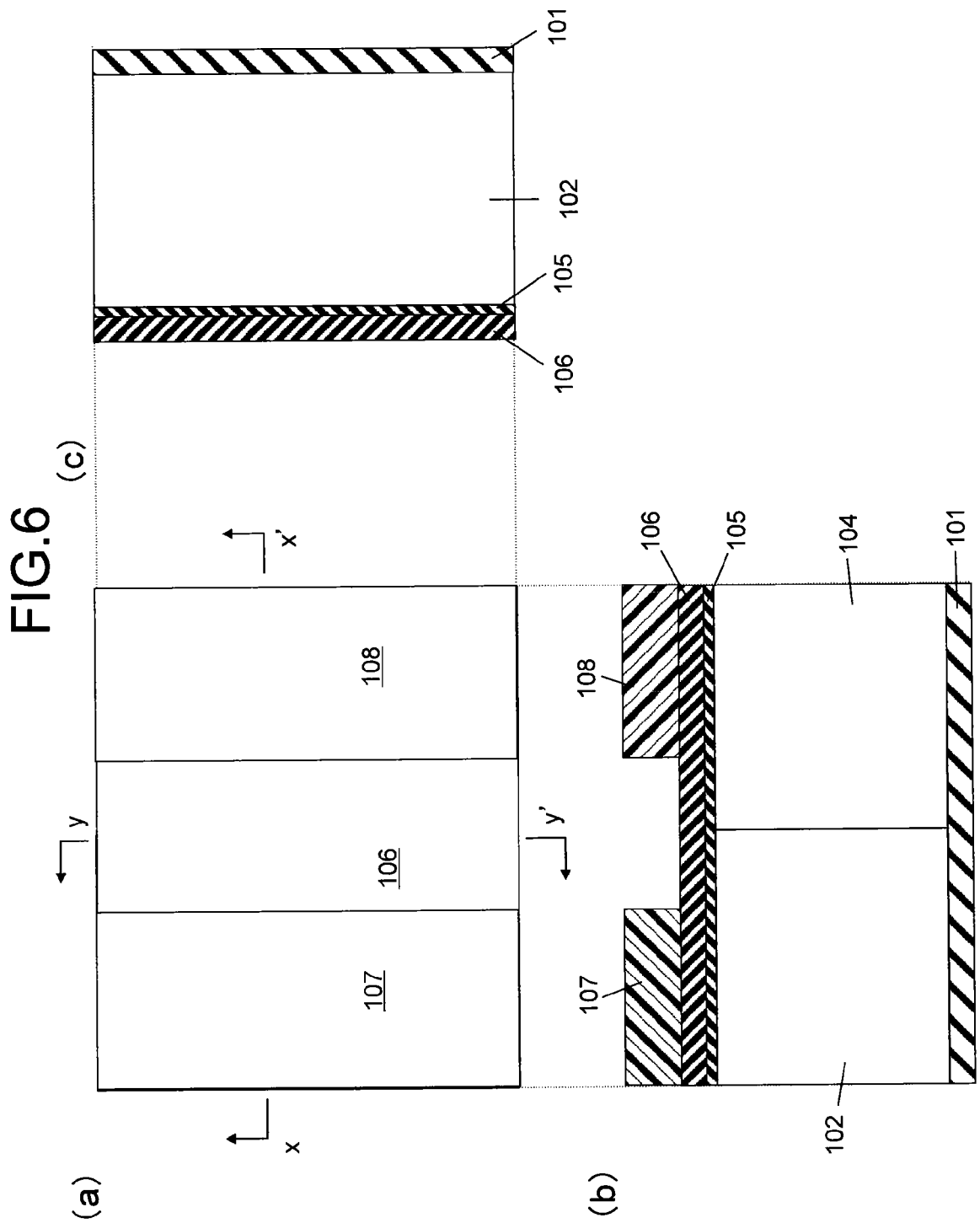
FIG. 6 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 6, resists 107, 108 for etching the nitride film 106 are formed on a predetermined area of the nitride film 106.

With reference to FIG. 7, the nitride film 106 and the oxide film 105 are etched by using the resists 107, 108 as masks, thereby separating those films into nitride films 109, 110 and oxide films 111, 112, respectively.

Figure 8:
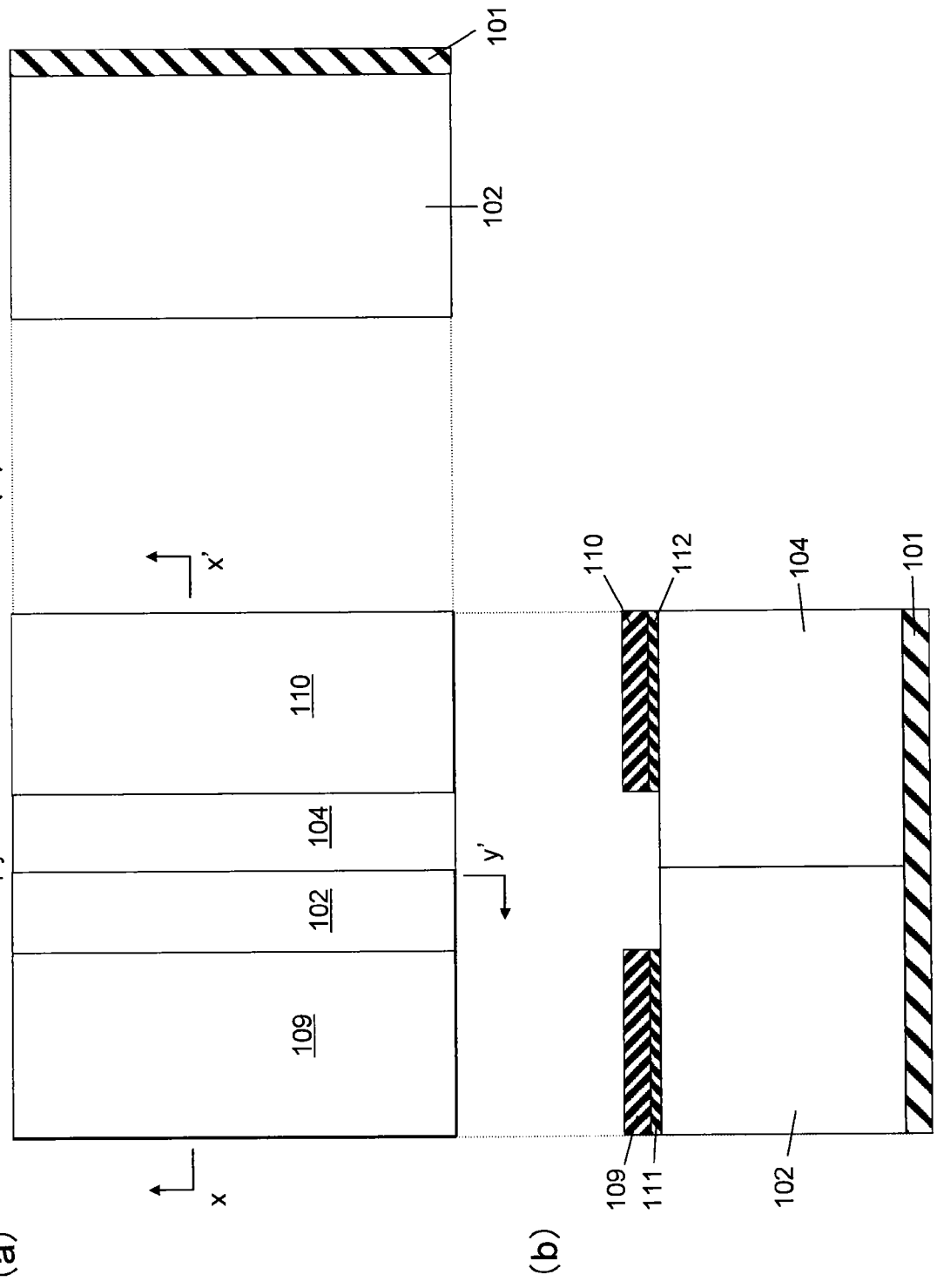
FIG. 8 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 8, the resists 107, 108 are peeled.

Figure 9:
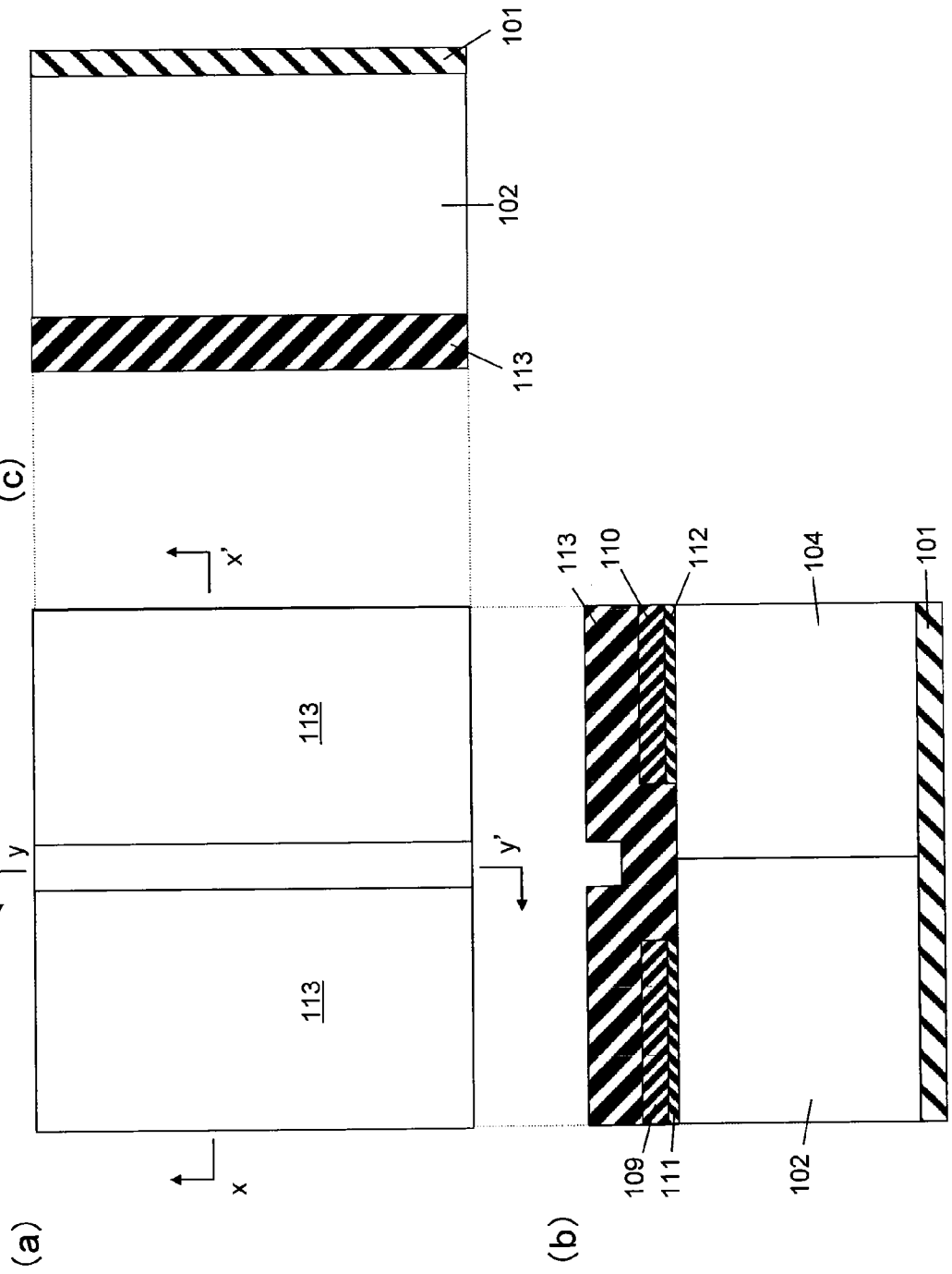
FIG. 9 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 9, a nitride film 113 is deposited on the silicon layers 102, 104 so as to cover the nitride films 109, 110 and the oxide films 111, 112. A recess for forming nitride-film sidewalls 114, 115 is formed at a predetermined portion of the nitride film 113.

Figure 10:
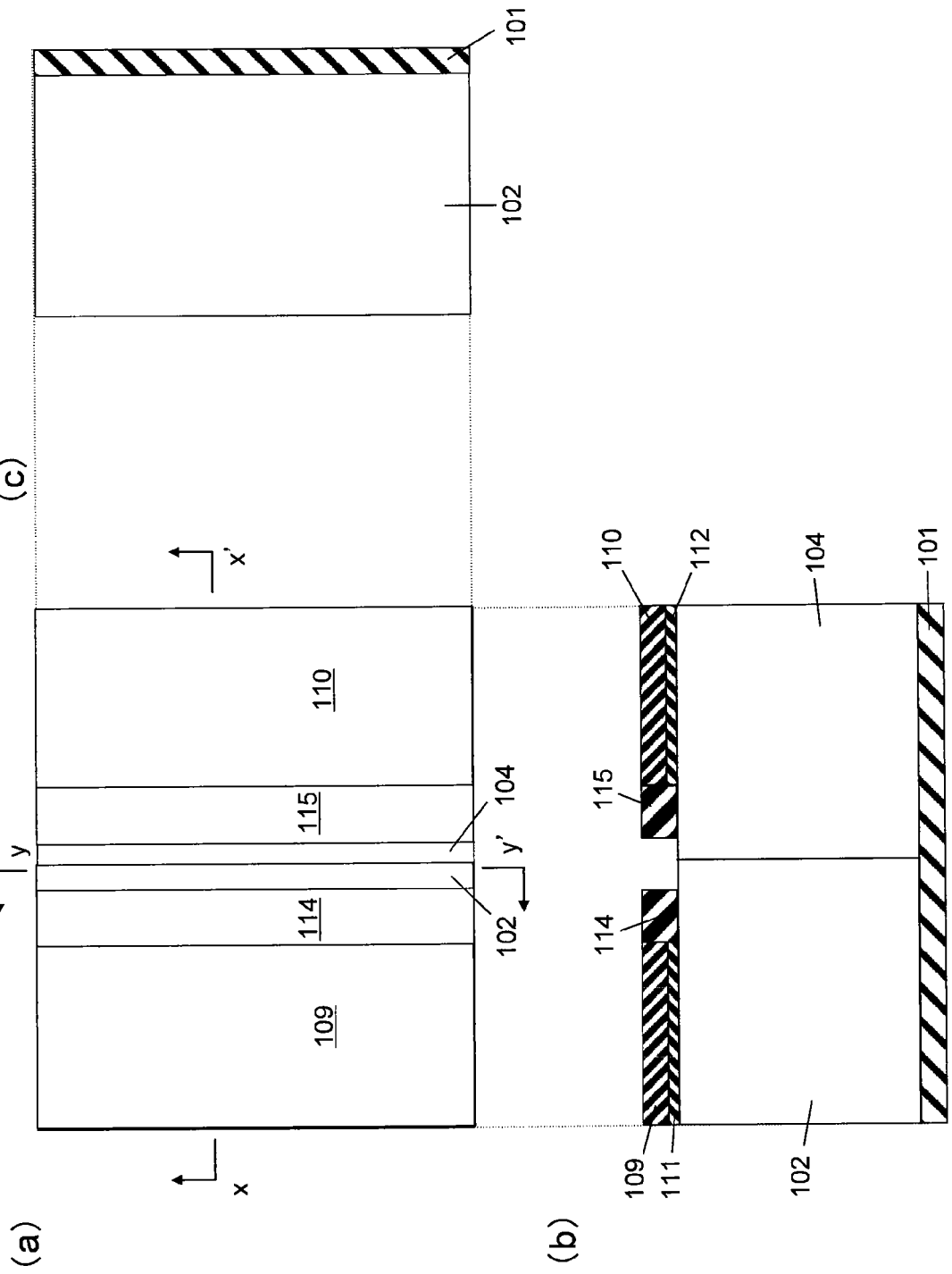
FIG. 10 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 10, the nitride film 113 is subjected to etch-back up to a predetermined depth, thereby forming the nitride-film sidewalls 114, 115 between the nitride films 109, 110 and between the oxide films 111, 112.

Figure 11:
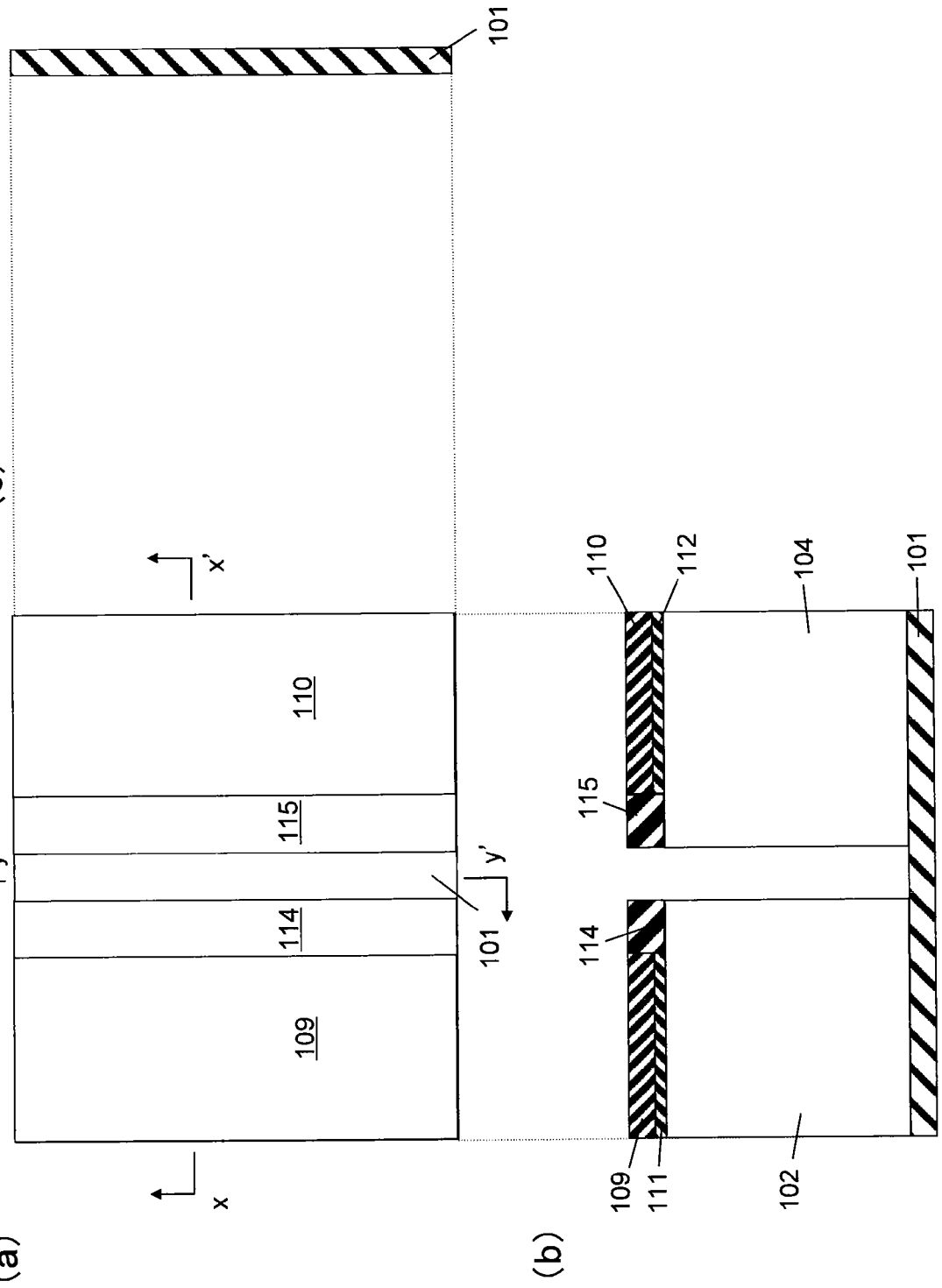
FIG. 11 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 11, the silicones 102, 104 are etched by using the nitride-film sidewalls 114, 115 as masks to form a groove reaching the oxide film 101.

Figure 12:
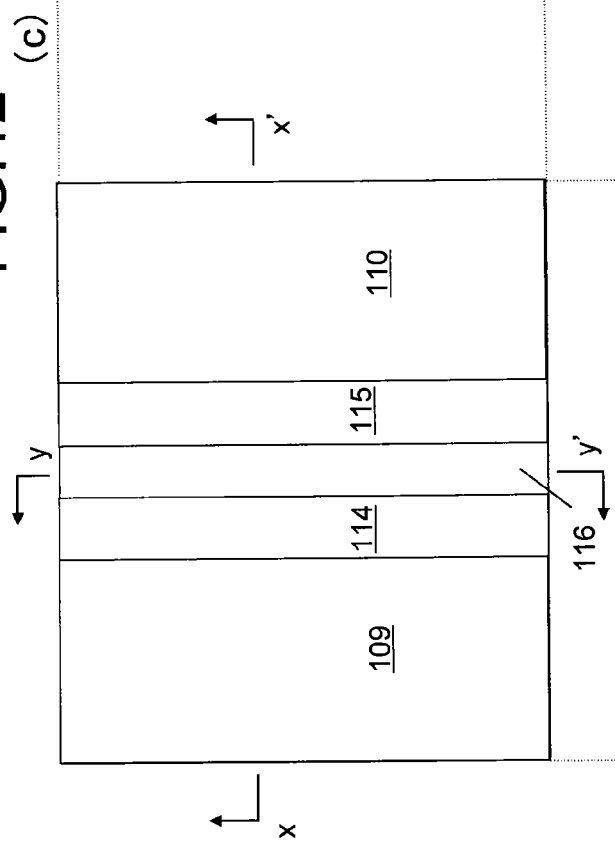
FIG. 12 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 12, the first oxide film 116 is deposited in the groove and planarized by CMP (Chemical Mechanical Polishing).

Figure 13:
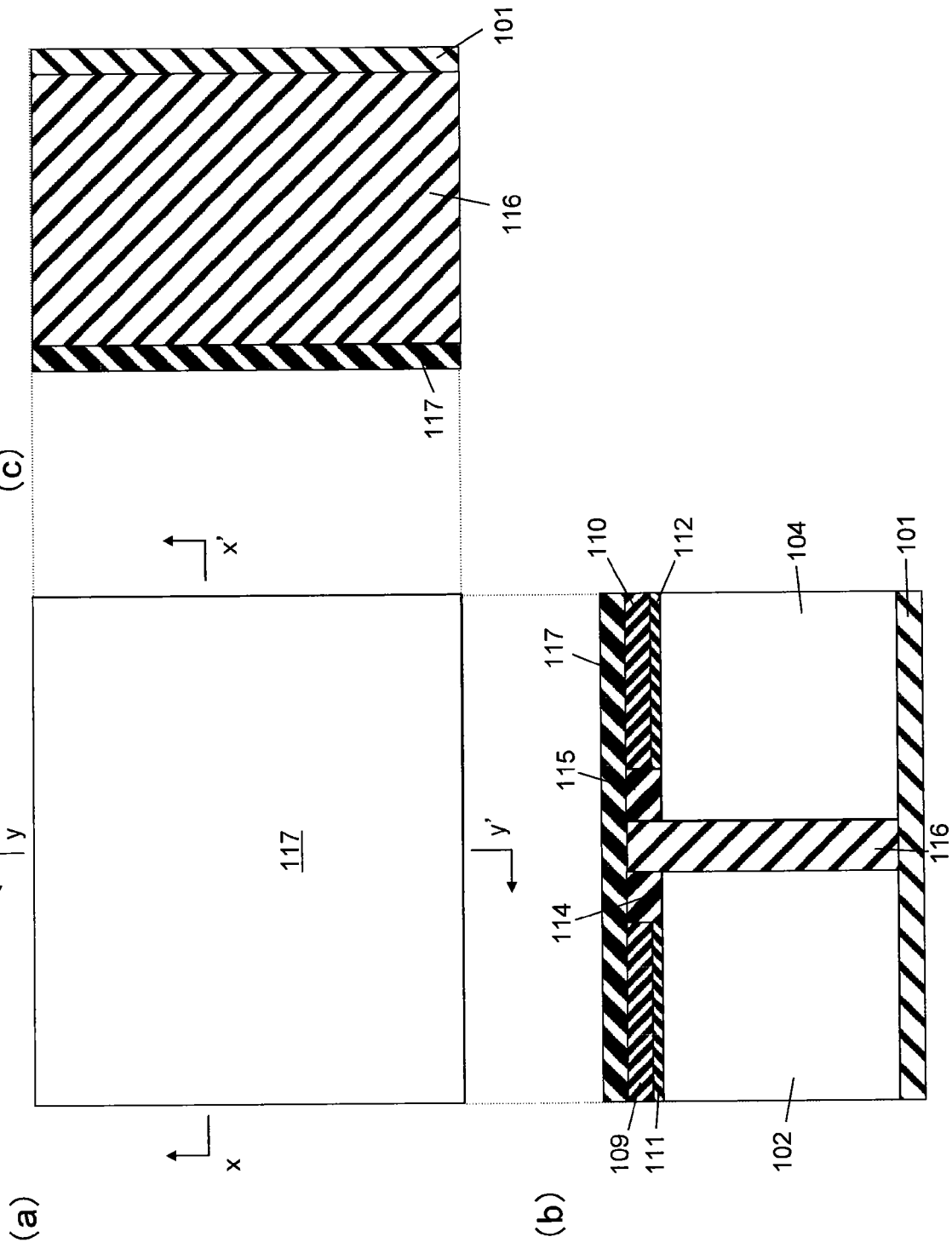
FIG. 13 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 13, a nitride film 117 is deposited on the plane.

Figure 14:
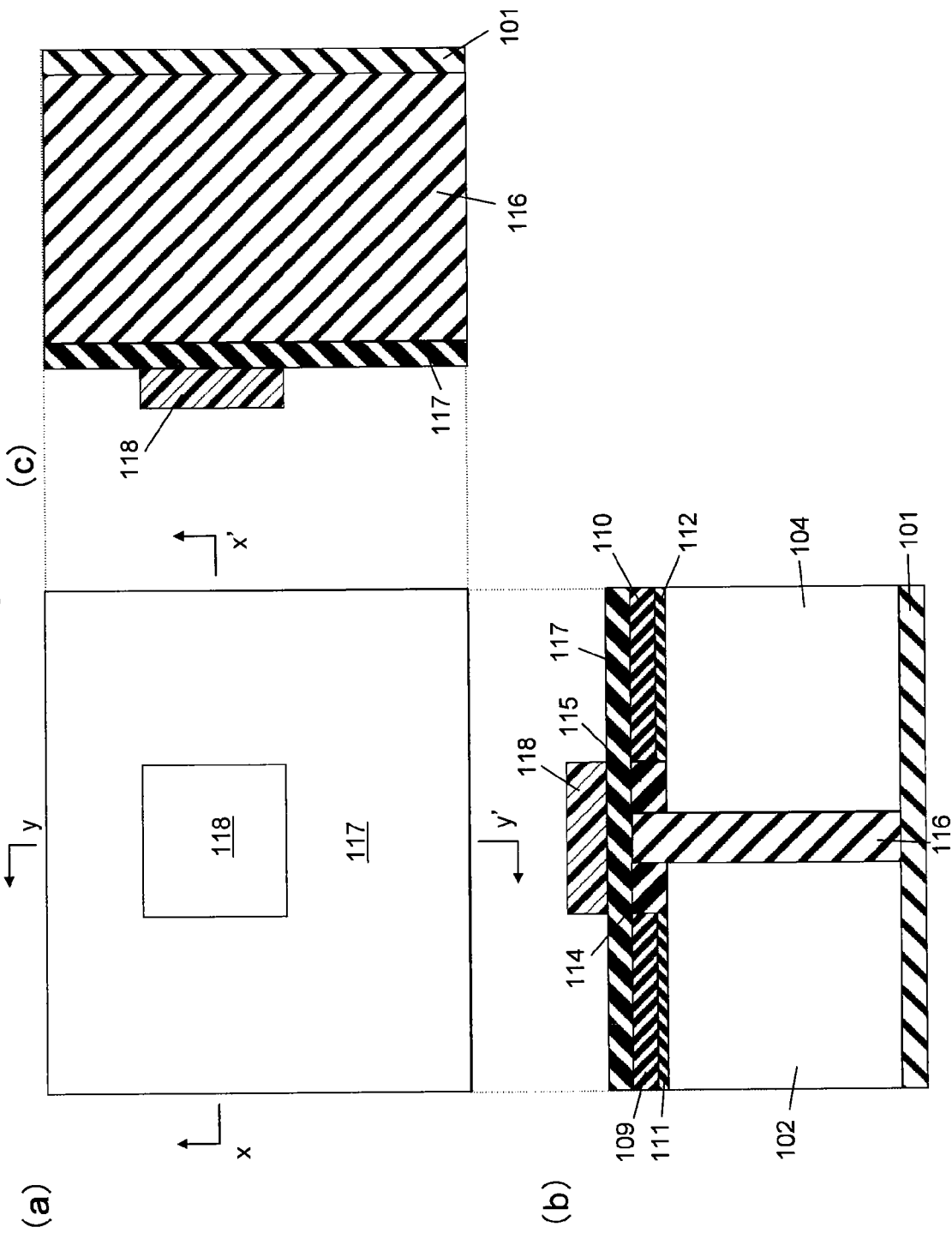
FIG. 14 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 14, a quadrangular resist 118 for forming a columnar structural body which will configure a MOS transistor is formed on a predetermined position of the nitride film 117.

Figure 15:
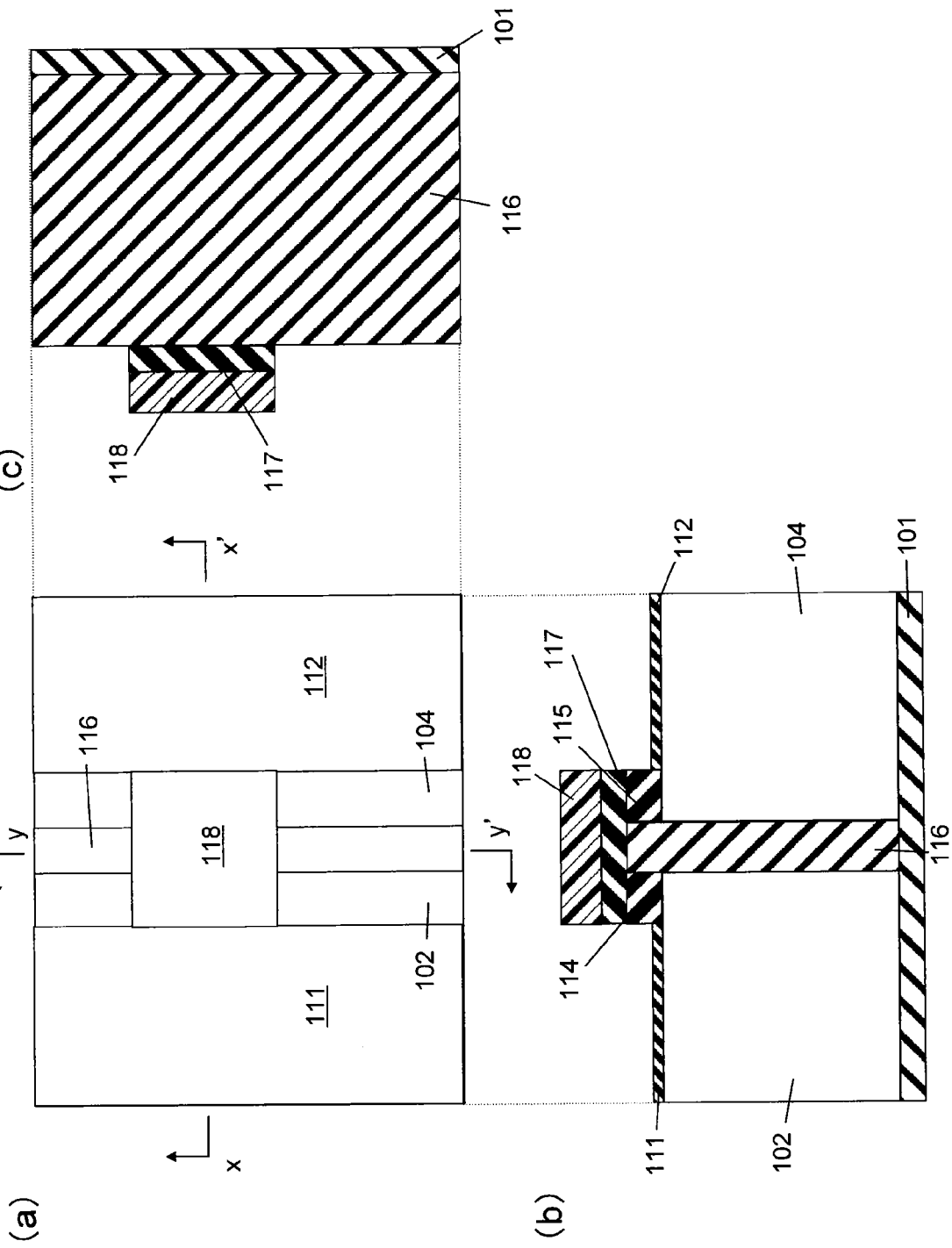
FIG. 15 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 15, the nitride films 117, 109 are etched by using the resist 118 as a mask. At this time, the oxide films 111, 112 and respective pieces of the nitride-film sidewalls 114, 115 are left on the silicon layers 102, 104.

Figure 16:
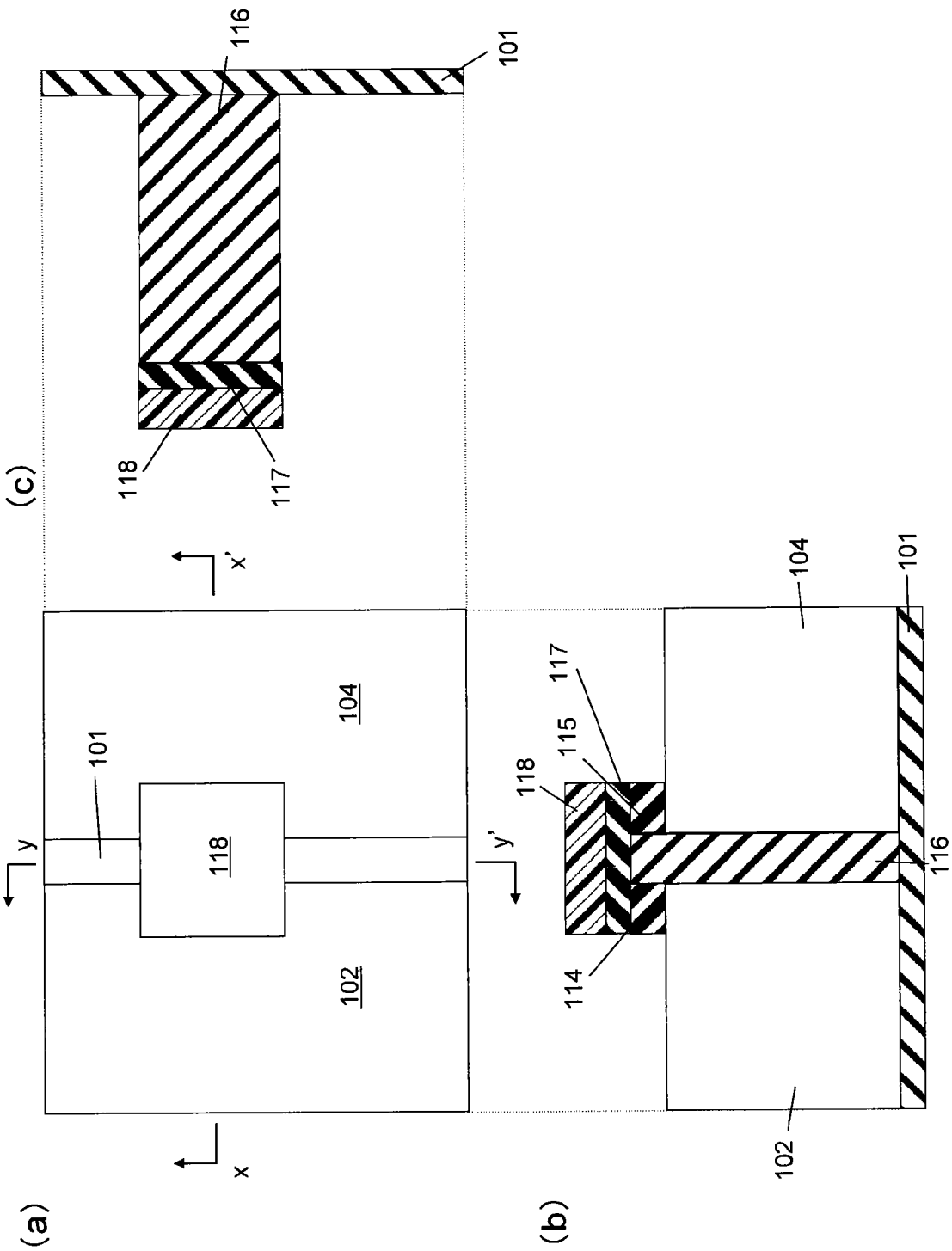
FIG. 16 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 16, the oxide films 111, 112 on the silicon layers 102, 104 are etched and eliminated.

Figure 17:
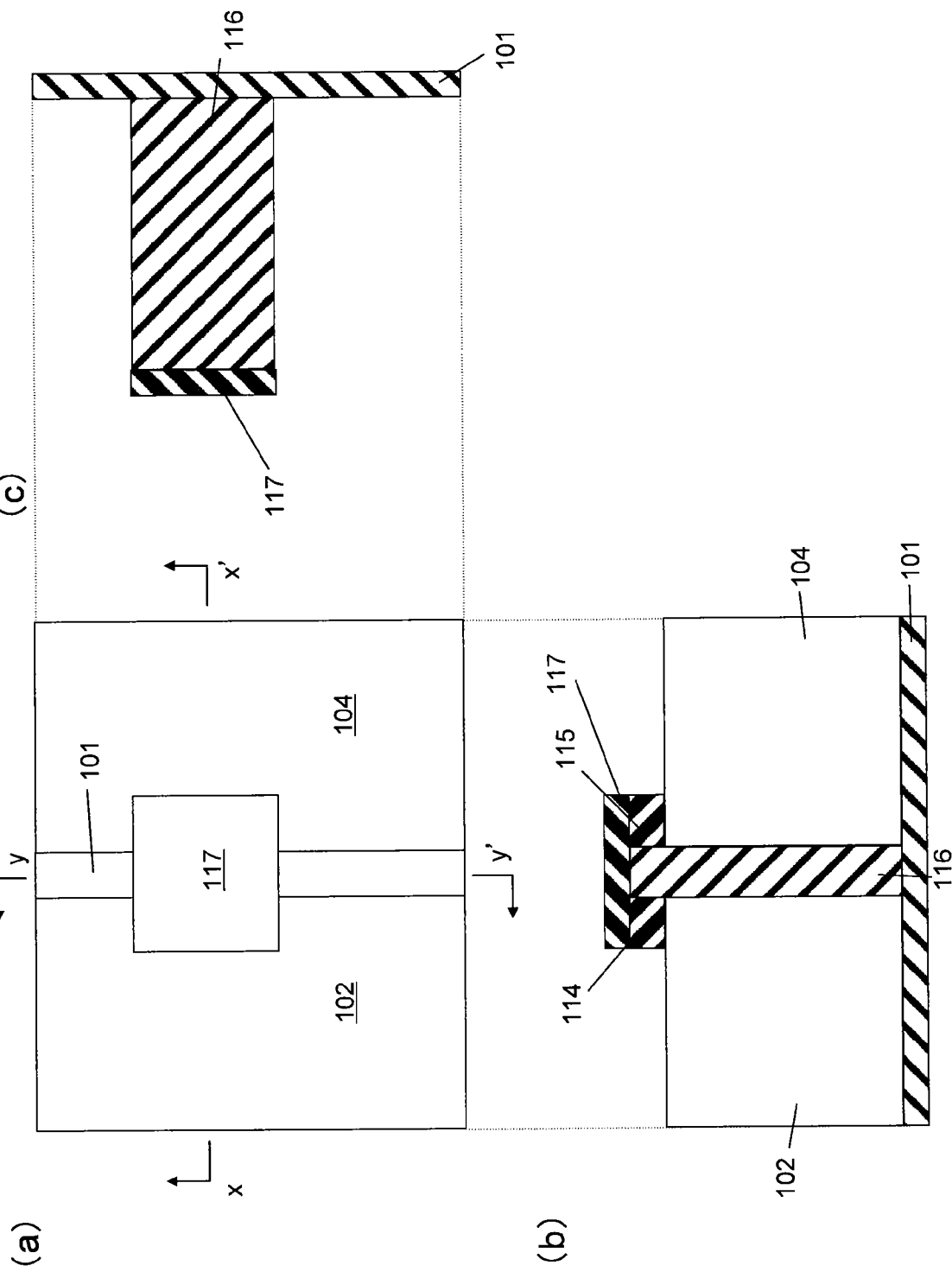
FIG. 17 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 17, the resist 118 is peeled.

Figure 18:
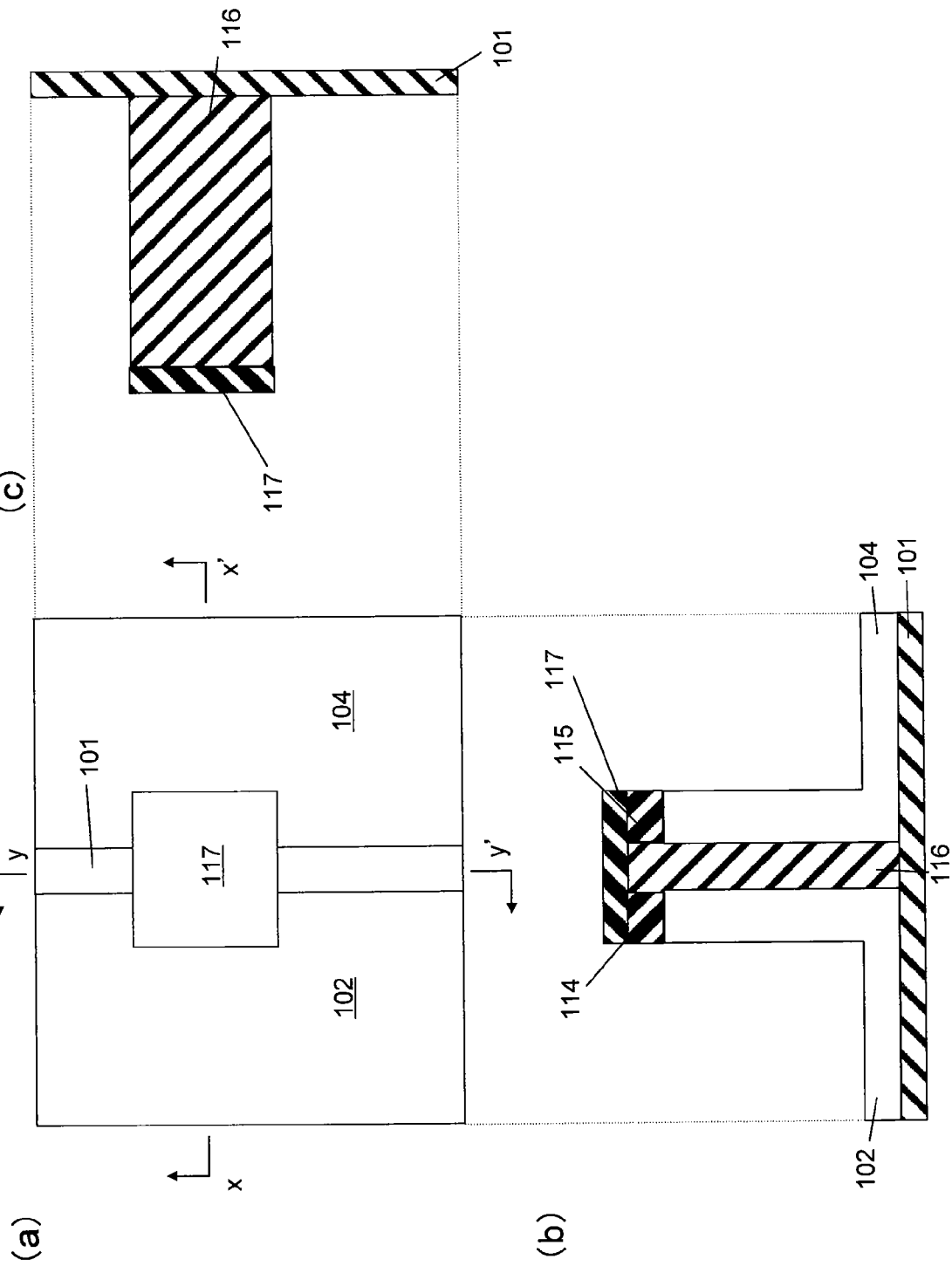
FIG. 18 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 18, the silicon layers 102, 104 are etched so as to be left on the oxide film 101 with a predetermined thickness, thereby forming a column having the silicon layers 102, 104.

Figure 19:
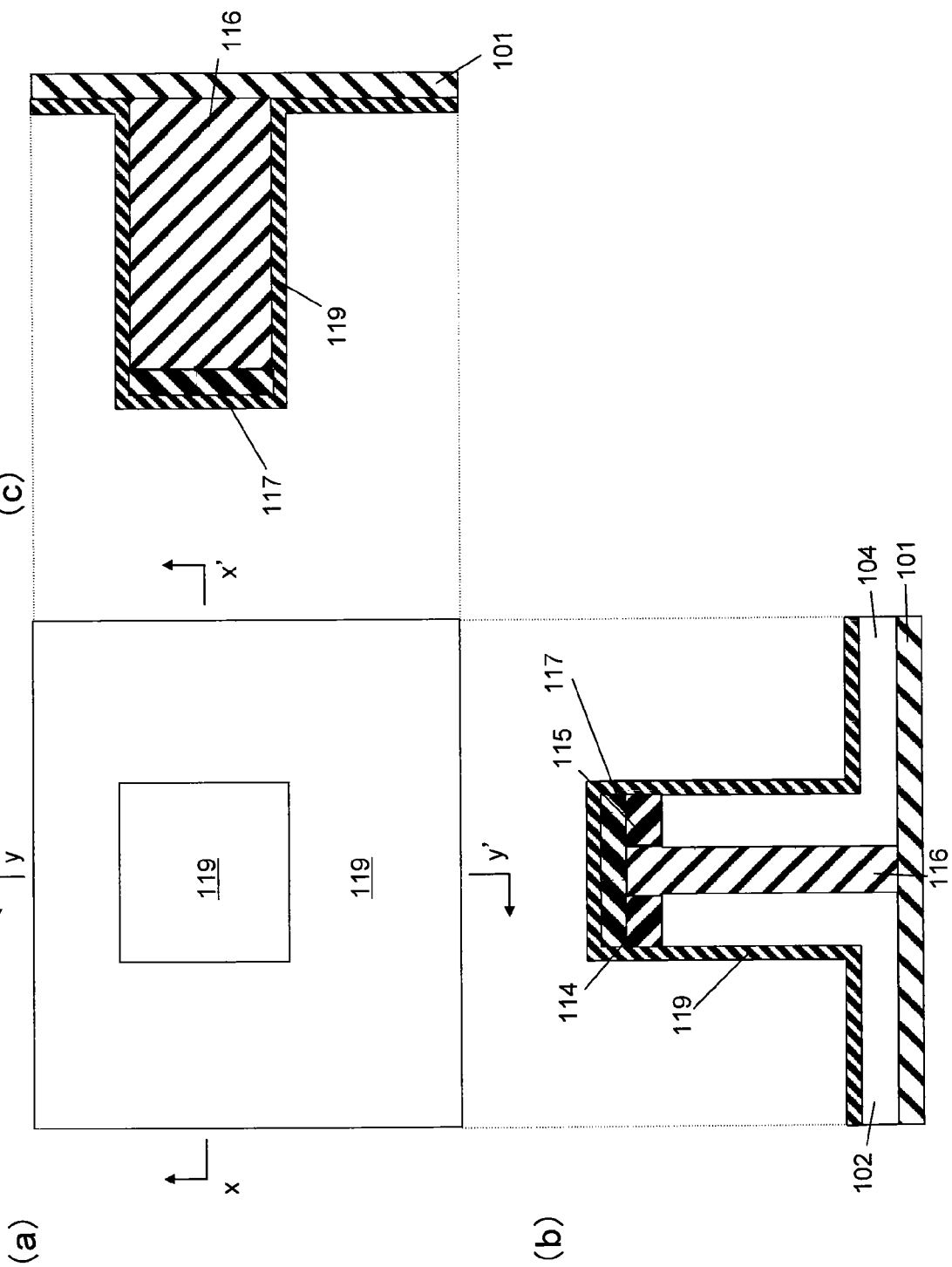
FIG. 19 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 19, an oxide film 119 is deposited so as to thinly cover the surface of the structural body including the column with the silicon layers 102, 104 at a uniform thickness.

Figure 20:
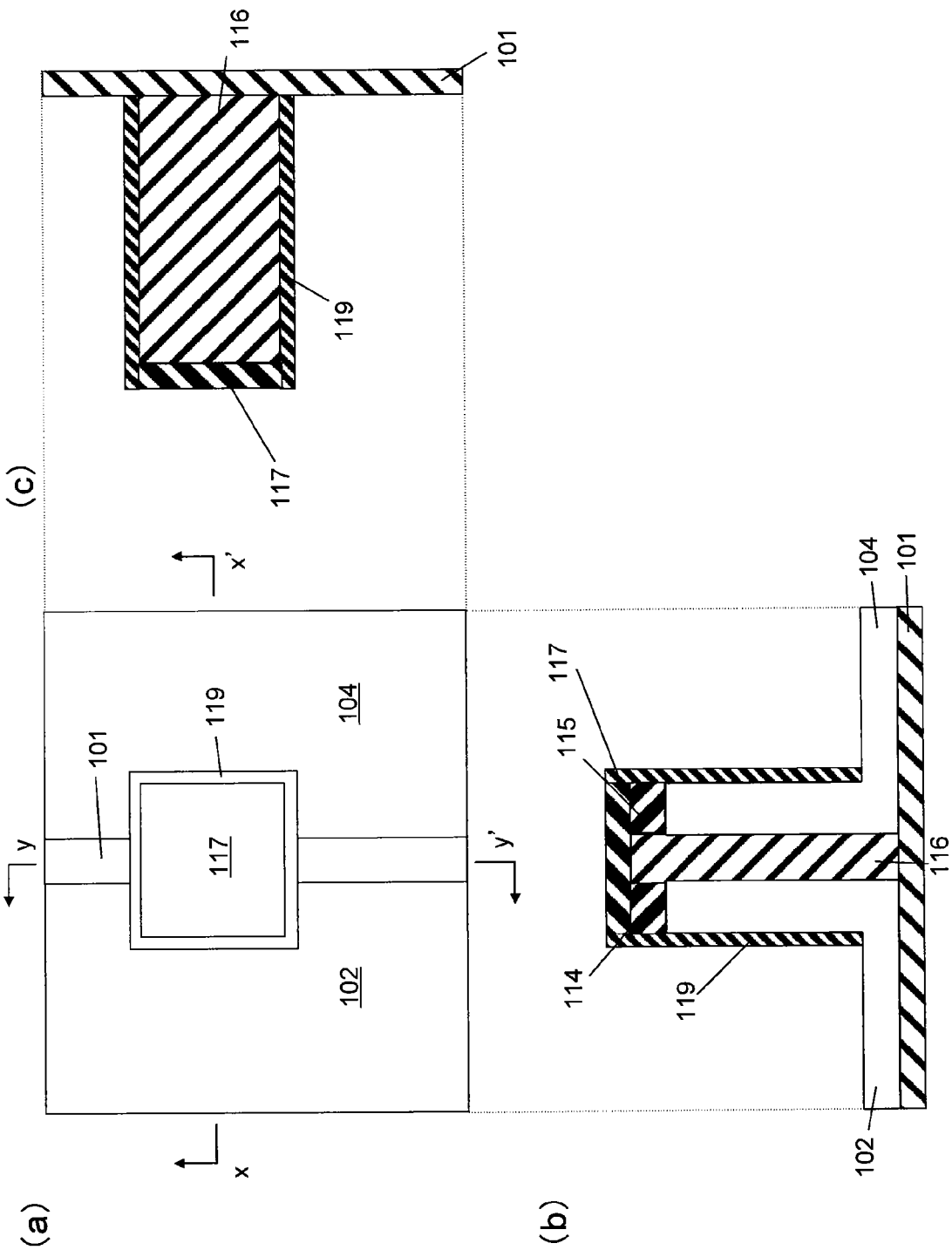
FIG. 20 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 20, the oxide film 119 is etched so as to be left in a sidewall-like shape at sidewalls of the column having the silicon layers 102, 104.

Figure 21:
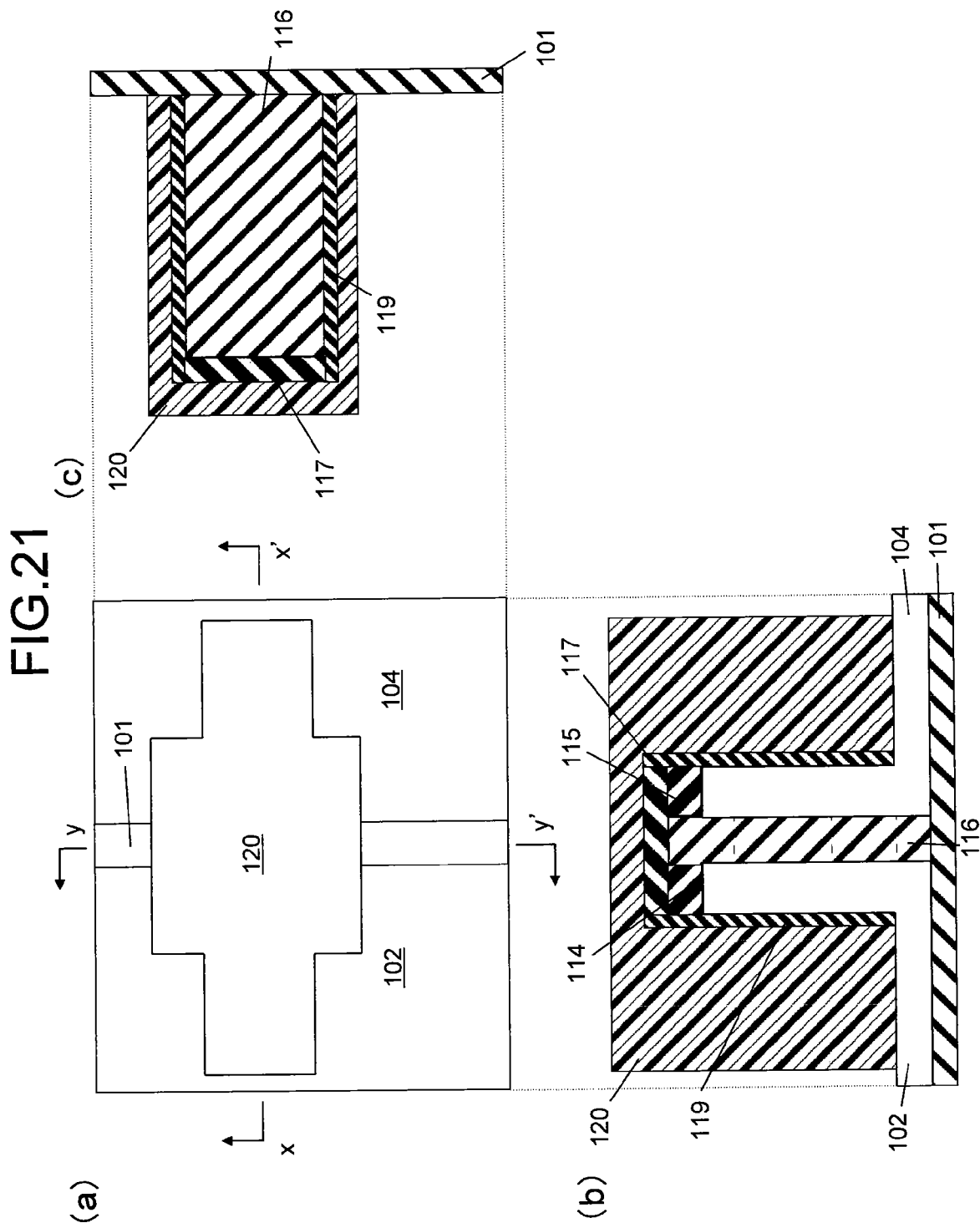
FIG. 21 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 21, a resist 120 for element isolation is formed on the silicon layers 102, 104 so as to cover the column having the silicon layers 102, 104.

Figure 22:
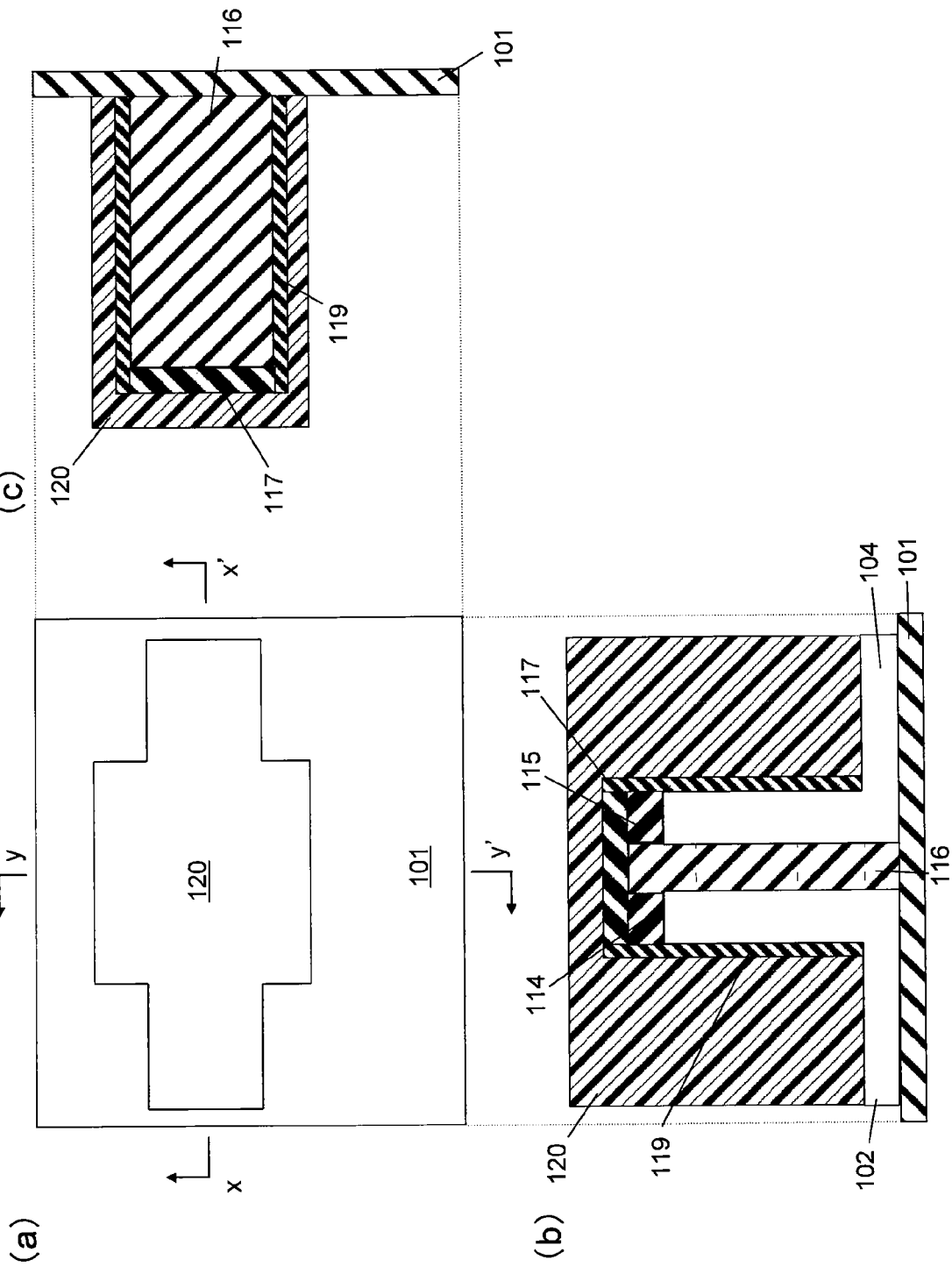
FIG. 22 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 22, the silicon layers 102, 104 are etched by using the resist 120 as a mask to carry out element isolation over the oxide film 101.

Figure 23:
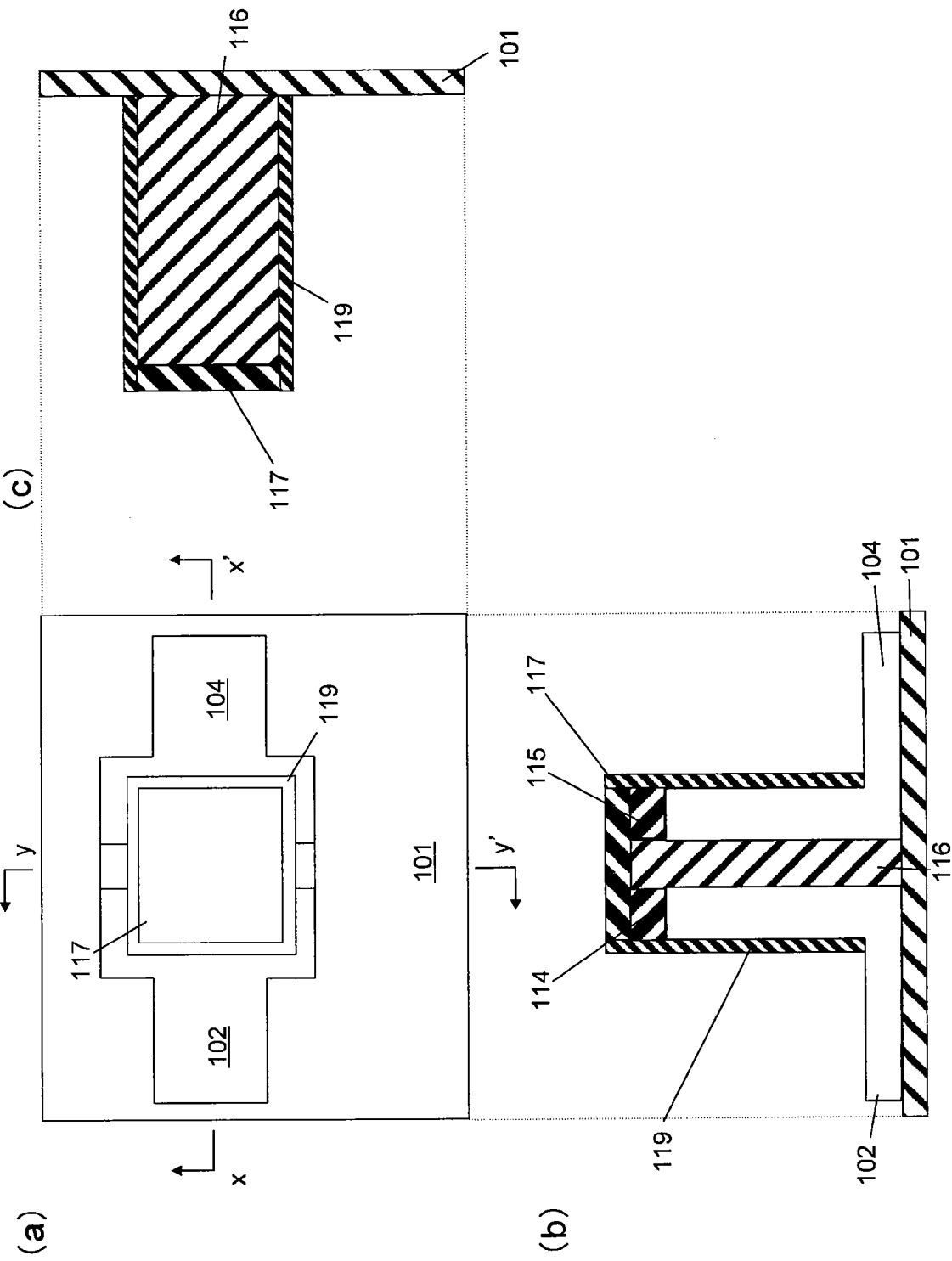
FIG. 23 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 23, the resist 120 is peeled.

Figure 24:
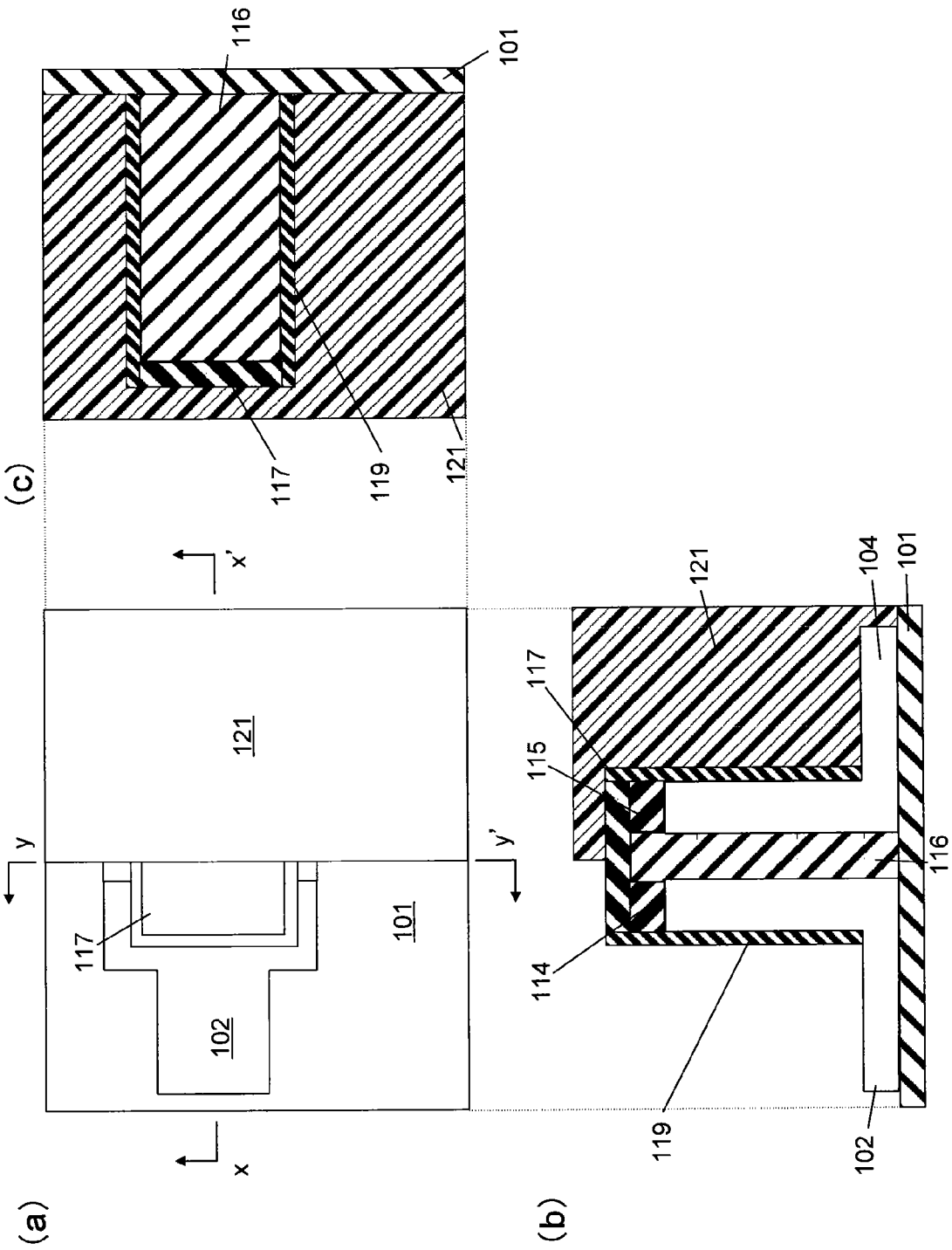
FIG. 24 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 24, a resist 121 for introducing dopants over the oxide film 101 is formed so as to cover the right part of the column having the silicon layers 102, 104 and the silicon layer 104.

Figure 25:
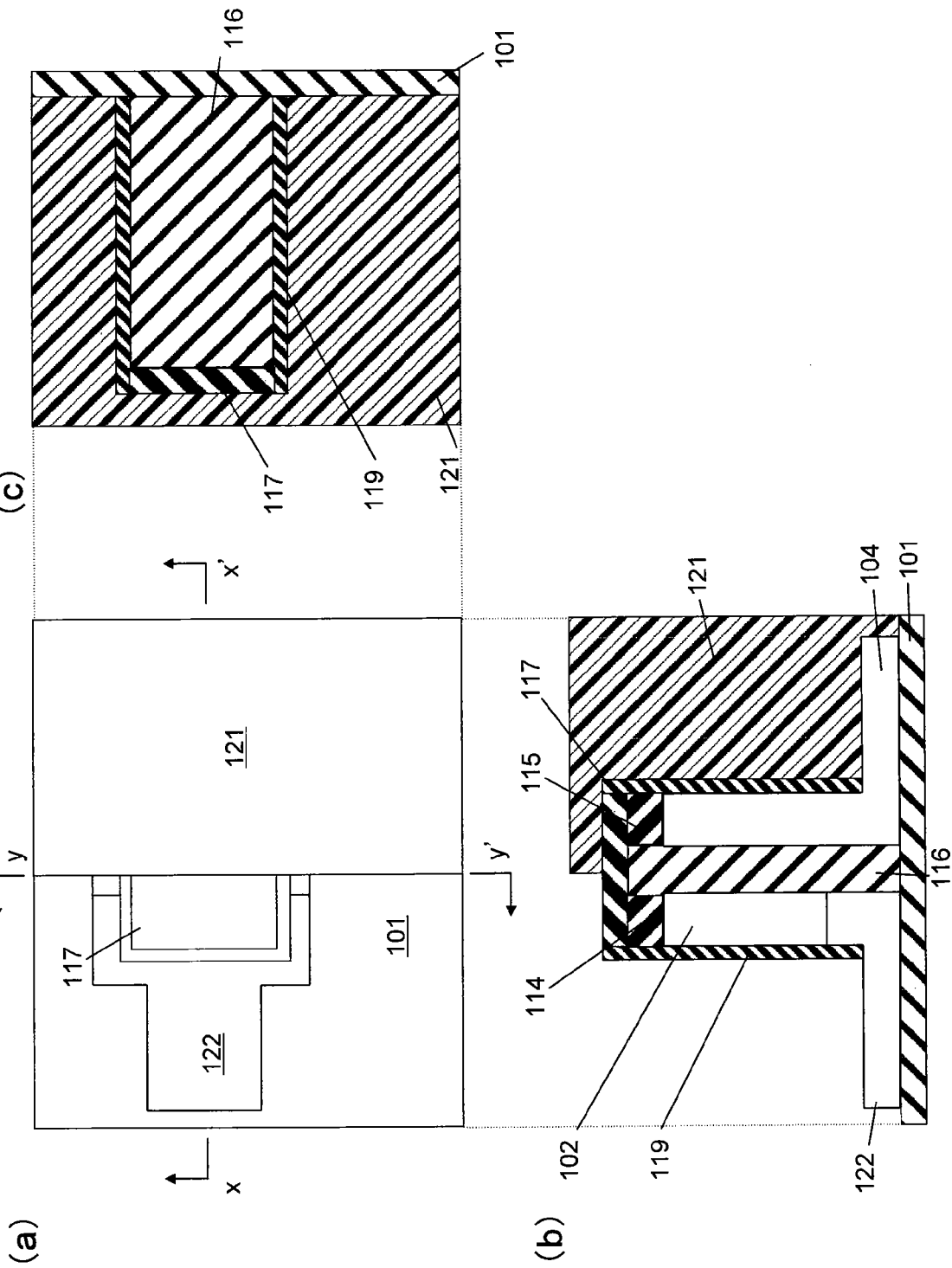
FIG. 25 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 25, dopants like phosphorous are doped in the silicon layer 102 by using the resist 121 as a mask, and the silicon layer 122 containing n-type high-concentration dopants is formed at the left part of the column having the silicon layers 102, 104.

Figure 26:
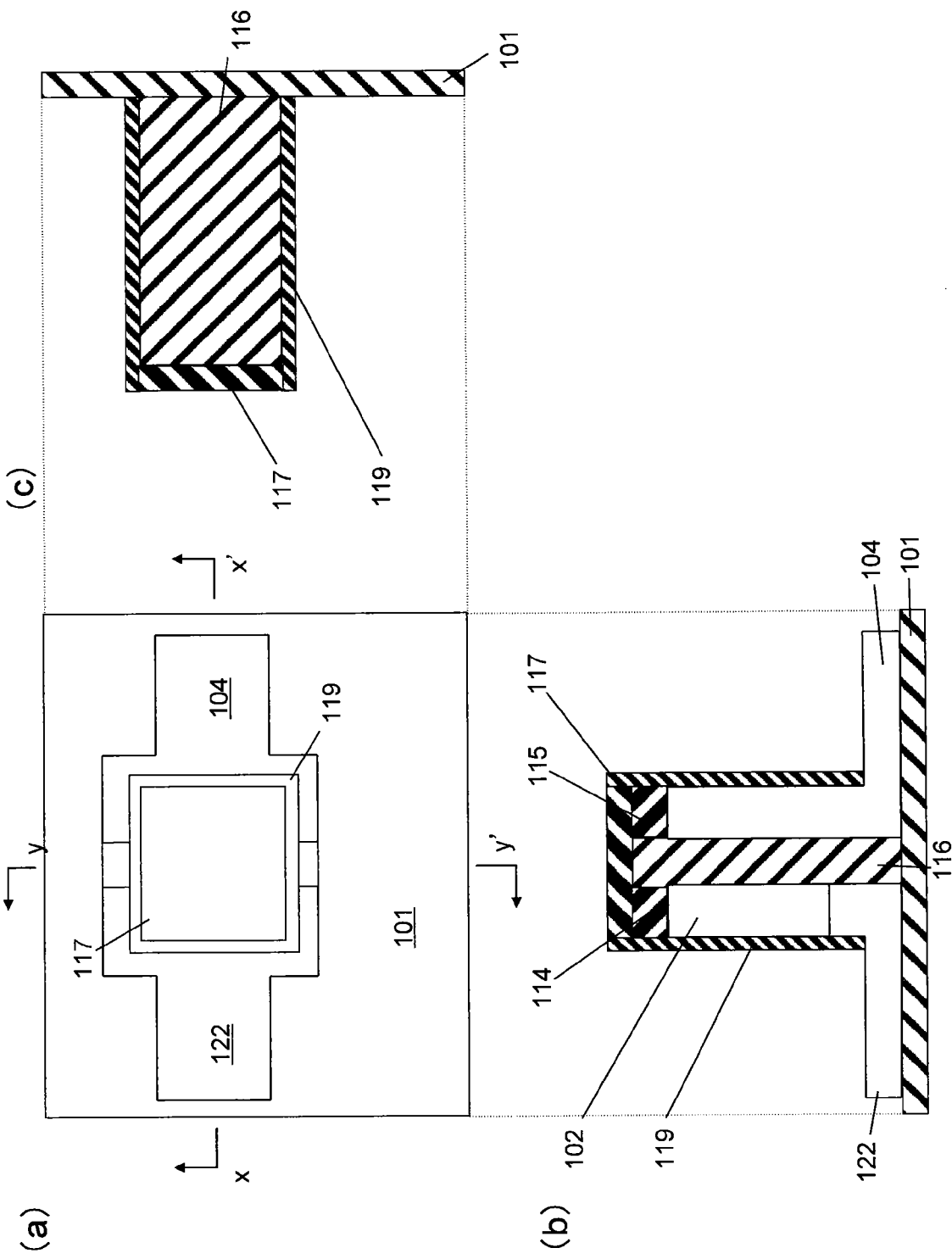
FIG. 26 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 26, the resist 121 is peeled.

Figure 27:
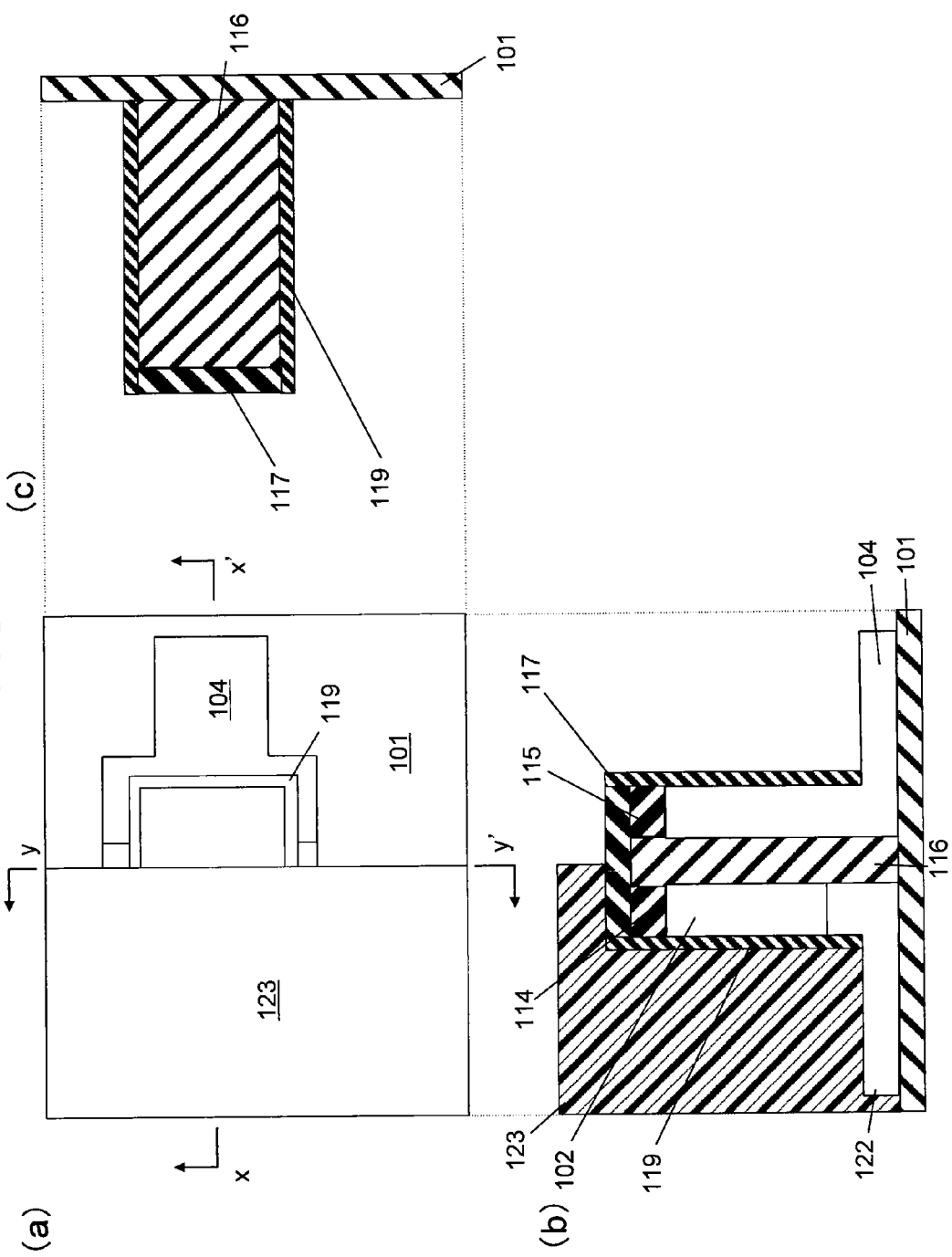
FIG. 27 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 27, a resist 123 for introducing dopants over the oxide film 101 is formed so as to cover the left part of the column having the silicon layers 102, 104 and the silicon layer 122.

Figure 28:
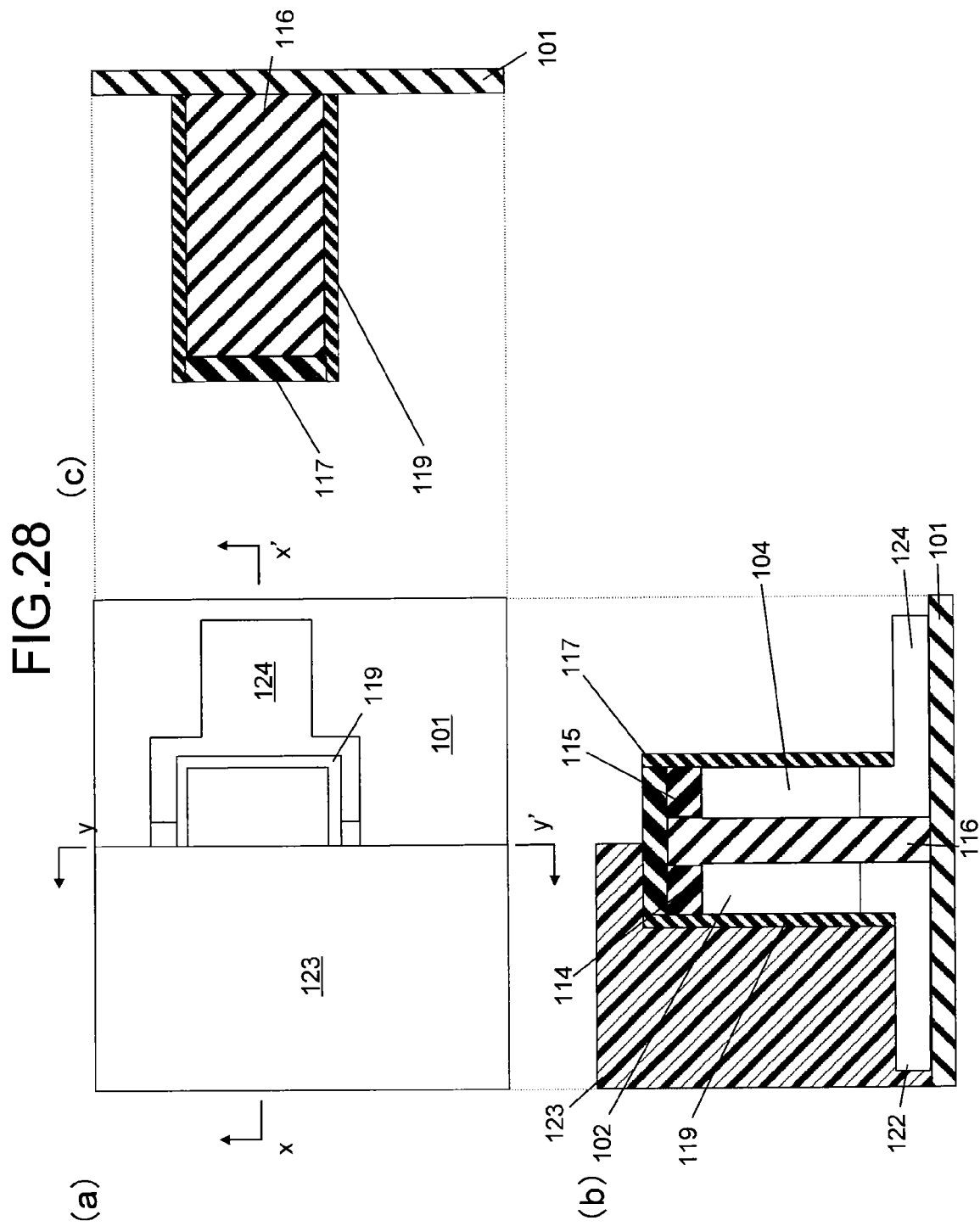
FIG. 28 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 28, dopants like arsenic are doped in the silicon layer 104 by using the resist 123 as a mask, and the silicon layer 124 containing p-type high-concentration dopants is formed at the right part of the column having the silicon layers 102, 104.

Figure 29:
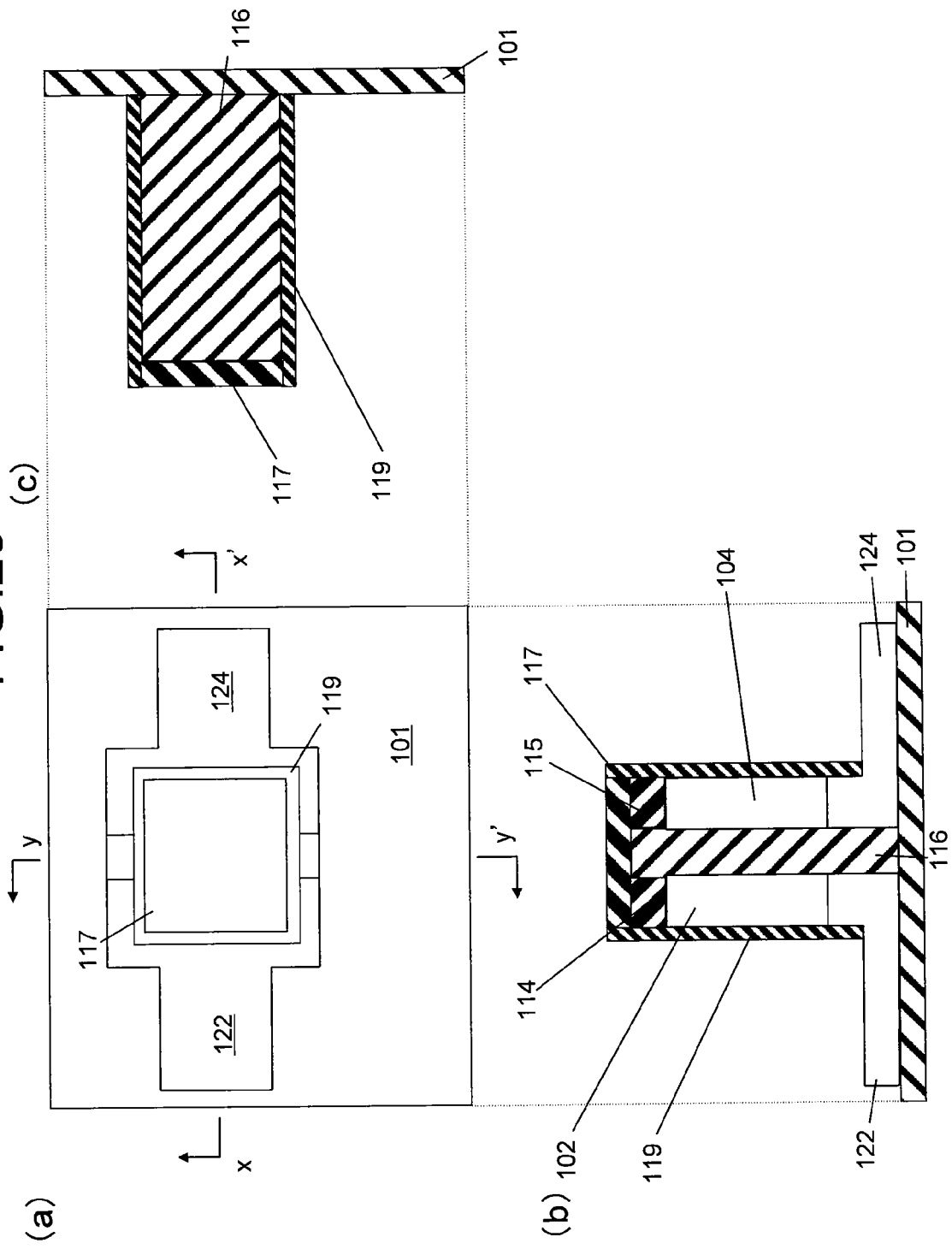
FIG. 29 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 29, the resist 123 is peeled.

Figure 30:
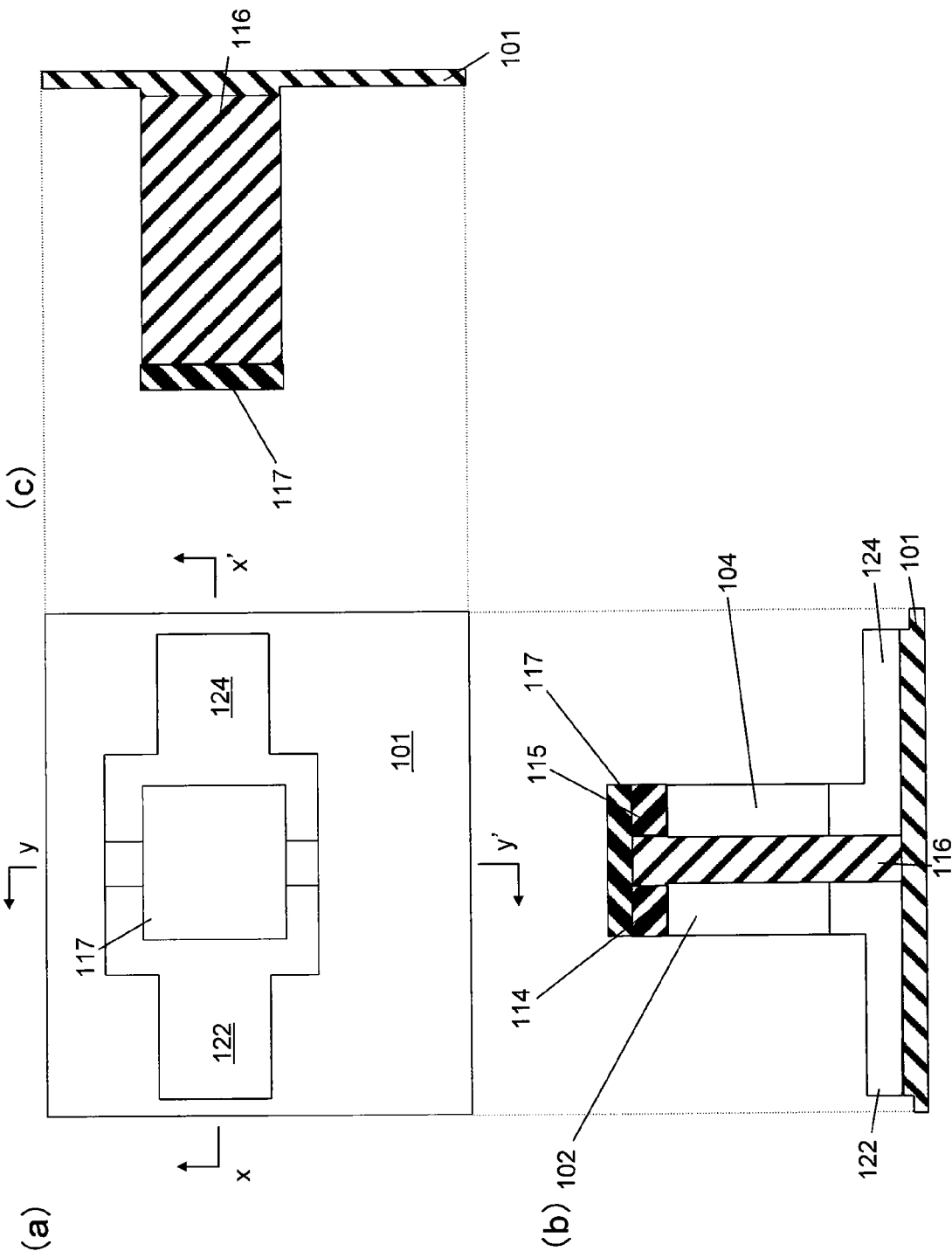
FIG. 30 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 30, the oxide film 119 formed at the side wall of the column having the silicon layers 102, 104 is etched and eliminated.

Figure 31:
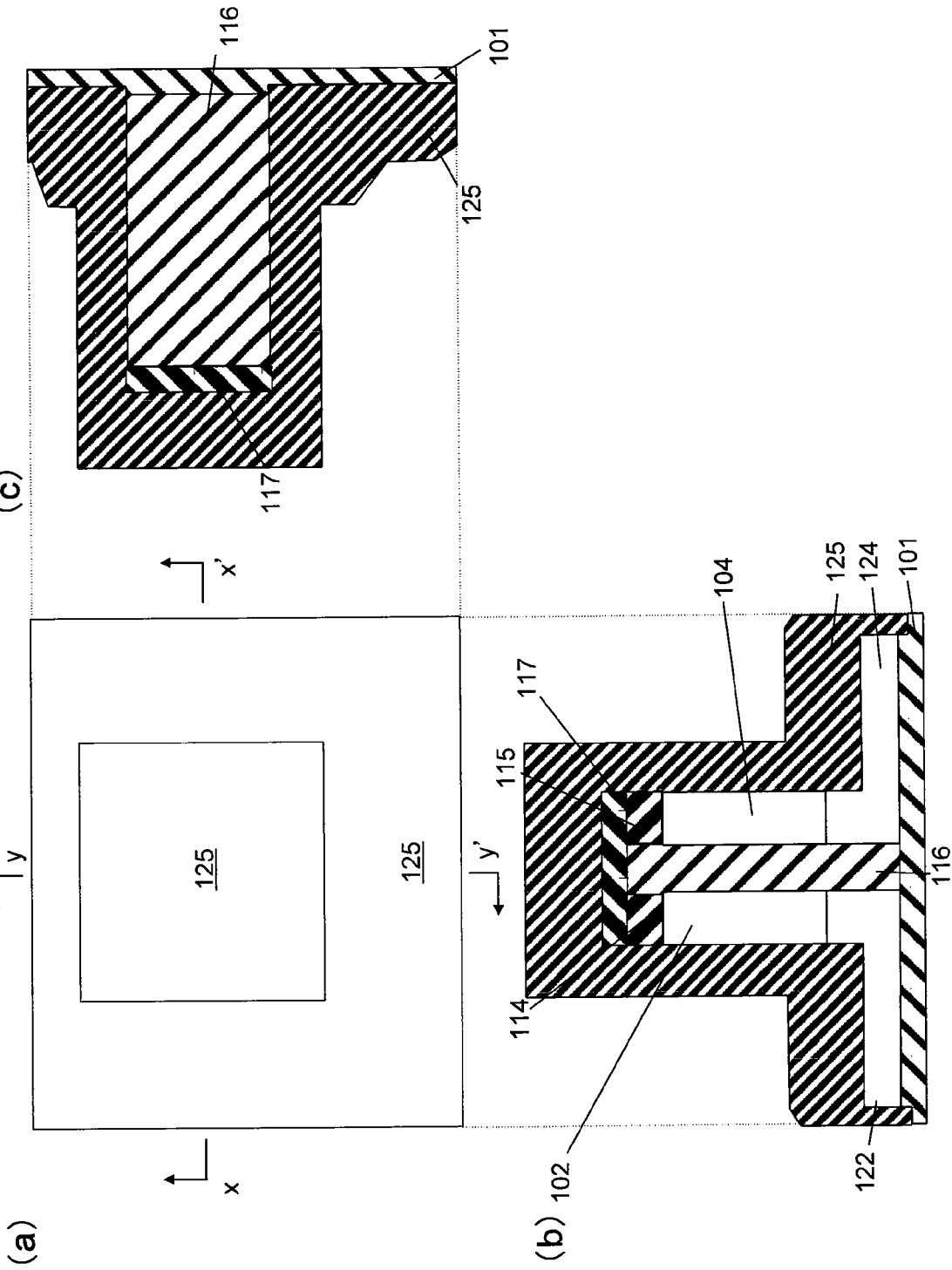
FIG. 31 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 31, an oxide film 125 is deposited over the oxide film 101 so as to cover the column having the silicon layers 102, 104 and the silicon layers 122, 124.

Figure 32:
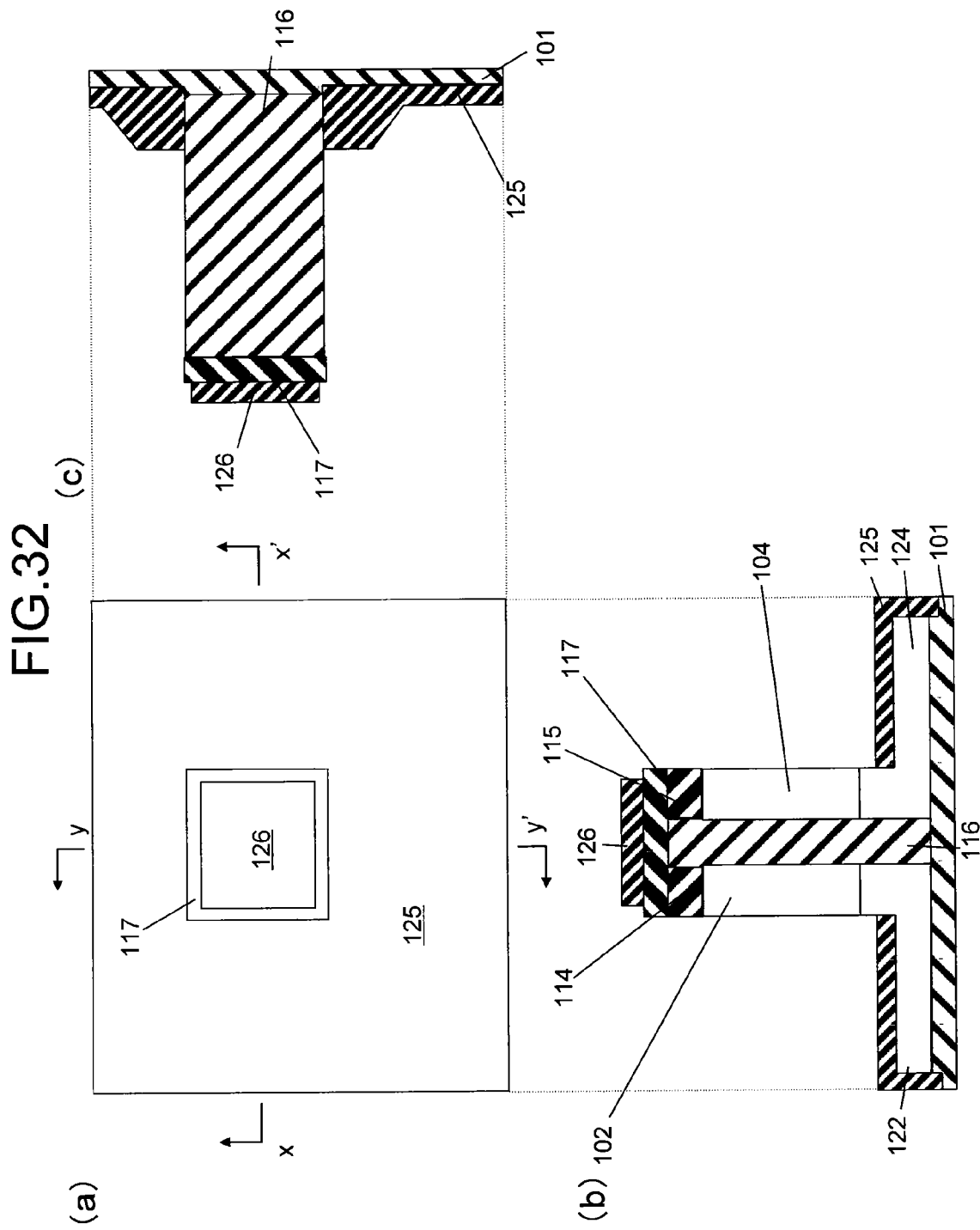
FIG. 32 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 32, the oxide film 125 is subjected to etch-back up to a predetermined depth. At this time, an oxide film 126 is caused to be left on the nitride film 117.

Figure 33:
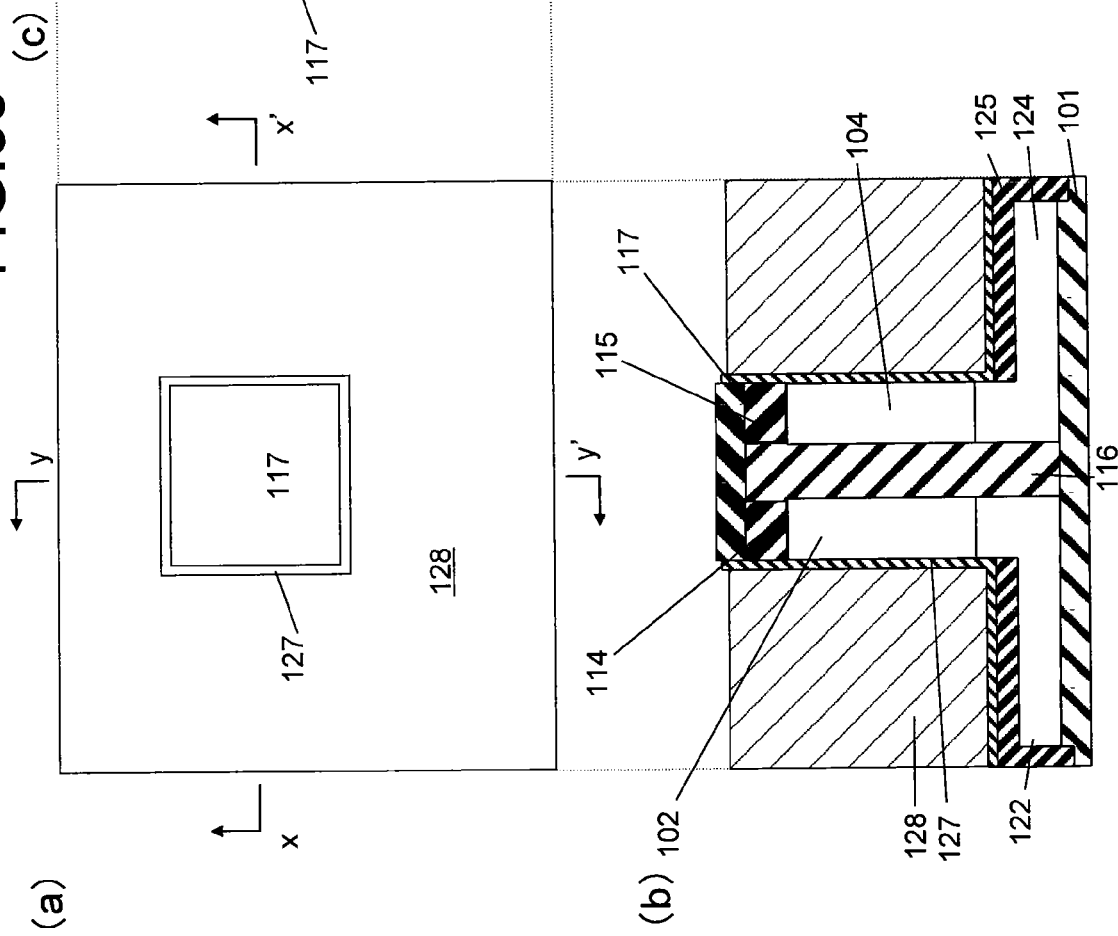
FIG. 33 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 33, a high-dielectric film 127 which will be the gate insulating film is thinly deposited on the oxide film 125 so as to cover the column having the silicon layers 102, 104 and the silicon layers 122, 124, and, the metal 128 which will be the gate electrode is deposited and planarized by CMP. In planarization, the oxide film 126 is etched and eliminated.

The gate insulating film 127 functions as a gate insulating film in both pMOS transistor and nMOS transistor each of which is an enhancement type in the semiconductor device of the present embodiment. Moreover, the gate electrode 128 is a gate electrode formed of a conducting material that allows each of the nMOS transistor and the pMOS transistor to be an enhancement type. Examples of such conducting material for forming the gate electrode are titanium, titanium nitride, tantalum, and tantalum nitride.

Figure 34:
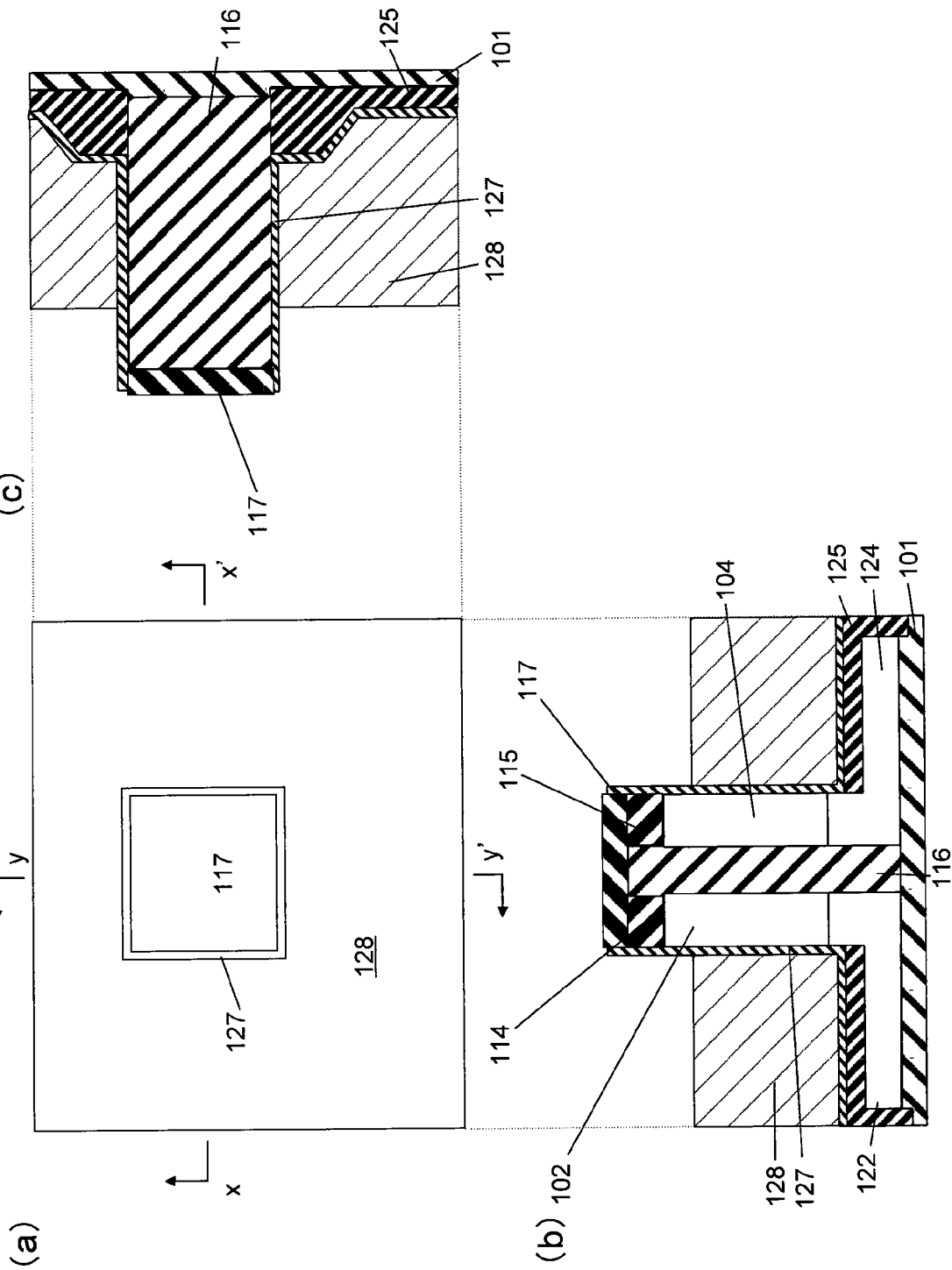
FIG. 34 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 34, the metal 128 around the column having the silicon layers 102, 104 is subjected to etch-back up to a predetermined depth.

Figure 35:
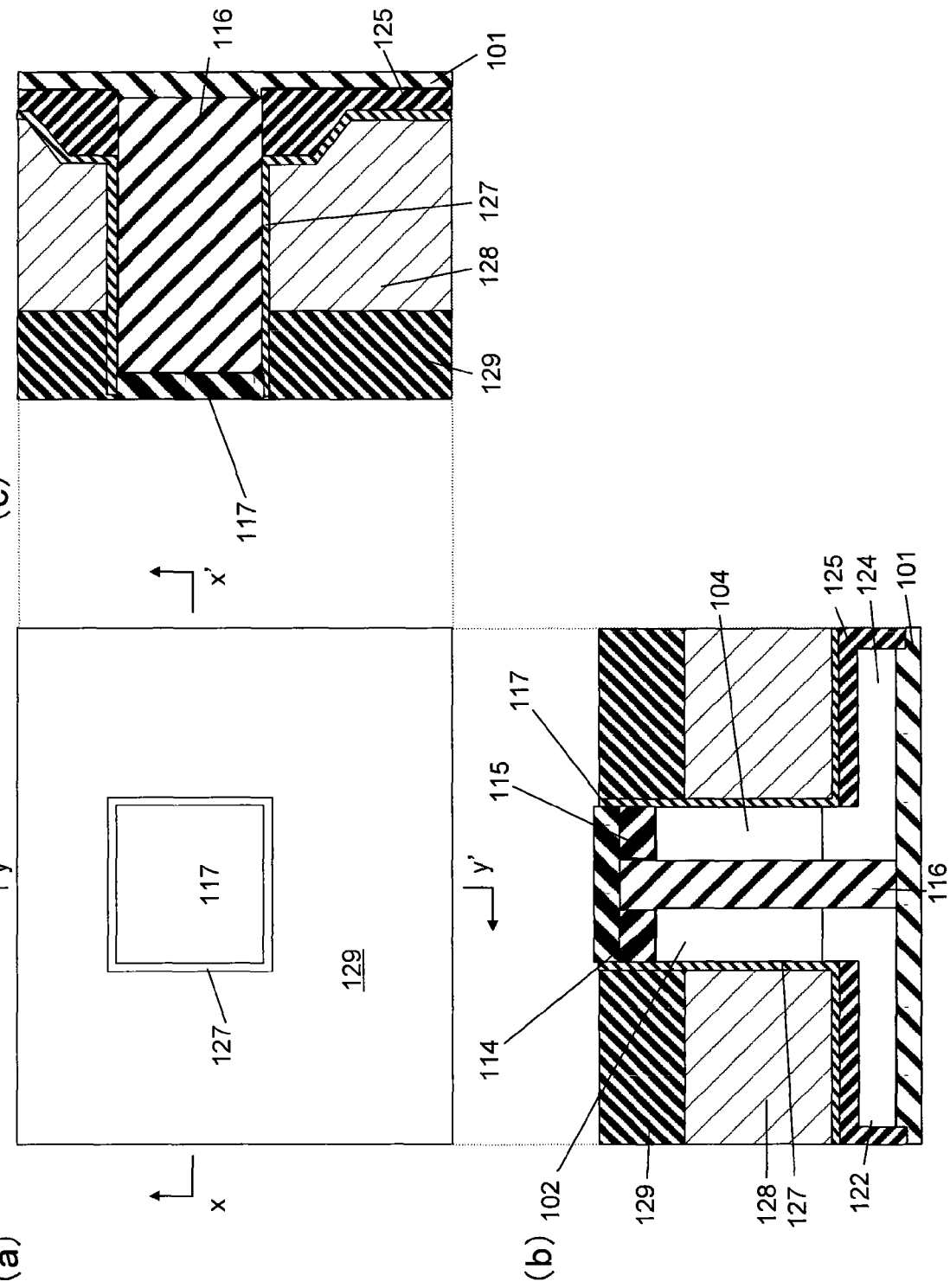
FIG. 35 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 35, an oxide film 129 is deposited on the metal 128 so as to surround the periphery of the column having the silicon layers 102, 104 and planarized by CMP.

Figure 36:
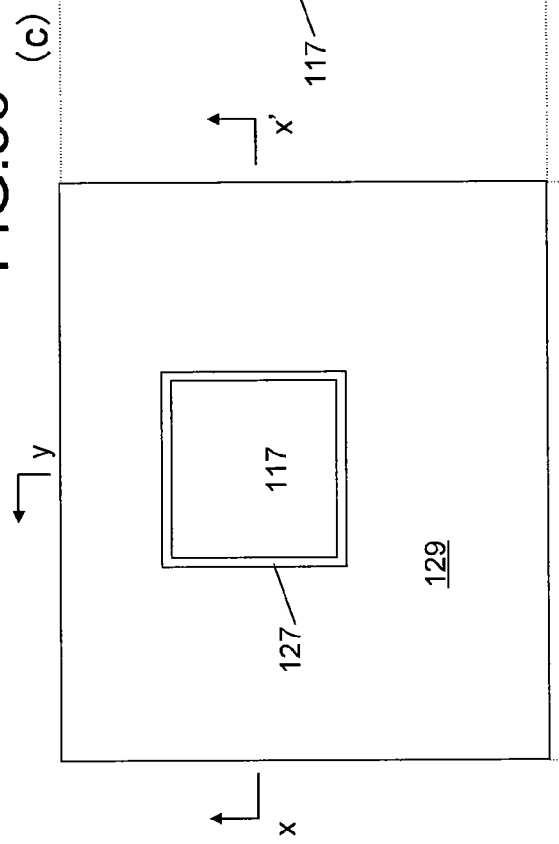
FIG. 36 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 36, the oxide film 129 around the column having the silicon layers 102, 104 is subjected to etch-back up to a predetermined depth.

Figure 37:
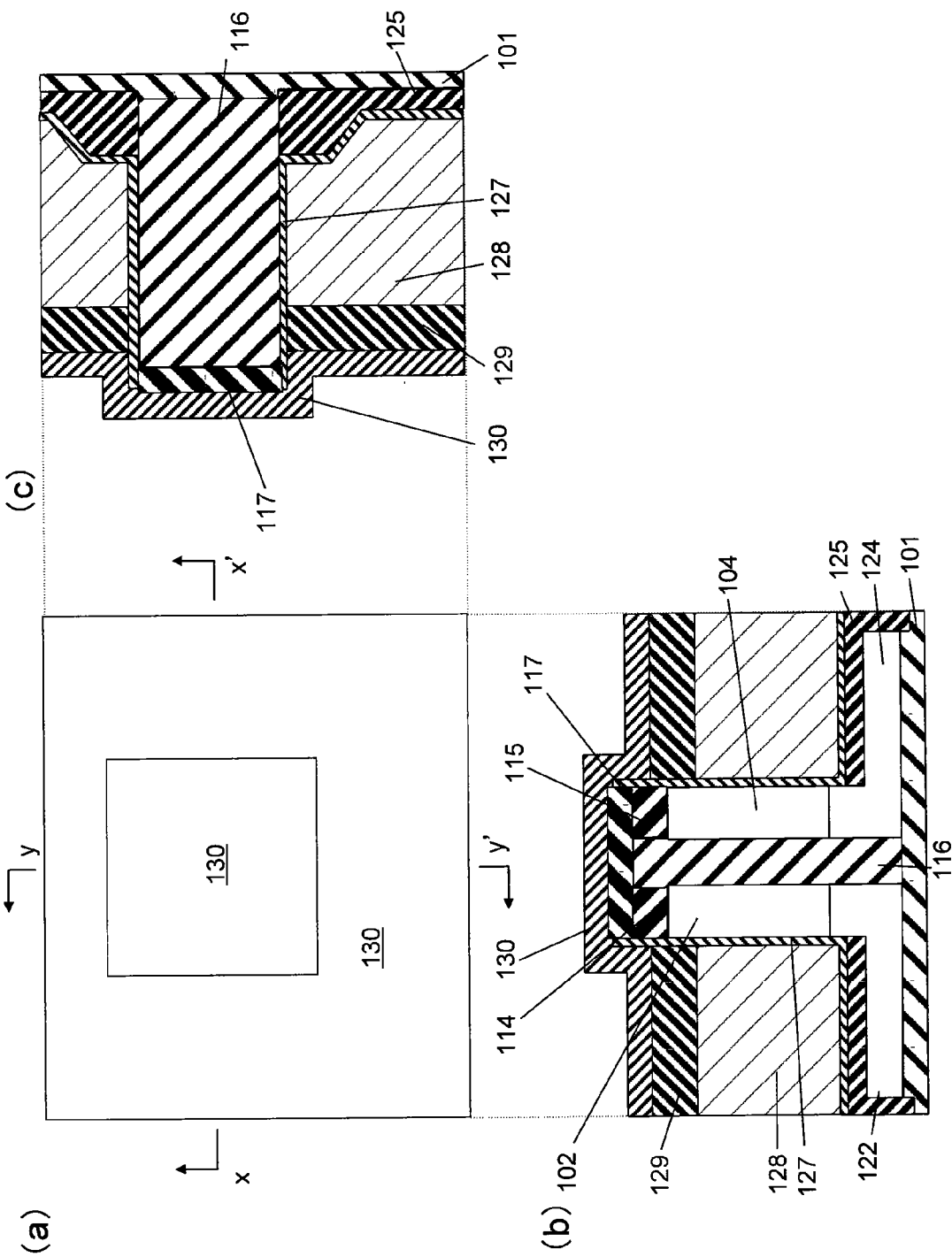
FIG. 37 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 37, a nitride film 130 with a predetermined thickness is deposited so that the nitride film 117 on the column having the silicon layers 102, 104 is completely covered.

Figure 38:
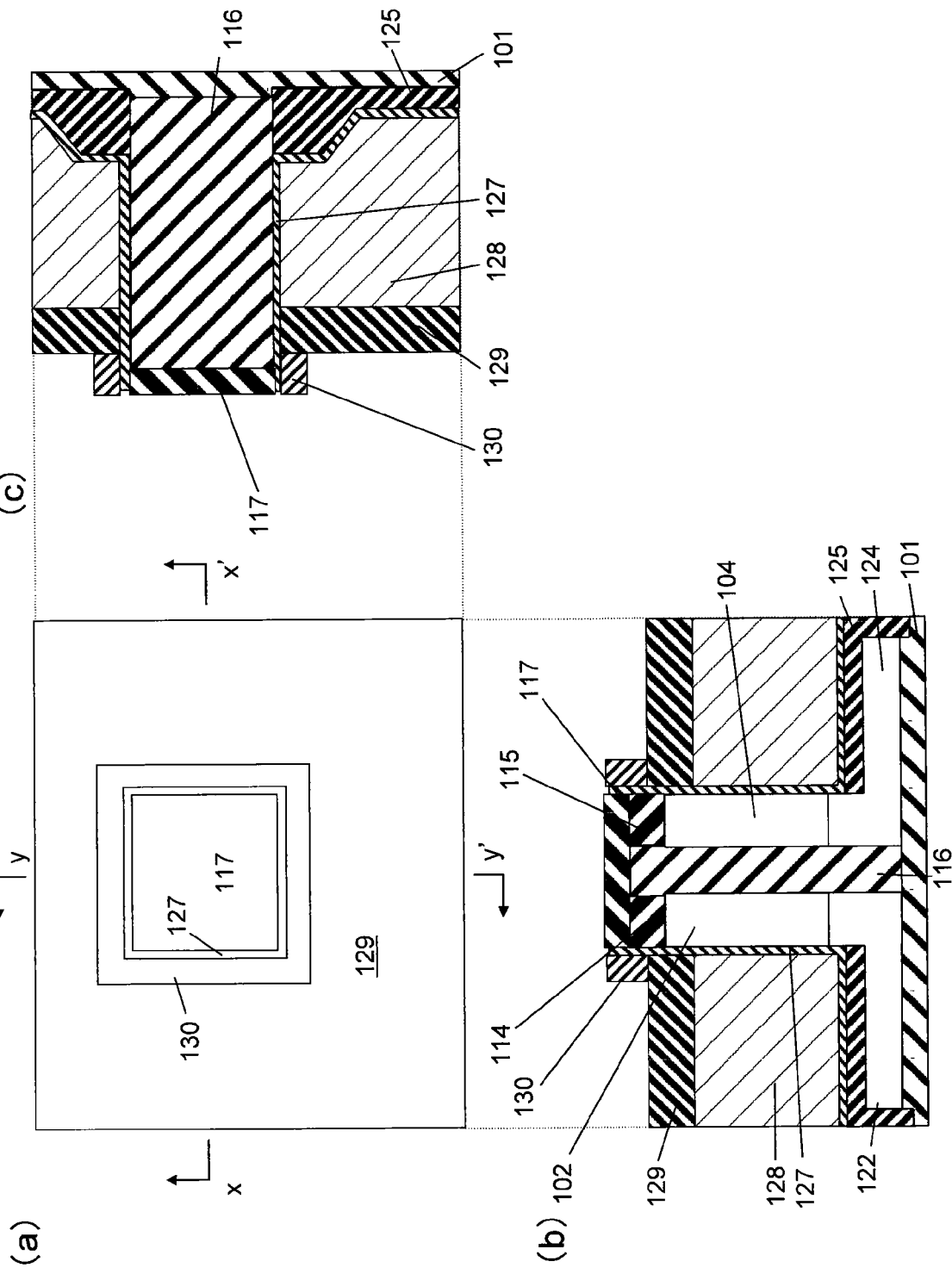
FIG. 38 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 38, the nitride film 130 is etched so as to be left in a sidewall-like shape at the sidewall of the high-dielectric film 127 around the nitride-film sidewalls 114, 115 and the nitride film 117.

Figure 39:
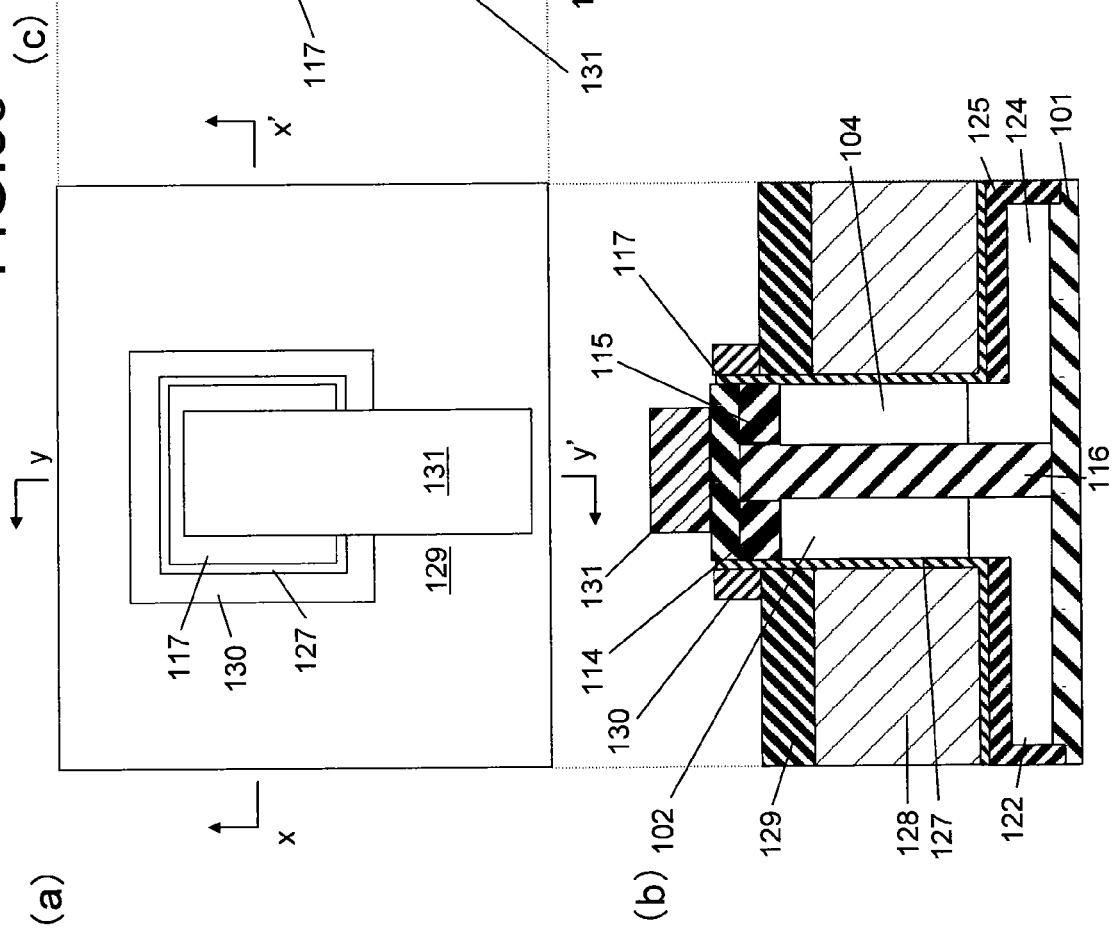
FIG. 39 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 39, a resist 131 for forming a gate is formed at a predetermined position on the nitride film 117 and on the oxide film 129.

Figure 40:
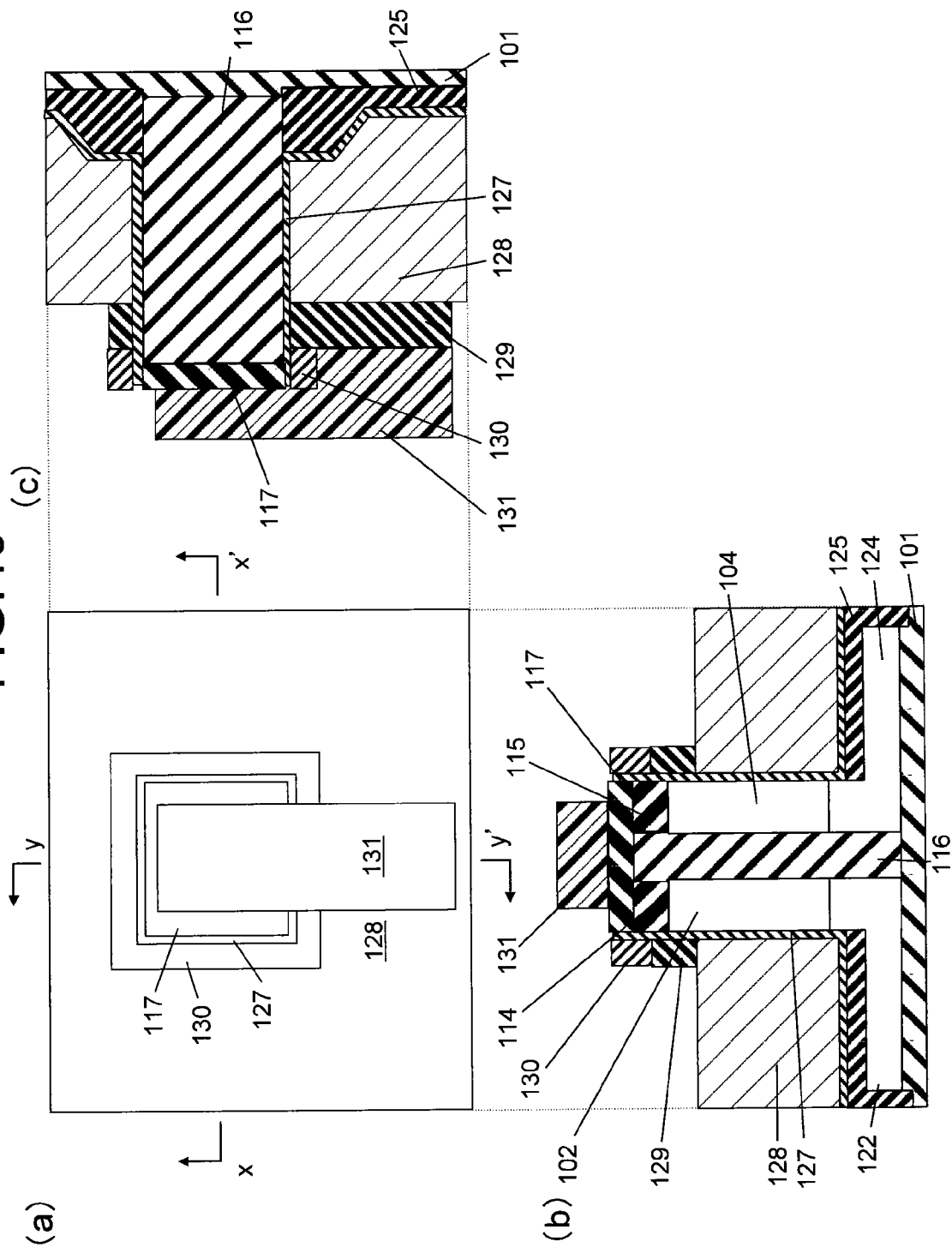
FIG. 40 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 40, the oxide film 129 is etched by using the resist 131 as a mask so as to be left in a sidewall-like shape at the sidewall of the high-dielectric film 127 around the column having the silicon layers 102, 104 and around the nitride film 117.

Figure 41:
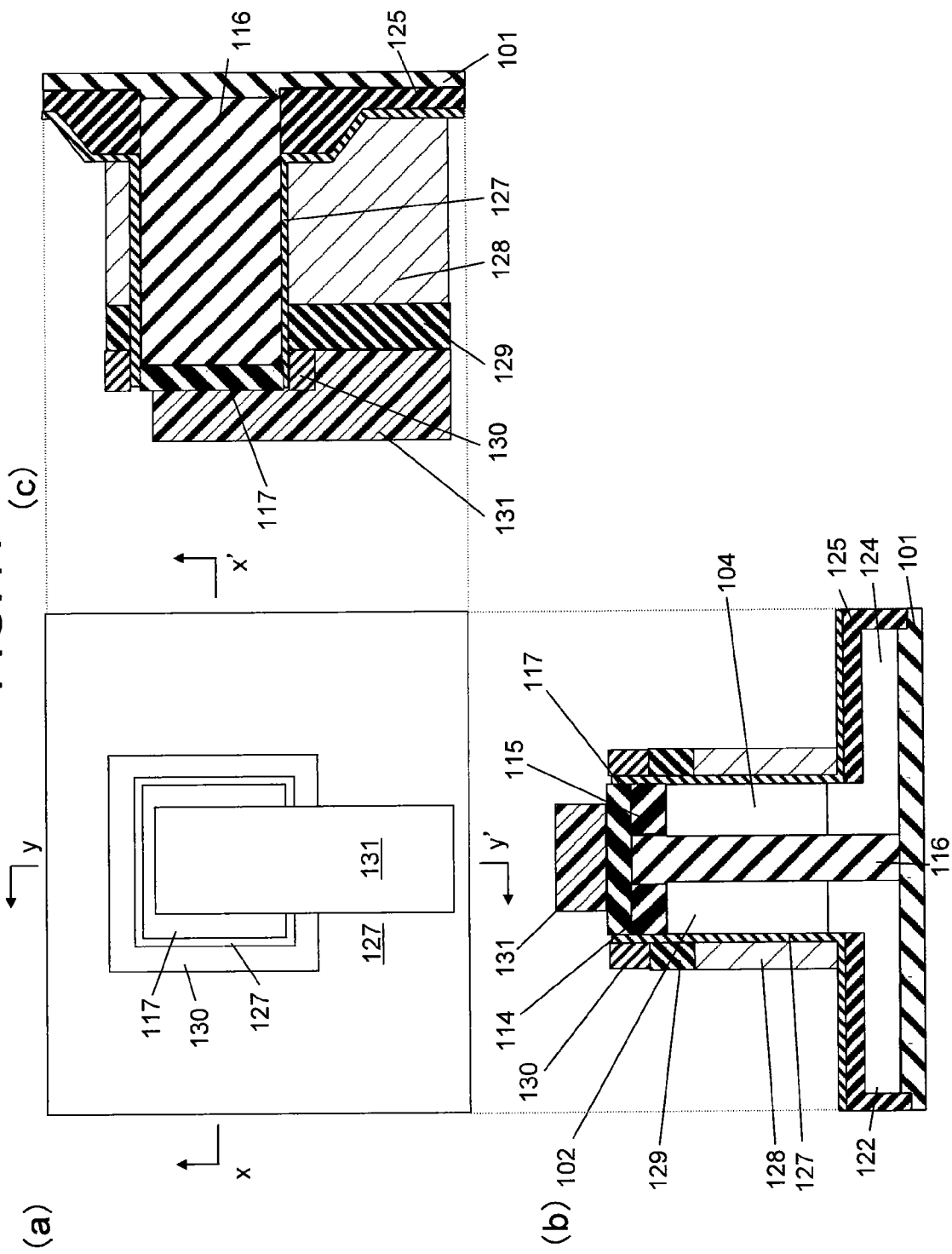
FIG. 41 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 41, the metal 128 is etched by using the nitride film 130 as a mask to form a gate electrode surrounding the side wall of the high-dielectric film 127 around the column having the silicon layers 102, 104.

Figure 42:
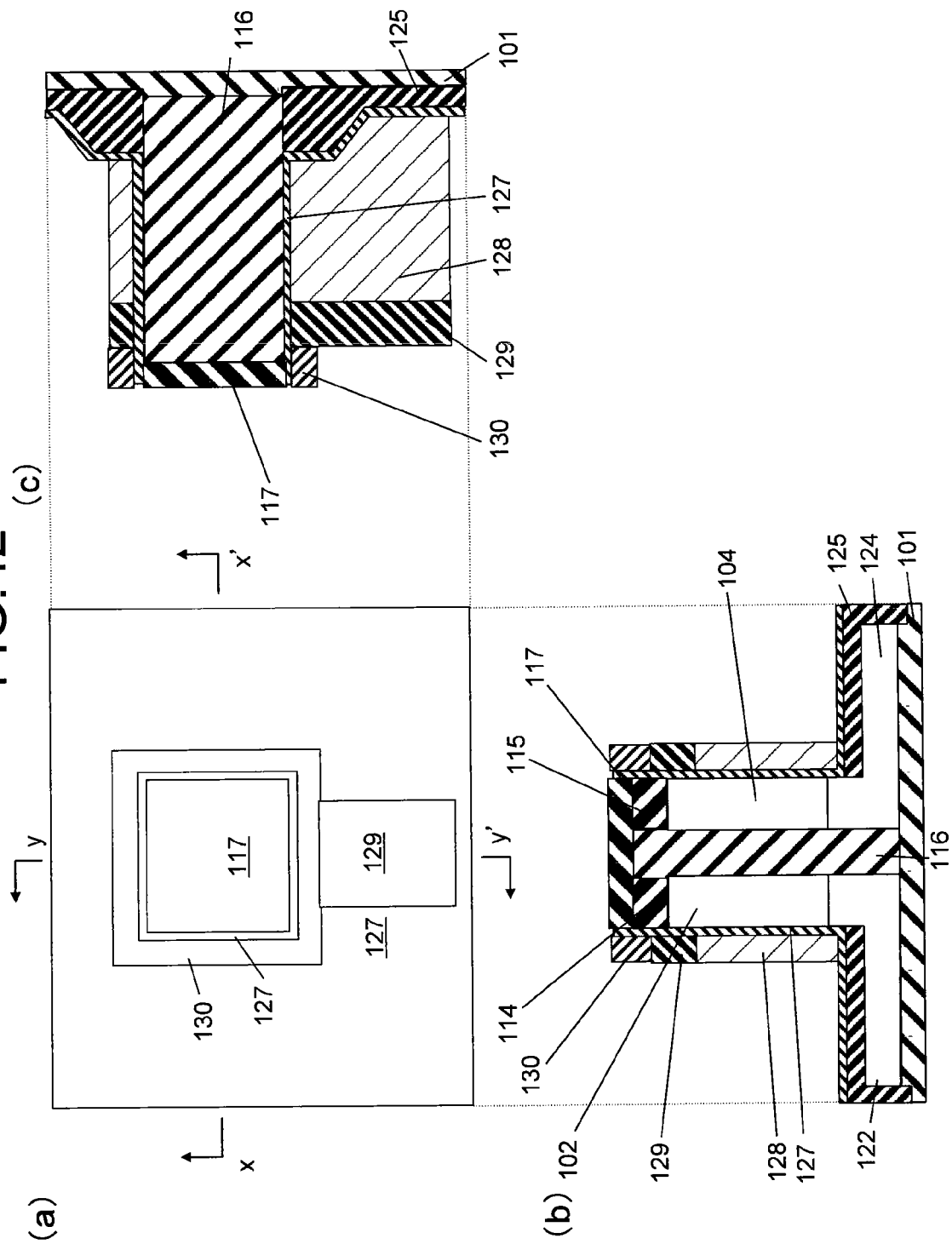
FIG. 42 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 42, the resist 131 is peeled.

Figure 43:
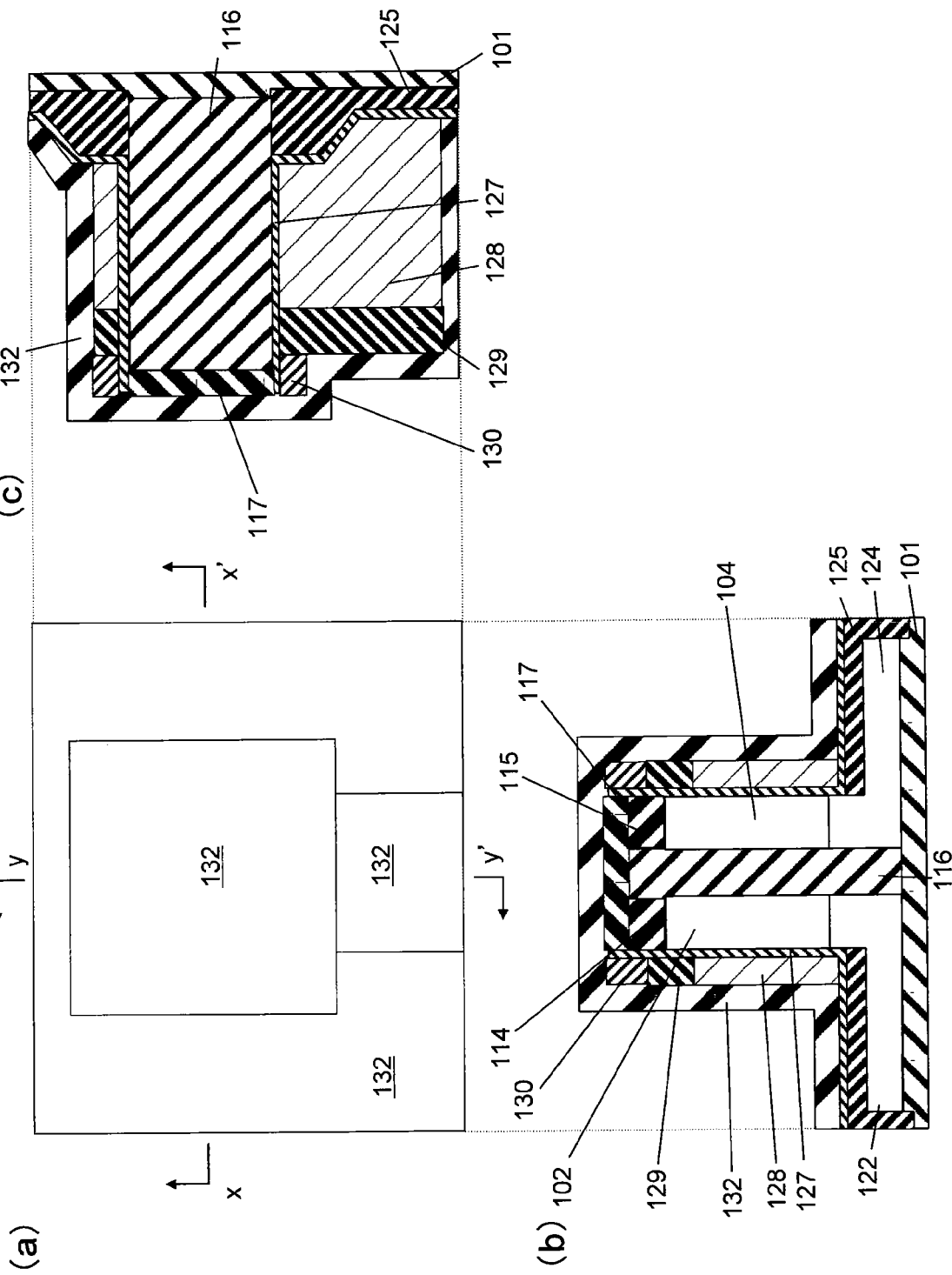
FIG. 43 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 43, an oxide film 132 is deposited so as to cover the surface of the structural body with a uniform thickness.

Figure 44:
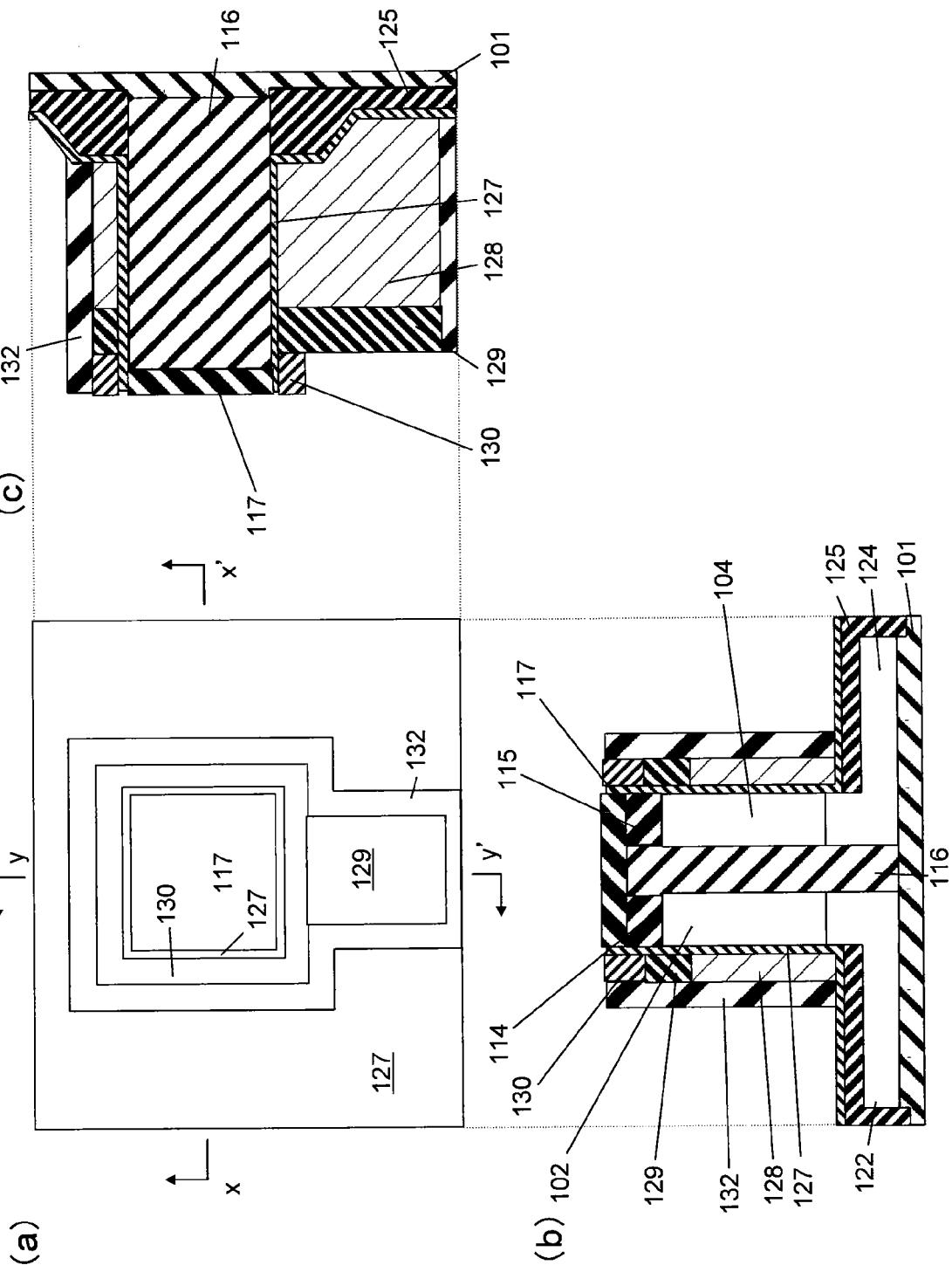
FIG. 44 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 44, the oxide film 132 is etched so as to be left in a sidewall-like shape around the column having the silicon layers 102, 104.

Figure 45:
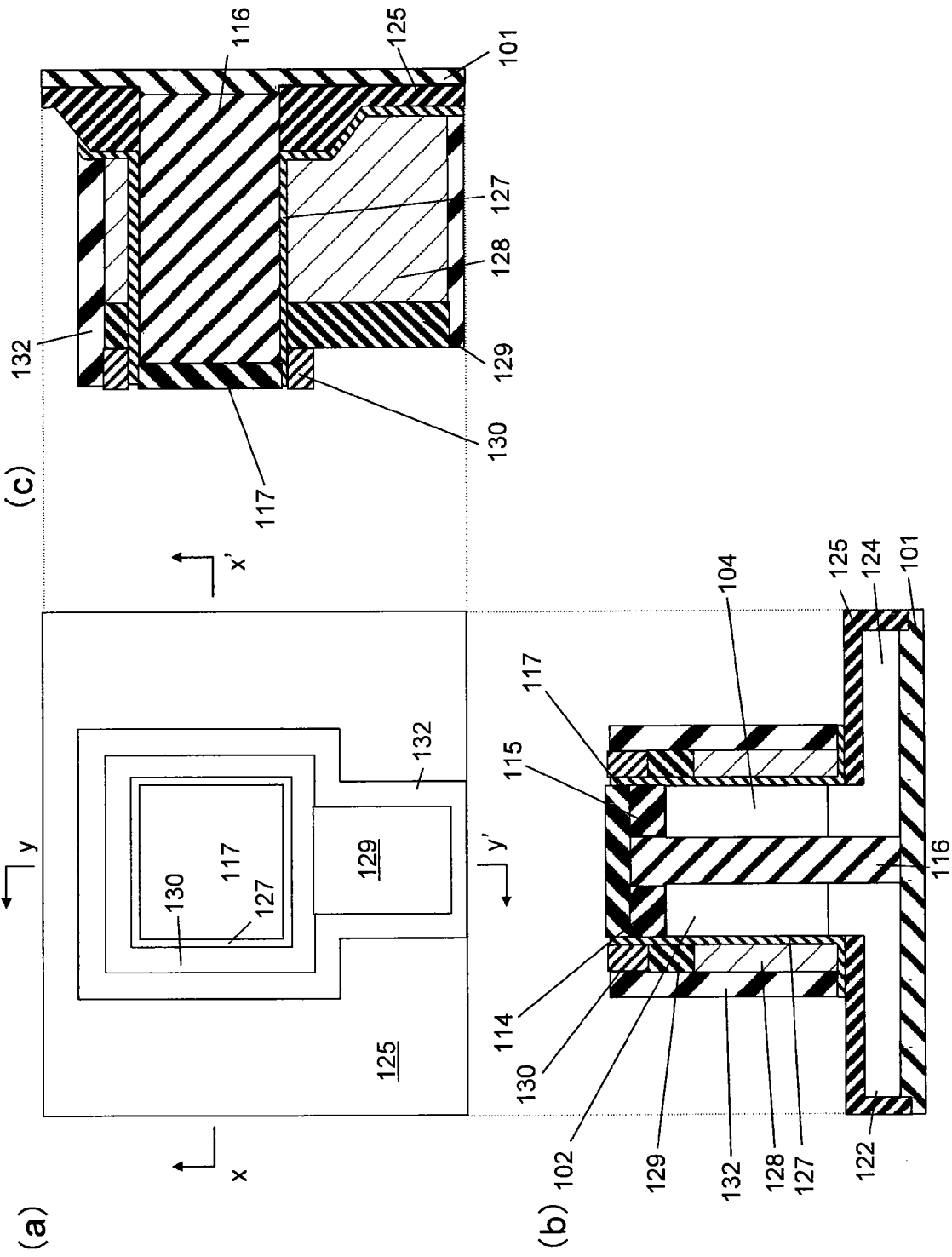
FIG. 45 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 45, the high-dielectric film 127 is etched so as to allow only the high-dielectric film 127 under the oxide film 132 to be left.

Figure 46:
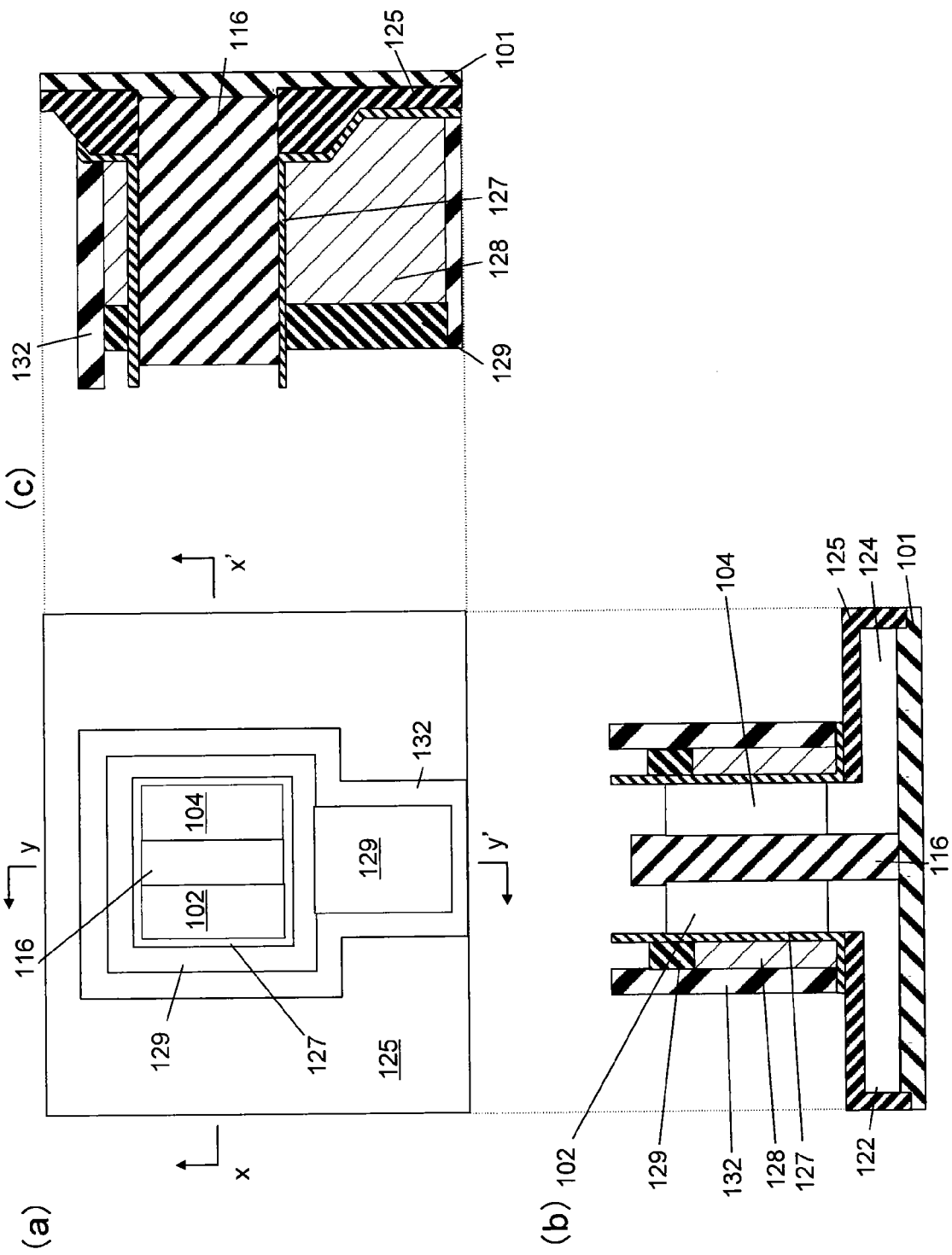
FIG. 46 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 46, the nitride films 130, 117, 114, and 115 are all etched and eliminated.

Figure 47:
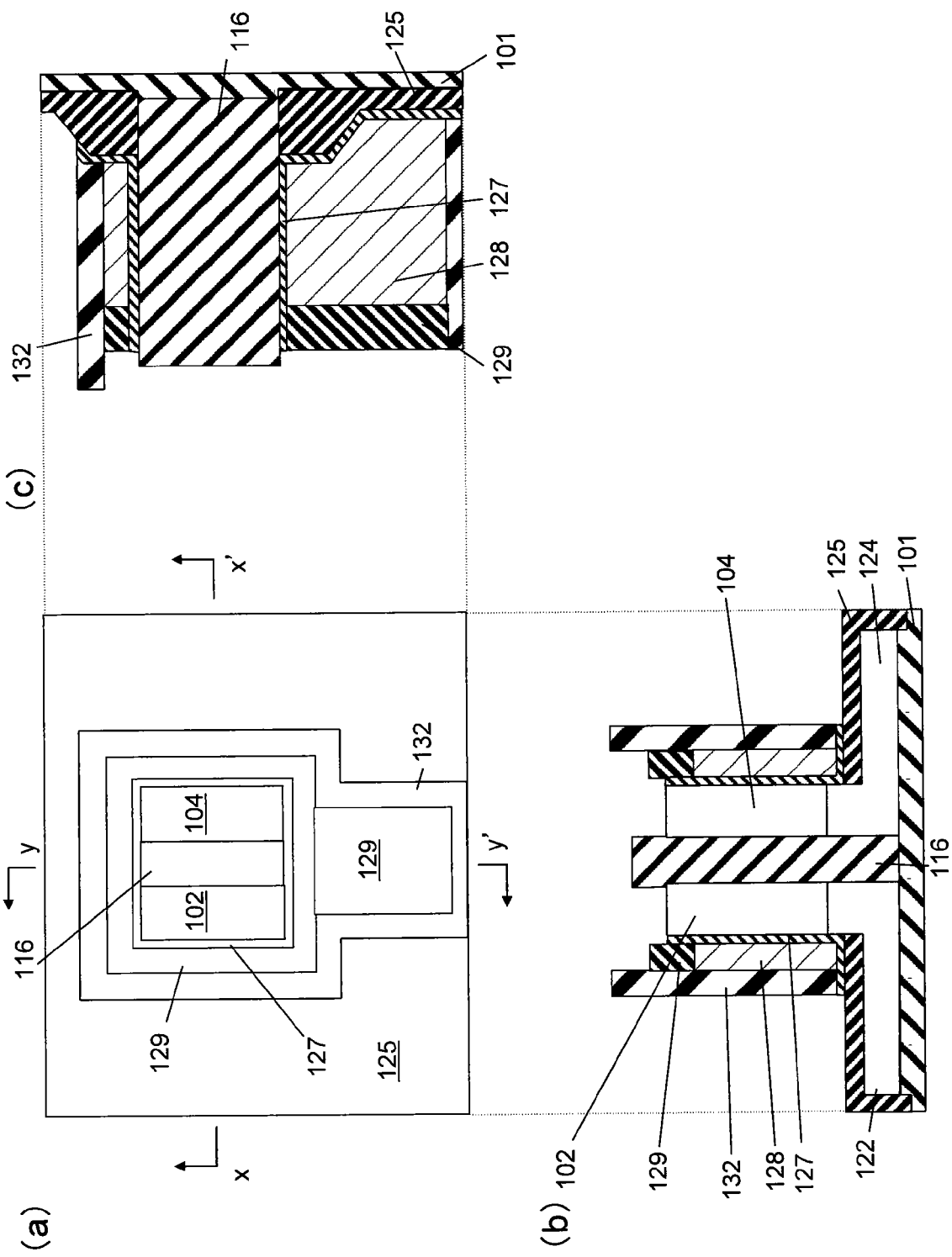
FIG. 47 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 47, the high-dielectric film 127 is etched and eliminated up to respective heights of the silicon layers 102, 104.

Figure 48:
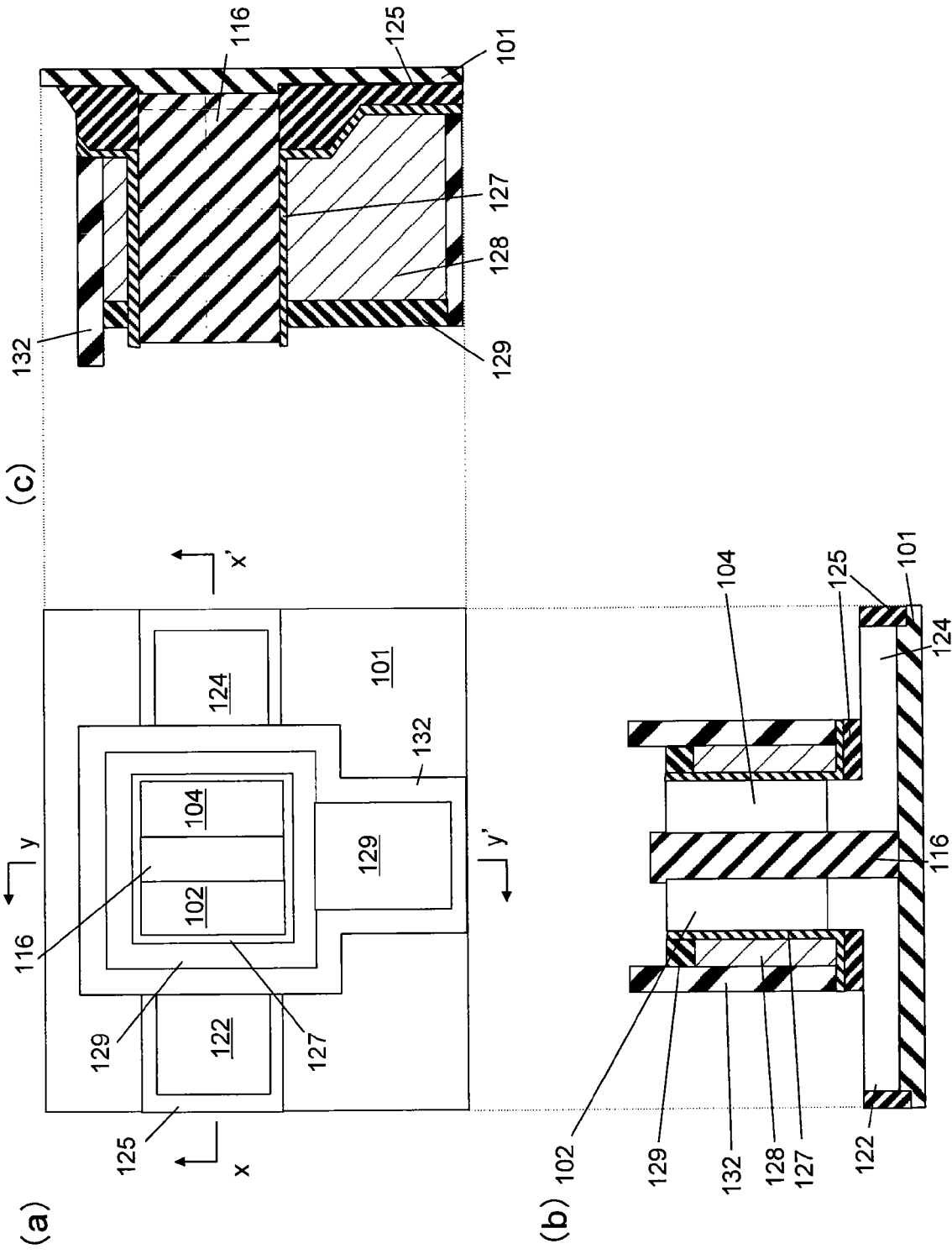
FIG. 48 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 48, the oxide film 125 exposed outwardly of the oxide film 132 is etched to make the silicon layer 122 containing n-type high-concentration dopants and the silicon layer 124 containing p-type high-concentration dopants exposed.

Figure 49:
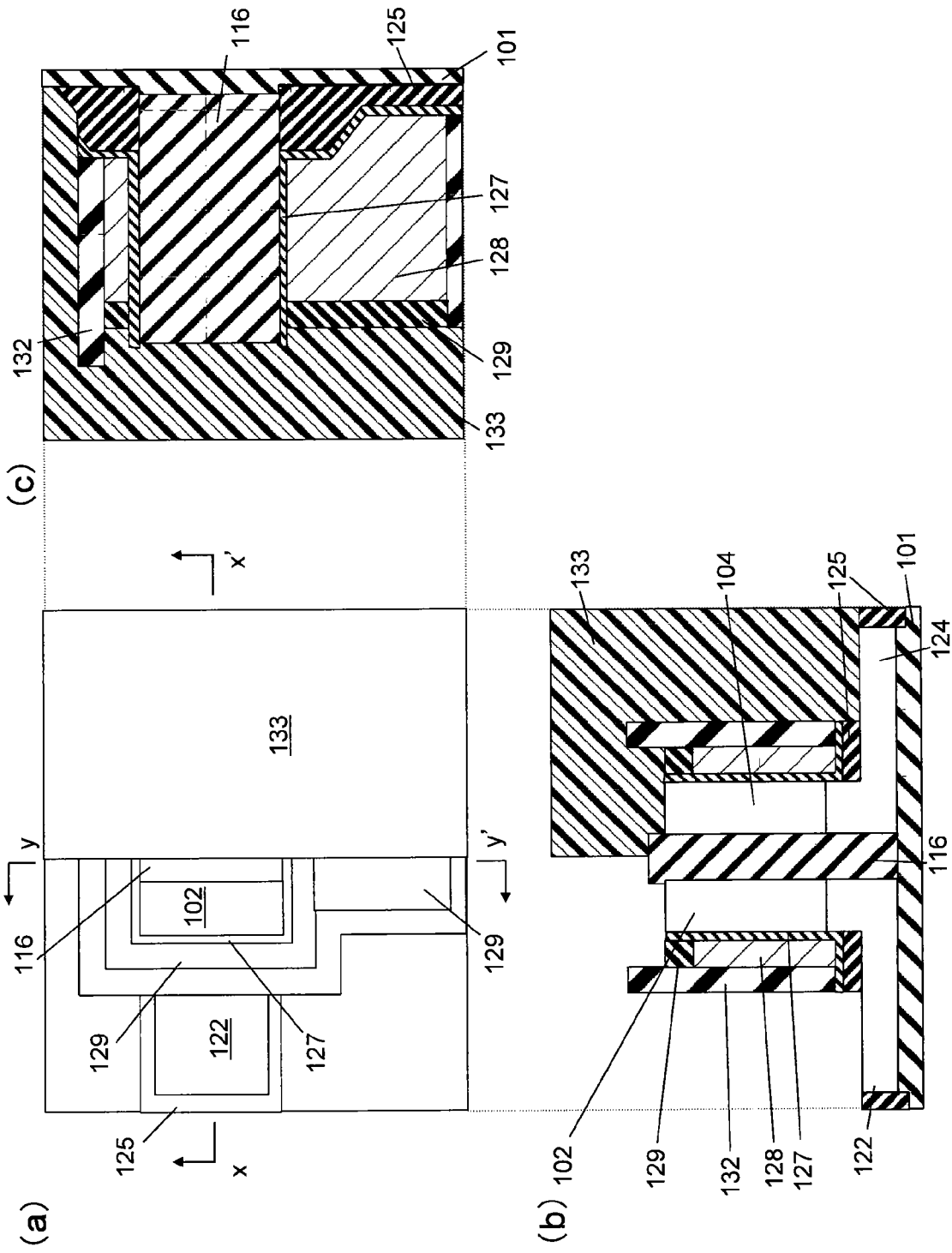
FIG. 49 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 49, a resist 133 for introducing dopants over the oxide film 101 is formed so as to cover the right part of the column having the silicon layers 102, 104 and the silicon layer 124.

Figure 50:
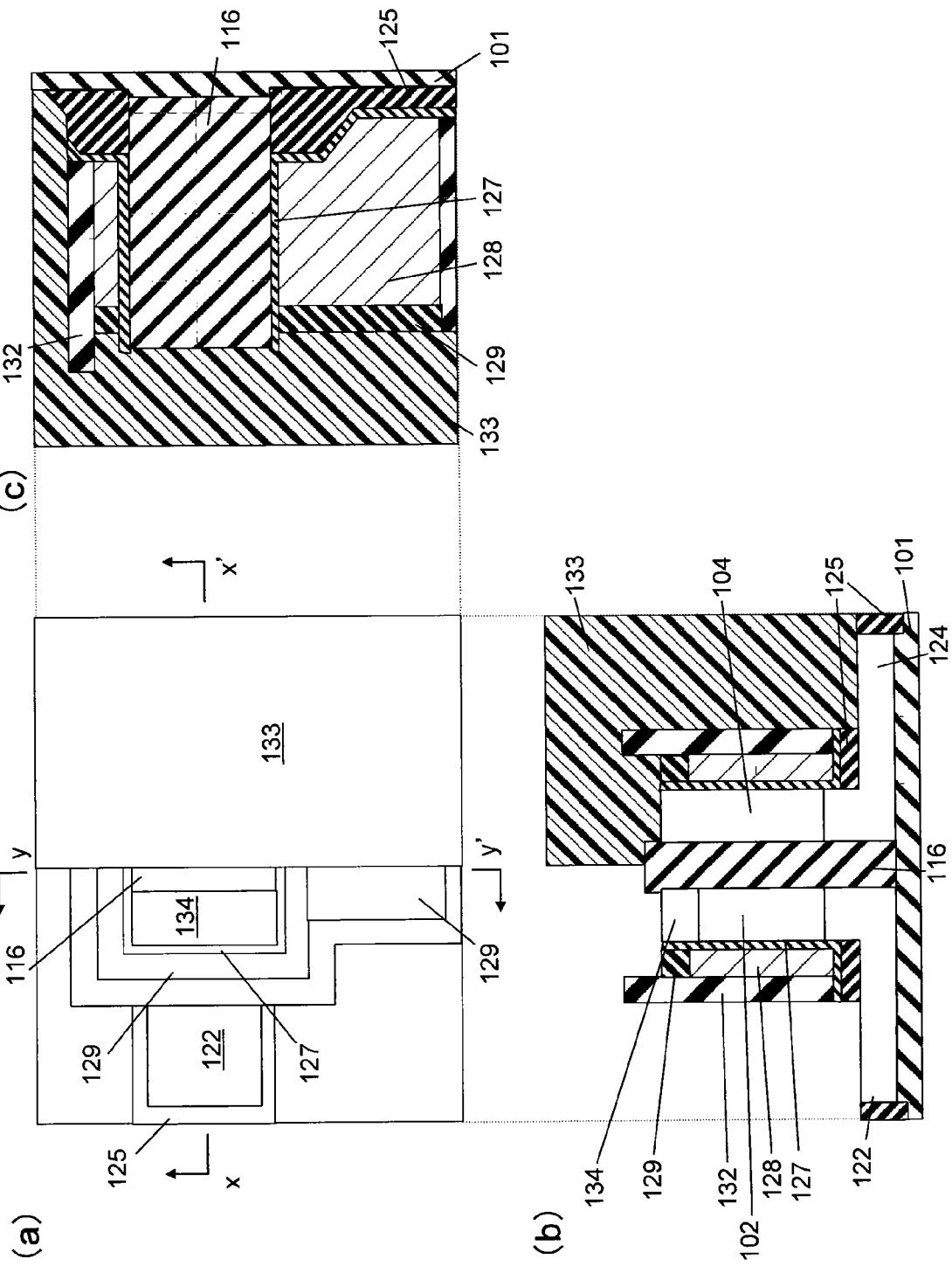
FIG. 50 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 50, dopants like phosphorus are doped in the surface part of the silicon layer 122 by using the resist 133 as a mask and the silicon layer 134 containing n-type high-concentration dopants is formed.

With reference to FIG. 51, the resist 133 is peeled.

Figure 52:
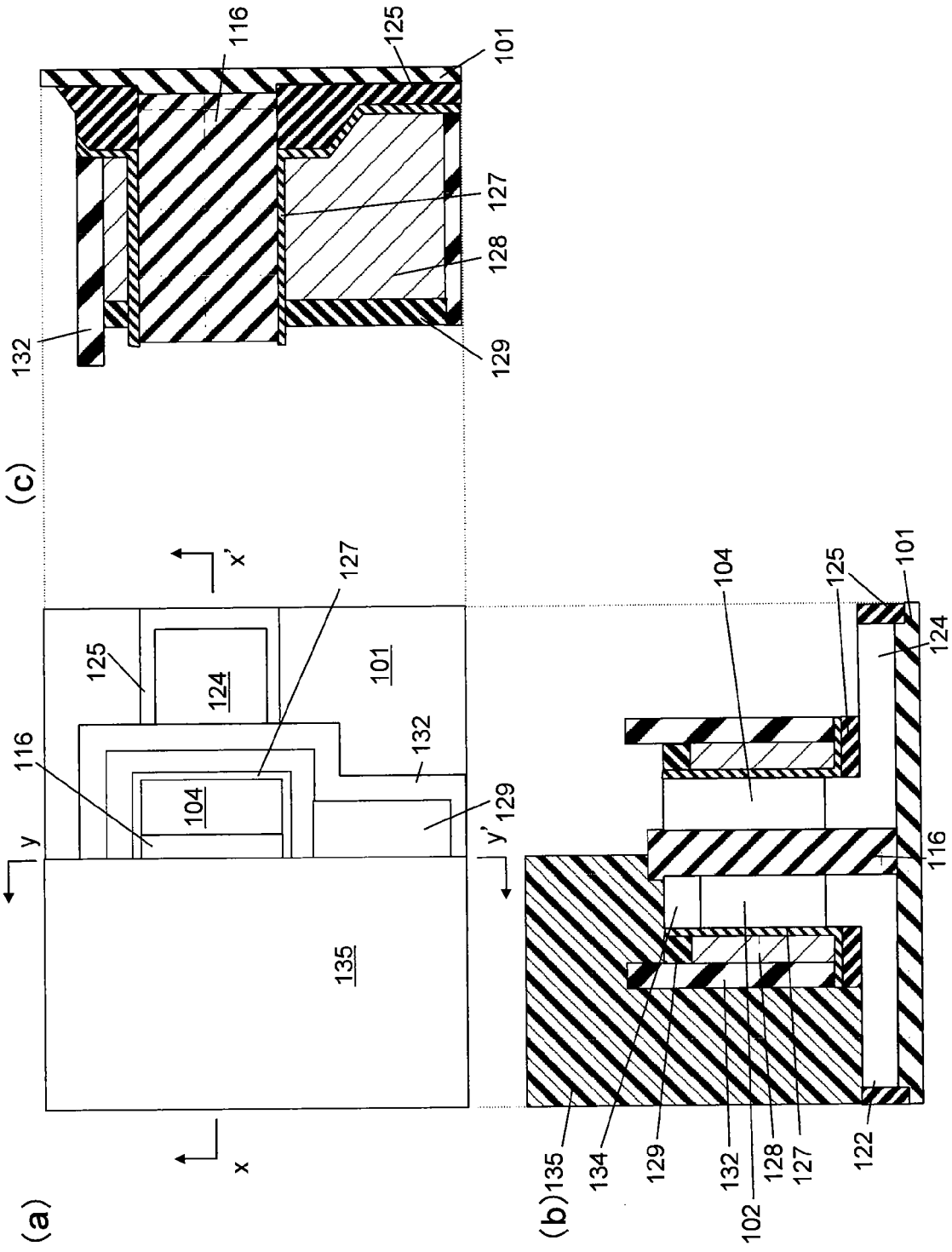
FIG. 52 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 52, a resist 135 for introducing dopants over the oxide film 101 is formed so as to cover the left part of the column having the silicon layers 102, 104 and the silicon layer 122.

Figure 53:
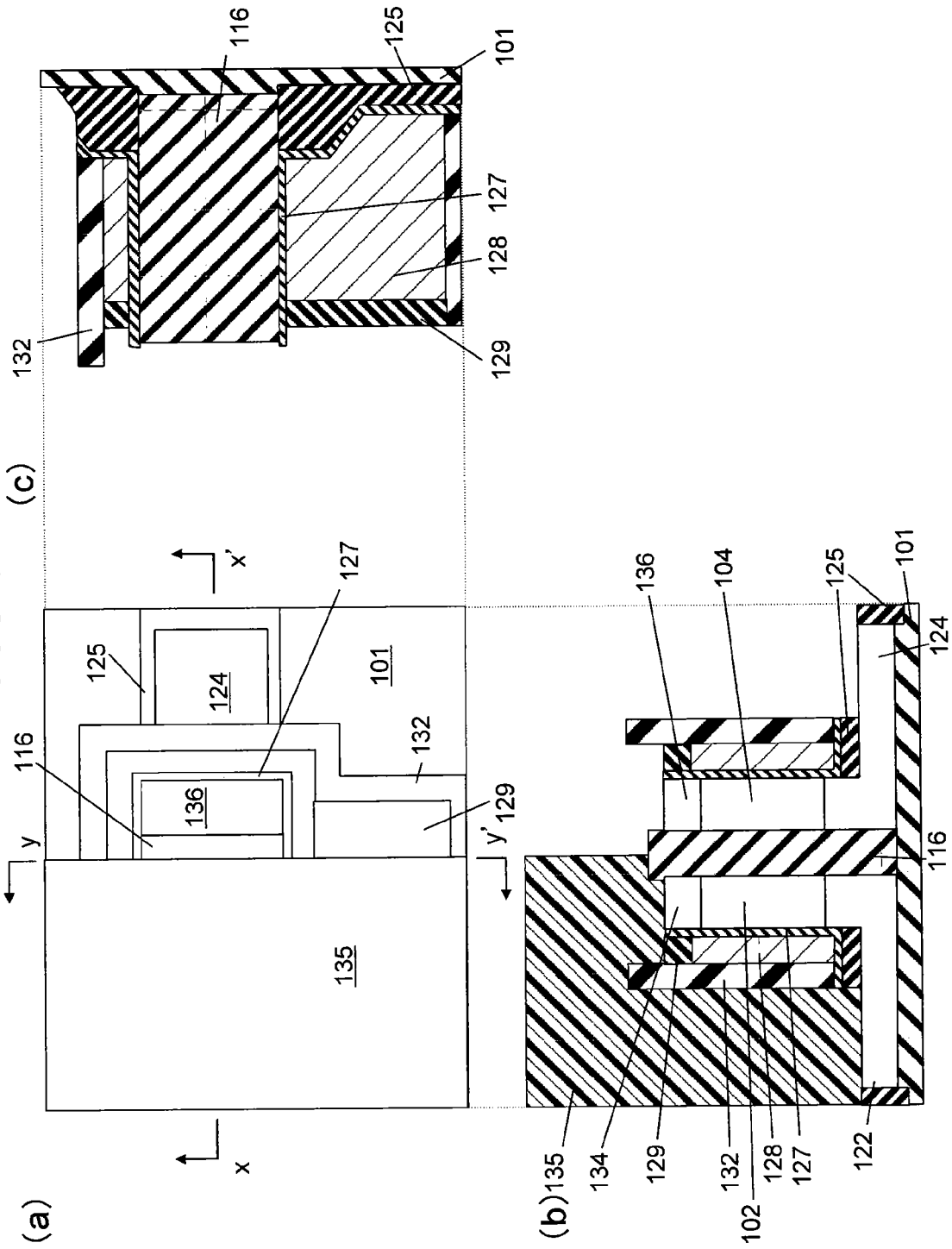
FIG. 53 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 53, dopants like arsenic are doped in the surface part of the silicon layer 104 by using the resist 135 as a mask, and the silicon layer 136 containing p-type high-concentration dopants is formed.

Figure 54:
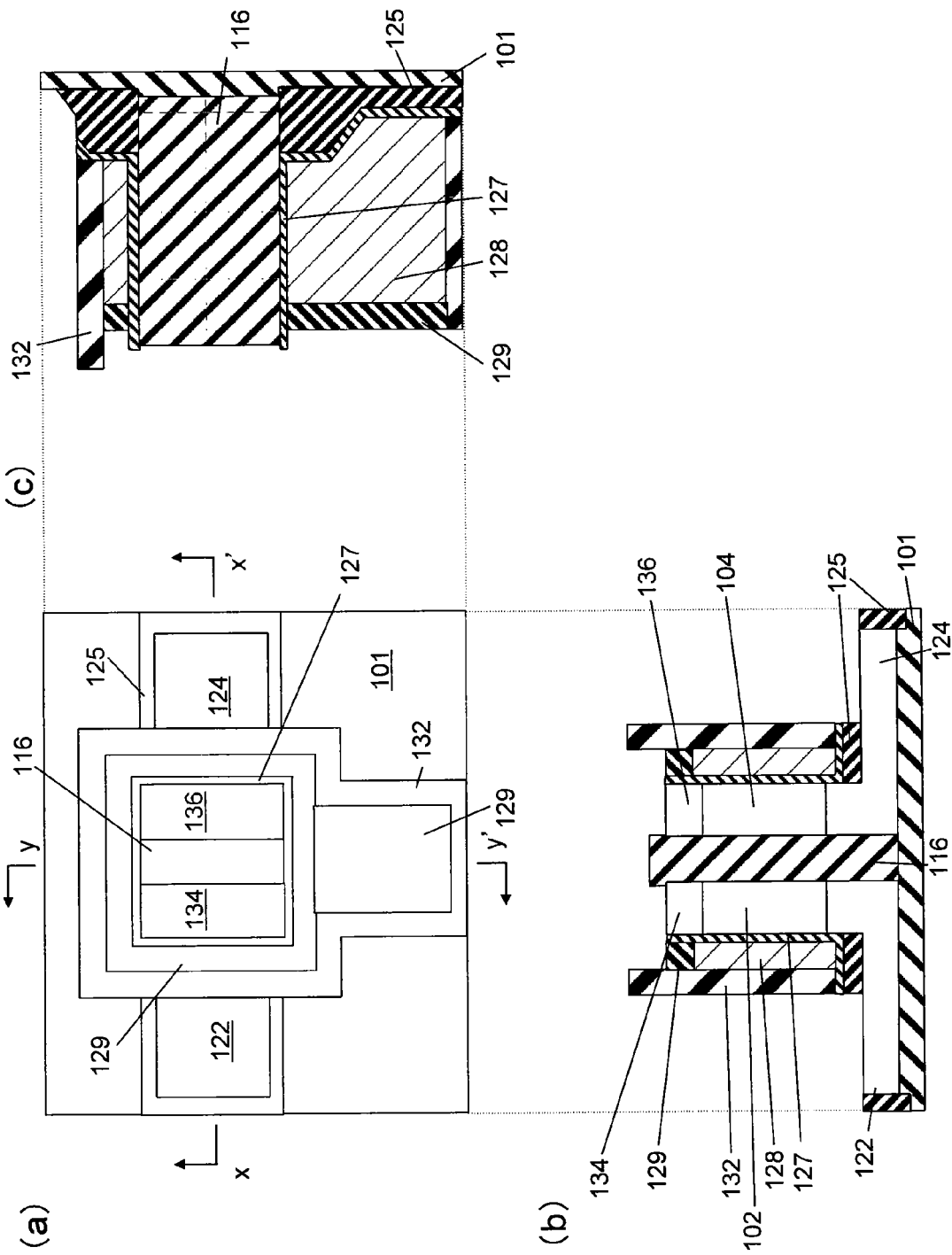
FIG. 54 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 54, the resist 135 is peeled.

Figure 55:
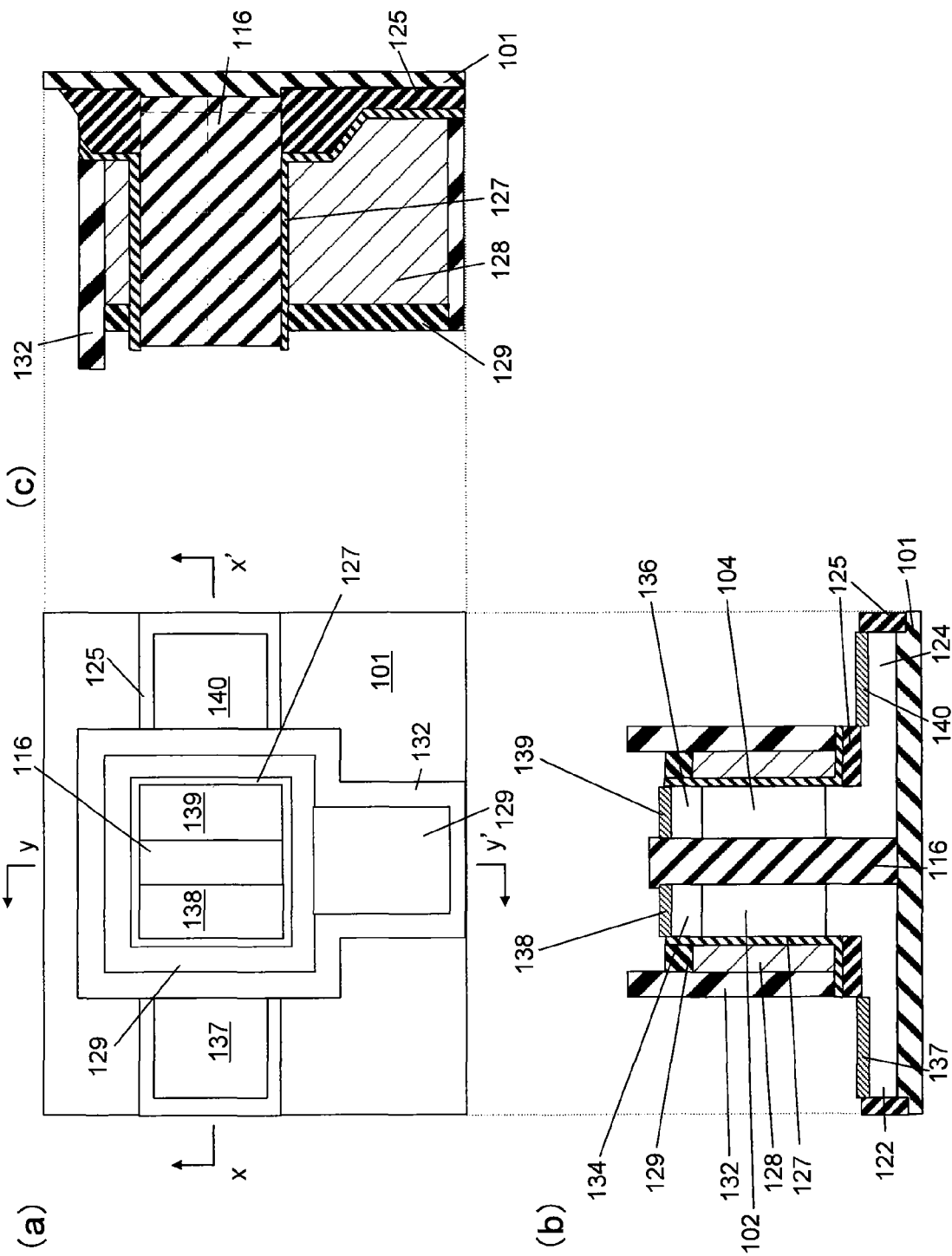
FIG. 55 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 55, the metal/silicon compounds 137, 138, 139, and 140 are formed at respective surface parts of the silicon layers 122, 134, 136, and 124. An example of such a metal usable is Ni (nickel) or Co (cobalt), and the compound layer is formed by, for example, depositing a nickel film on a silicon, and by performing a heat treatment thereon to form an Ni silicide film on the silicon surface.

Figure 56:
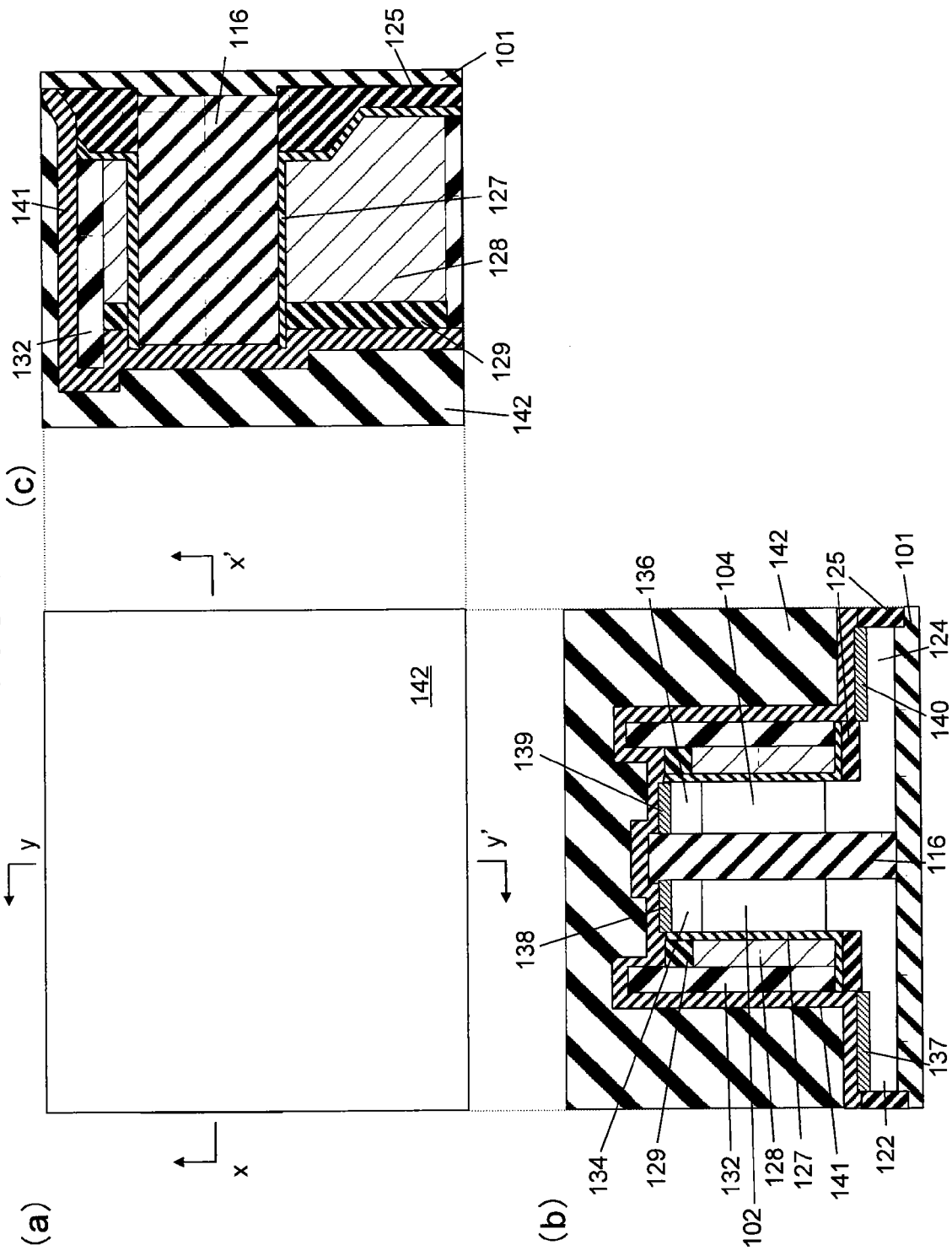
FIG. 56 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 56, a nitride film 141 is deposited on the structural body with a uniform thickness, and an oxide film 142 is also deposited thereon and planarized.

Figure 57:
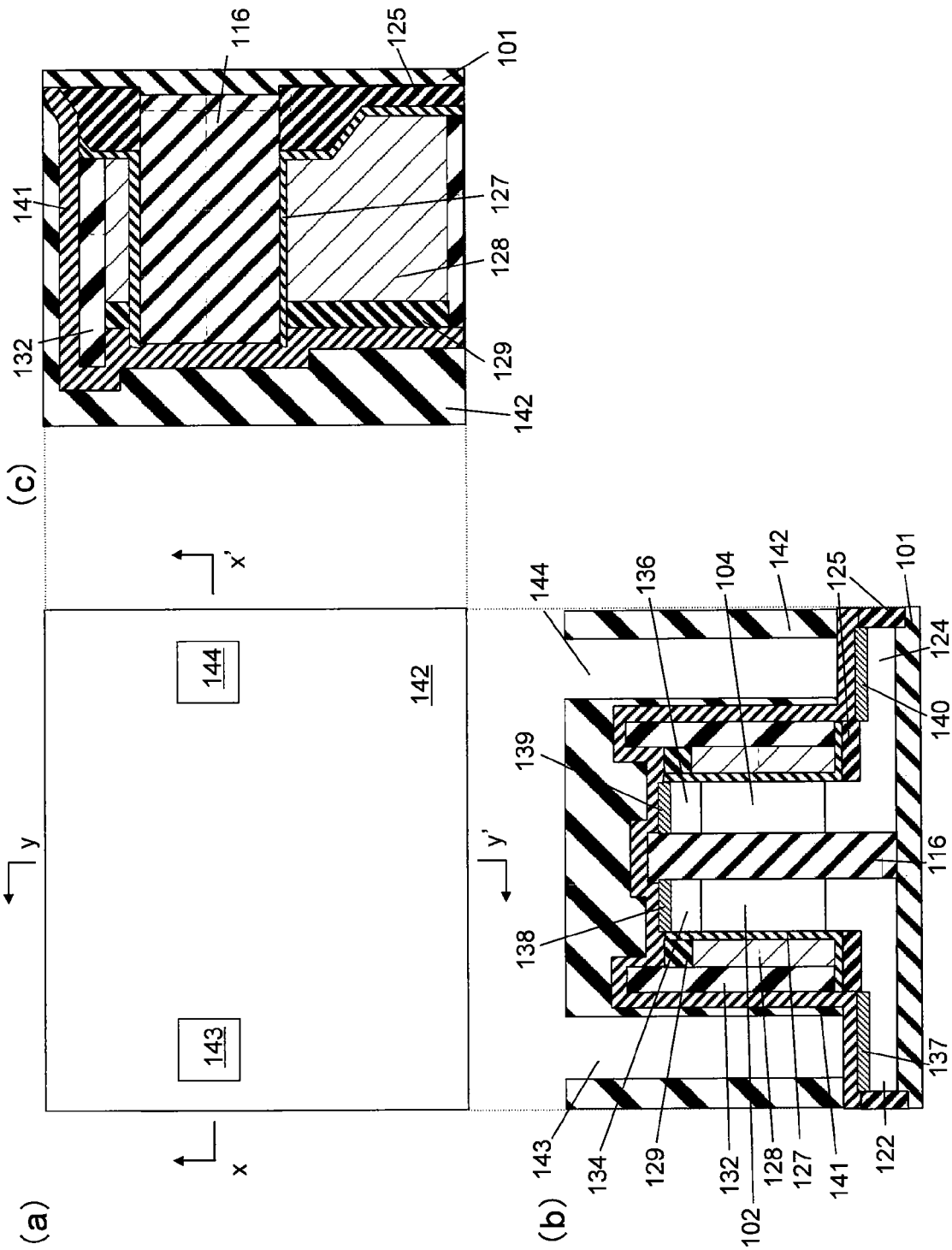
FIG. 57 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 57, contact holes 143, 144 reaching the nitride film 141 on the metal/silicon compounds 137, 140 are formed.

Figure 58:
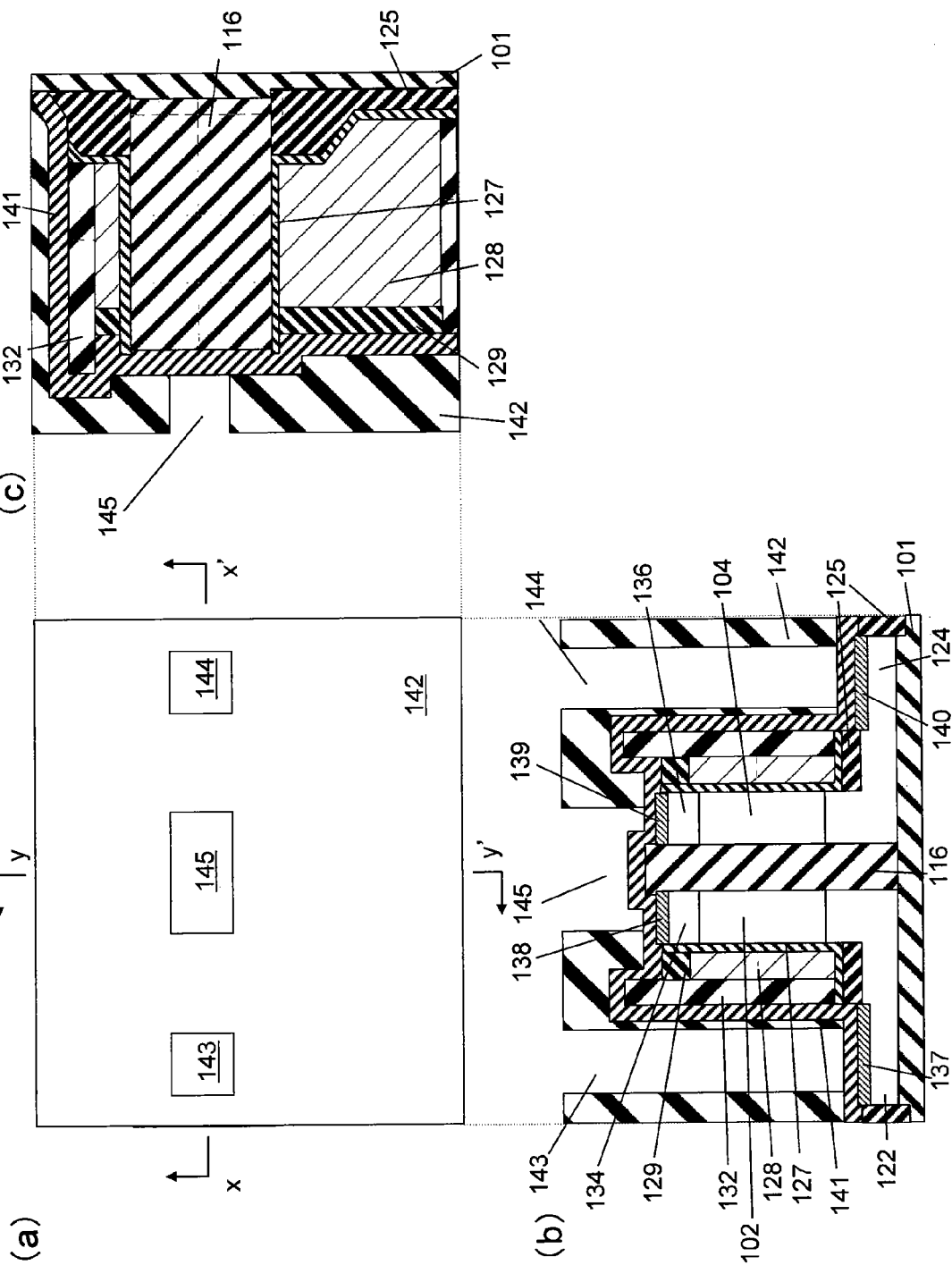
FIG. 58 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 58, a contact hole 145 reaching the nitride film 141 on the metal/silicon compounds 138, 139 is formed.

Figure 59:
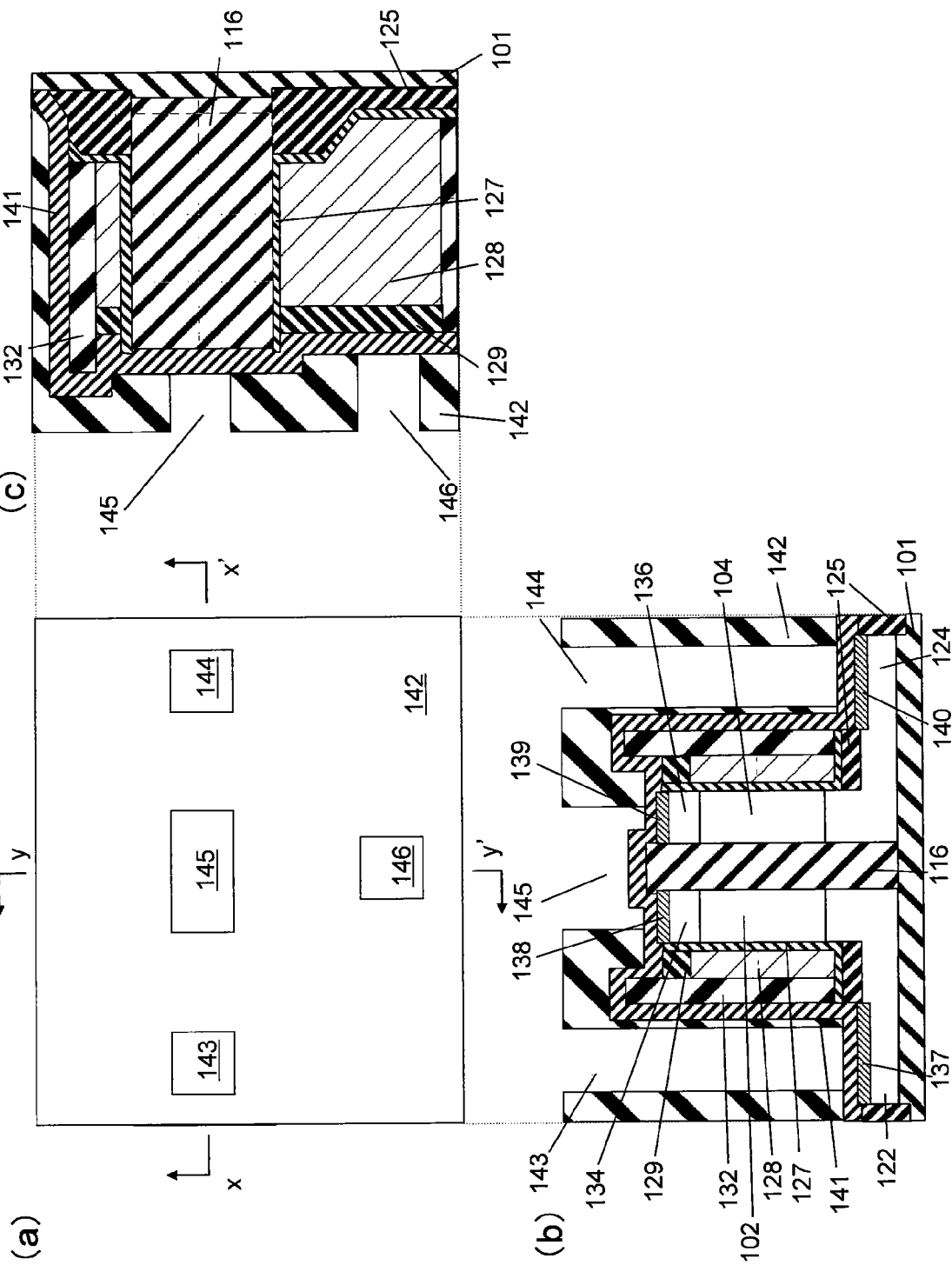
FIG. 59 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 59, a contact hole 146 is formed in a predetermined portion of the oxide film 142 so as to reach the oxide film 129.

Figure 60:
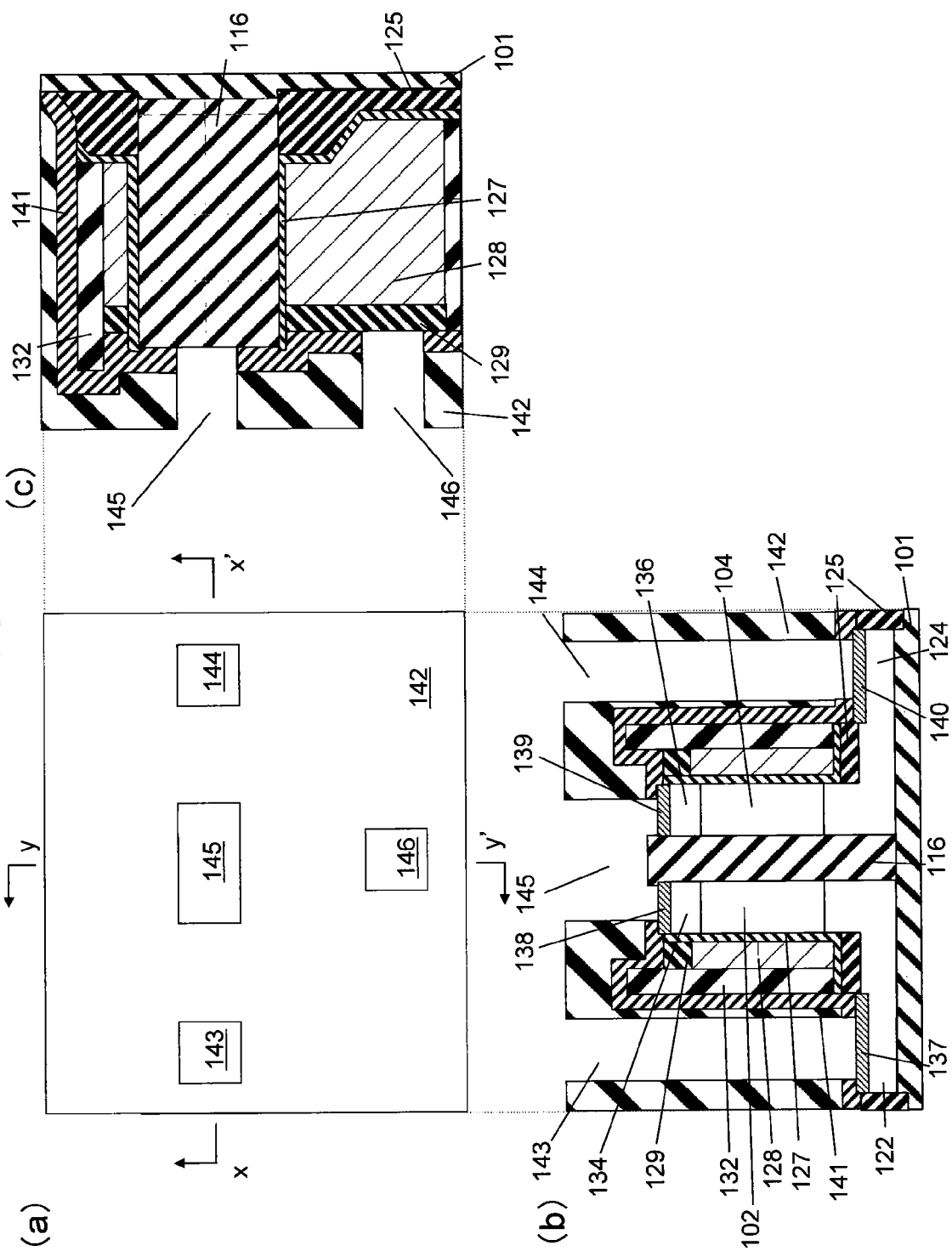
FIG. 60 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 60, the nitride film 141 at respective bottom faces of the contact holes 143, 144, 145, and 146 is etched to make respective metal/silicon compounds 137, 140, 138, and 139, and a part of the oxide film 129 exposed.

Figure 61:
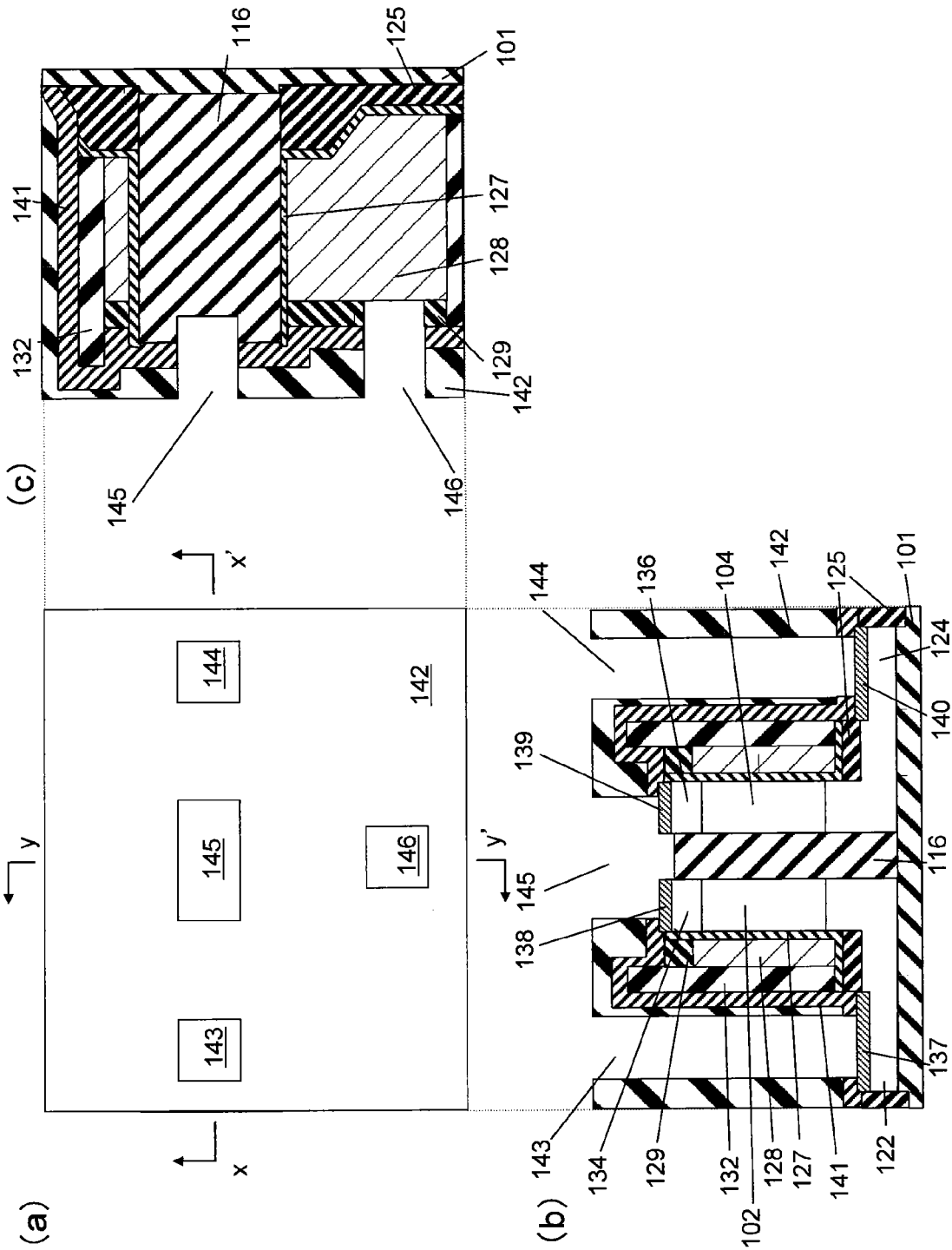
FIG. 61 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 61, the oxide film 129 in the contact hole 146 is etched to make the gate electrode 128 exposed.

Figure 62:
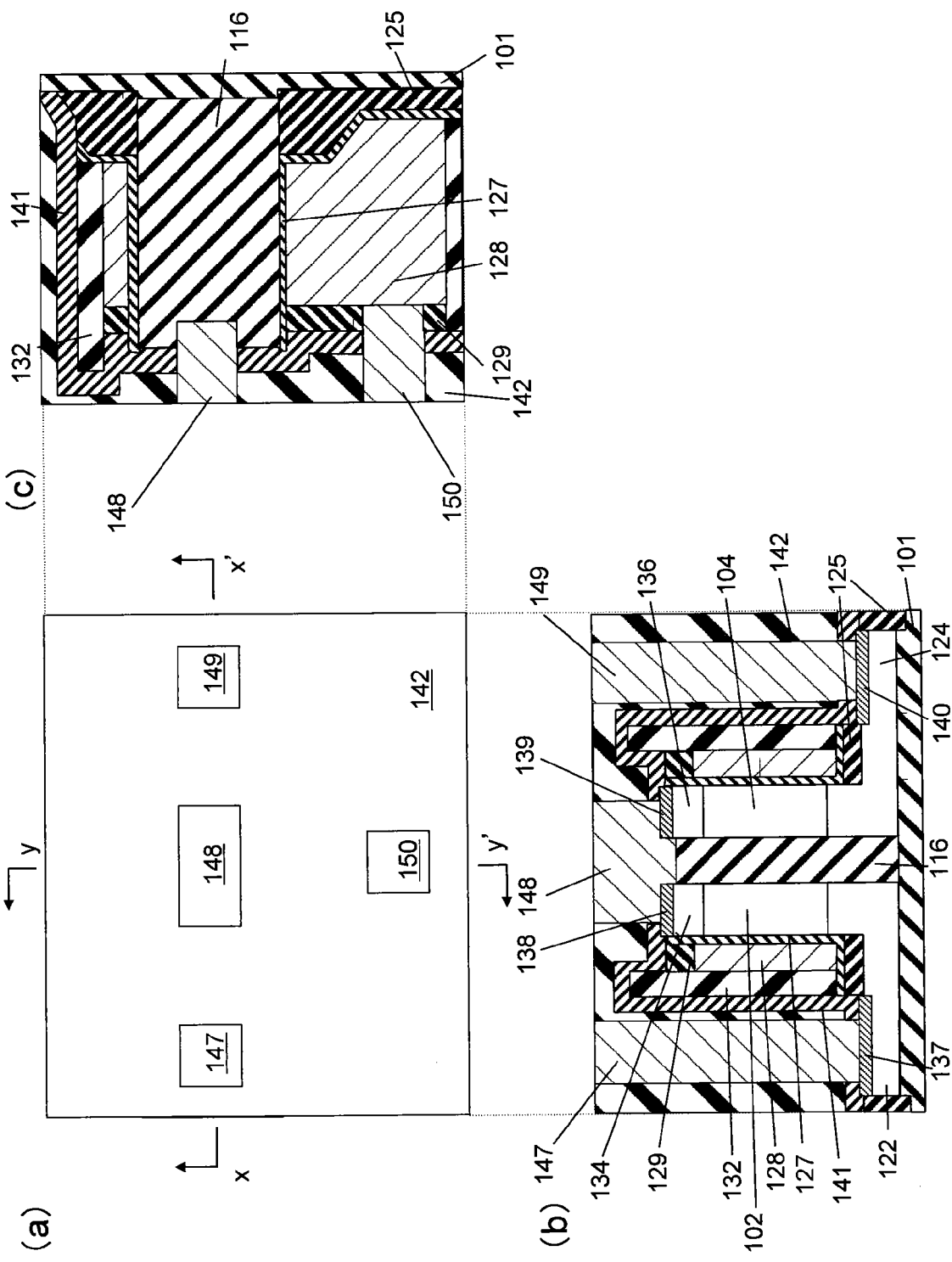
FIG. 62 shows a step in the example of the manufacturing process, wherein (a), (b) and (c) are a top plan view, a cross-sectional view taken along the line X-X' in (a), and a cross-sectional view taken along the line Y-Y' in (a), respectively.

With reference to FIG. 62, the contacts 147, 148, 149, and 150 are formed by burring metallic materials in the contact holes 143, 144, 145, and 146, respectively.

Finally, with reference to FIG. 63, the first metals 151, 152, 153, and 154 are formed on the contacts 147, 148, 149, and 150, respectively.

Figure 64:
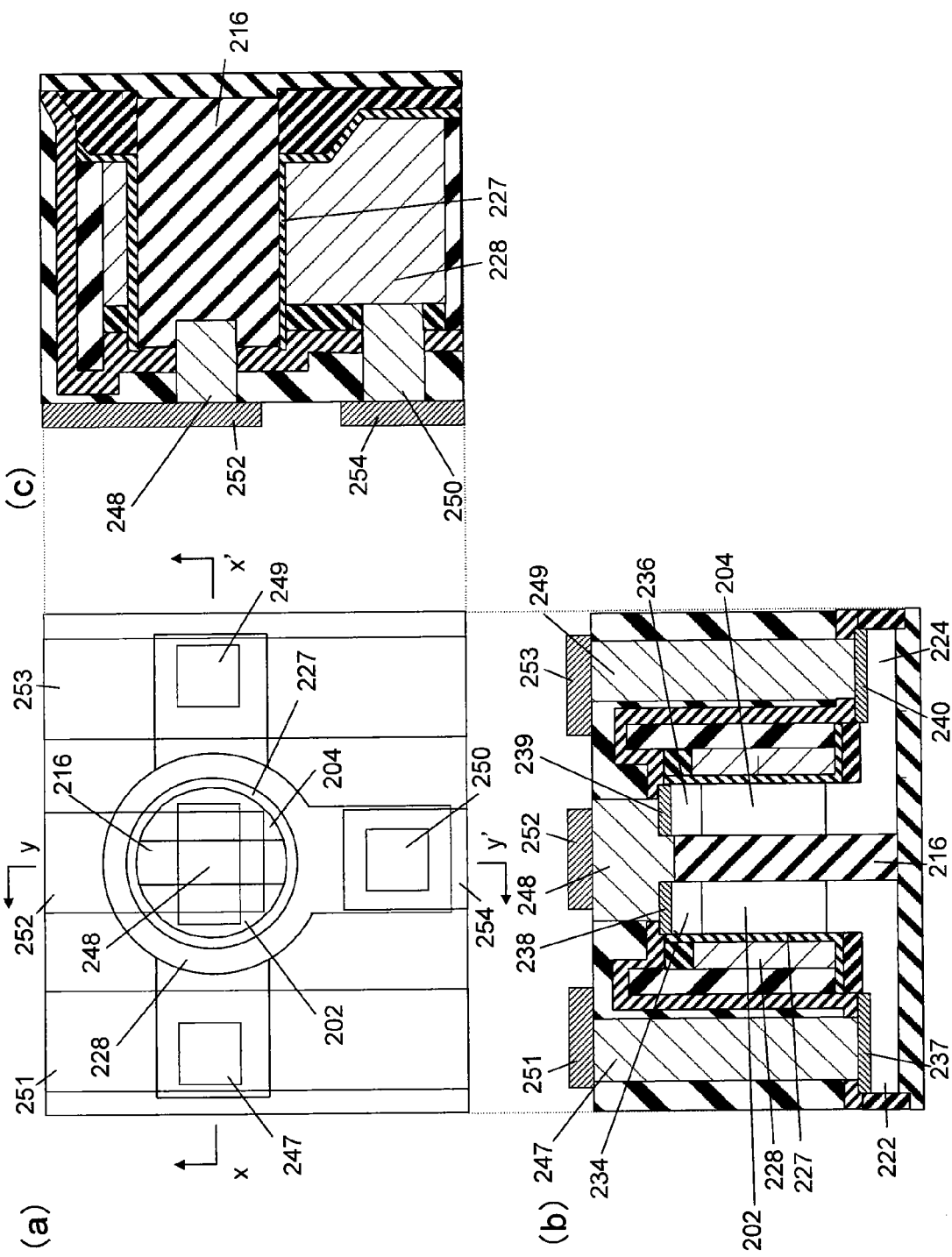
FIG. 64 shows a plan view showing a semiconductor device according to a modified example of the embodiment of the preset invention, wherein (a), (b) and (c) are a top plan view, a cross-sectional view taken along the line X-X' in (a), and a cross-sectional view taken along the line Y-Y' in (a), respectively.

In the foregoing embodiment, the p-type or intrinsic silicon 102 and the n-type or intrinsic silicon 104 are both in a quadrangular column shape, but as shown in FIG. 64, may be both in a semicircular column shape. FIG. 64 shows a plan view showing a semiconductor device according to a modified example of the embodiment of the preset invention, wherein (a), (b) and (c) are a top plan view, a cross-sectional view taken along the line X-X' in (a), and a cross-sectional view taken along the line Y-Y' in (a), respectively.

The semiconductor device of the modified example has a MOS inverter circuit (a MOS transistor), and comprises a columnar structural body configuring a MOS transistor which is arranged on a substrate (not shown) and which includes a p-type or intrinsic silicon 202, an n-type or intrinsic silicon 204, and a first oxide film 216 held between the silicon 202 and the silicon 204 and running in a vertical direction to the substrate.

The semiconductor device of the modified example includes a pair of upper and lower silicon layers 234, 222 which are arranged up and down so as to sandwich the p-type or intrinsic silicon 202 therebetween, and which contain n-type high-concentration dopants, a pair of upper and lower silicon layers 236, 224 which are arranged up and down so as to sandwich the n-type or intrinsic silicon 204 therebetween and which contain p-type high-concentration dopant, a gate insulating film 227 surrounding respective peripheries of the p-type or intrinsic silicon 202, the n-type or intrinsic silicon 204, and the pair of upper and lower silicon layers 234, 222, and a gate electrode 228 surrounding the periphery of the gate insulating film 227.

According to the semiconductor device of the modified example, the silicon layer 234 and the silicon layer 236 are electrically connected together. A first power is supplied to the silicon layer 222, while a second power is supplied to the silicon layer 224.

According to the semiconductor device of the modified example, a metal/silicon compound 238 is formed on the silicon layer 234 containing n-type high-concentration dopants, a metal/silicon compound 237 is formed on the silicon layer 222 containing n-type high-concentration dopants, a metal/silicon compound 239 is formed on the silicon layer 236 containing p-type high-concentration dopants, and a metal/silicon compound 240 is formed on the silicon layer 224 containing p-type high-concentration dopants.

As shown in FIG. 64, a contact 248 is formed on the metal/silicon compound 238 and on the metal/silicon compound 239, and electrically connects the compounds 238, 239 together.

Moreover, a contact 247 is formed on the metal/silicon compound 237, a contact 249 is formed on the metal/silicon compound 240, and a contact 250 is formed on the gate electrode 228.

A first metal 251 is formed on the contact 247, and the first power is supplied to the contact 247 through the first metal 251. A first metal 253 is formed on the contact 249, and the second power is supplied to the contact 249 through the first metal 253.

Moreover, a first metal 252 and a first metal 254 are formed on the contact 248 and the contact 250, respectively.

The present invention is not limited to the foregoing embodiment and example, and can be changed and modified in various forms without departing from the scope and the spirit of the present invention. The device structure is merely an example, and can be changed and modified as needed.

Having described and illustrated the principles of this application by reference to one or more preferred embodiments, it should be apparent that the preferred embodiments may be modified in arrangement and detail without departing from the principles disclosed herein and that it is intended that the application be construed as including all such modifications and variations insofar as they come within the spirit and scope of the subject matter disclosed herein.

What is claimed is:

1. A semiconductor device comprising:
   a columnar structural body which is arranged on a substrate and which includes a first silicon, a second silicon having a different conductivity type from the first silicon, and a first insulator held between the first silicon and the second silicon, which runs in a vertical direction to the substrate, wherein the first insulator has a first side surface and a second side surface opposing the first side surface;
   a pair of first upper and lower silicon layers arranged on and below the first silicon so as to sandwich the first silicon, and containing a first high-concentration dopant that has a different conductivity type from the first silicon, where at least the first lower silicon layer contacts the first side surface of the first insulator;
   a pair of second upper and lower silicon layers arranged on and below the second silicon so as to sandwich the second silicon, and containing a second high-concentration dopant that has a different conductivity type from the second silicon, where at least the second lower silicon layer contacts the second side surface of the first insulator;
   a second insulator which surrounds respective peripheries of the first silicon, the second silicon, the pair of first upper and lower silicon layers, and the pair of second upper and lower silicon layers, and the first insulator; and a conductive body surrounding a periphery of the second insulator, wherein the silicon layer in the pair of first upper and lower silicon layers arranged on the first silicon is electrically connected to the silicon layer in the pair of second upper and lower silicon layers arranged on the second silicon, a first power is supplied to the lower silicon layer in the pair of first upper and lower silicon layers, and a second power is supplied to the lower silicon layer in the pair of second upper and lower silicon layers, and a top surface of the conductive body is lower in the vertical direction than a top surface of the first upper silicon layer and the second upper silicon layer.

2. The semiconductor device according to claim 1, wherein in the columnar structural body, the first silicon comprises a p-type or intrinsic silicon, the second silicon comprises an n-type or intrinsic silicon, and the first insulator comprises a first oxide film, the pair of first upper and lower silicon layers each comprises a silicon layer containing an n-type high-concentration dopant, the pair of second upper and lower silicon layers each comprise a silicon layer containing a p-type high-concentration dopant, and the second insulator and the conductive body serve as a gate insulating film and a gate electrode, respectively.

3. The semiconductor device according to claim 2, wherein the first silicon and the second silicon each comprise a quadrangular column shaped structure.

4. The semiconductor device according to claim 3, wherein a length $L_1$ of a side of a bottom quadrangle which is of the first silicon formed in a quadrangular column shape and which contacts the first oxide film satisfies a following relational expression 1:

$$L_1 < 2 \times \sqrt{\{(2 \times \phi_F) \times (2 \times \in silicon)/(q \times N_A)\}} \quad \text{(Relational Expression 1)}$$

where $\phi_F$ is a Fermi potential, $\in silicon$ is a dielectric constant of silicon, q is a charge amount of electron, and $N_A$ is a dopant concentration of the first silicon.

5. The semiconductor device according to claim 3, wherein a length $L_2$ of a side of a bottom quadrangle which is of the first silicon formed in a quadrangular column shape and which is orthogonal to a side contacting the first oxide film satisfies a following relational expression 2:

$$L_2 < \sqrt{\{(2 \times \phi_F) \times (2 \times \in silicon)/(q \times N_A)\}} \quad \text{(Relational Expression 2)}$$

where $\phi_F$ is a Fermi potential, $\in silicon$ is a dielectric constant of silicon, q is a charge amount of electron, and $N_A$ is a dopant concentration of the first silicon.

6. The semiconductor device according to claim 3, wherein a length $L_3$ of a side of a bottom quadrangle which is of the second silicon formed in a quadrangular column shape and which contacts the first oxide film satisfies a following relational expression 3:

$$L_3 < 2 \times \sqrt{\{(2 \times \phi_F) \times (2 \times \in silicon)/(q \times N_D)\}} \quad \text{(Relational Expression 3)}$$

where $\phi_F$ is a Fermi potential, $\in silicon$ is a dielectric constant of silicon, q is a charge amount of electron, and $N_D$ is a dopant concentration of the second silicon.

7. The semiconductor device according to claim 3, wherein a length $L_4$ of a side of a bottom quadrangle which is of the second silicon formed in a quadrangular column shape and which is orthogonal to a side contacting the first oxide film satisfies a following relational expression 4:

$$L_4 < \sqrt{\{(2 \times \phi_F) \times (2 \times \in silicon)/(q \times N_D)\}} \quad \text{(Relational Expression 4)}$$

where $\phi_F$ is a Fermi potential, $\in silicon$ is a dielectric constant of silicon, q is a charge amount of electron, and $N_D$ is a dopant concentration of the second silicon.

8. The semiconductor device according to claim 2, wherein the first silicon and the second silicon are each formed in a semicircular column shape.

9. The semiconductor device according to claim 1, wherein
the second insulator comprises a gate insulating film, the conductive body surrounding the periphery of the second insulator comprises a gate electrode, the first silicon, and the pair of first upper and lower silicon layers in combination comprise an enhancement type nMOS transistor, the second insulator comprises a gate insulating film, the conductive body surrounding the periphery of the second insulator comprises a gate electrode, the second silicon, and the pair of second upper and lower silicon layers in combination comprise an enhancement type pMOS transistor, and the conductive body comprises a material such that the nMOS transistor and the pMOS transistor are enhancement type transistors.

\* \* \* \* \*